(12) United States Patent
Murata et al.

(10) Patent No.: US 7,306,984 B2
(45) Date of Patent: Dec. 11, 2007

(54) METHOD OF MANUFACTURE OF A SEMICONDUCTOR INTEGRATED CIRCUIT DEVICE INCLUDING A PLURALITY OF COLUMNAR LAMINATES HAVING DIFFERENT SPACING IN DIFFERENT DIRECTIONS

(75) Inventors: Tatsunori Murata, Takarazuka (JP); Takahiro Nakamura, Ome (JP); Yasumichi Suzuki, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/651,095

(22) Filed: Jan. 9, 2007

(65) Prior Publication Data

US 2007/0111512 A1    May 17, 2007

Related U.S. Application Data

(62) Division of application No. 10/756,419, filed on Jan. 14, 2004.

(30) Foreign Application Priority Data

Jan. 14, 2003   (JP)   ............................. 2003-005825

(51) Int. Cl.
  *H01L 21/8238*   (2006.01)
(52) U.S. Cl. ...................... 438/212; 438/197; 438/268; 438/622; 257/E27.098; 257/E21.661
(58) Field of Classification Search ............... 438/212, 438/268, 197–198; 257/903, 322, E21.661, 257/E27.098
See application file for complete search history.

(56) References Cited

U.S. PATENT DOCUMENTS

| | | | |
|---|---|---|---|
| 5,198,683 A | 3/1993 | Sivan | ........................... 357/67 |
| 5,627,390 A | 5/1997 | Maeda et al. | ................ 257/302 |
| 5,670,803 A | 9/1997 | Beilstein, Jr. et al. | ...... 257/278 |
| 5,994,735 A | 11/1999 | Maeda et al. | ................ 257/329 |
| 2004/0043550 A1* | 3/2004 | Chakihara et al. | ........... 438/199 |

FOREIGN PATENT DOCUMENTS

| | | |
|---|---|---|
| JP | 6-104405 | 4/1994 |
| JP | 9-232447 | 9/1997 |
| JP | 11-176936 | 7/1999 |
| JP | 2001-28443 | 1/2001 |
| WO | 00/70683 | 11/2000 |
| WO | 03/019663 | 3/2003 |

OTHER PUBLICATIONS

Watanabe, et al., "A Novel Circuit Technology with Surrounding Gate Transistors (SGT's) for Ultra High Density DRAM's", IEEE Journal of Solid-State Circuits, vol. 30, No. 9, Sep. 1995.

* cited by examiner

*Primary Examiner*—Thao X Le
(74) *Attorney, Agent, or Firm*—Antonelli, Terry, Stout & Kraus, LLP.

(57) ABSTRACT

For improving the filing properties between vertical MIS-FETs constituting a SRAM memory cell, the vertical MIS-FETs are formed over horizontal drive MISFETs and transfer MISFETs, and they are disposed with a narrow pitch in the Y direction and a wide pitch in the X direction. After a first insulating film ($O_3$-TEOS) having good coverage is disposed over columnar laminates having a lower semiconductor layer, an intermediate semiconductor layer, an upper semiconductor layer and a silicon nitride film and a gate electrode formed over the side walls of the laminates via a gate insulating film to completely fill a narrow pitch space, a second insulating film (HDP silicon oxide film) is deposited over the first insulating film, resulting in an improvement in the filling properties, even in a narrow pitch portion, between vertical MISFETs having a high aspect ratio.

6 Claims, 46 Drawing Sheets

FIG. 13

| | RETICLE PATTERN | ETCHING PATTERN |
|---|---|---|
| (a) | 240nm × 240nm (square) | 236nm × 224nm (circle) |
| (b) | 300nm, 100nm, 160nm, 120nm, 100nm (H-shape) | 230nm × 270nm (oval) |

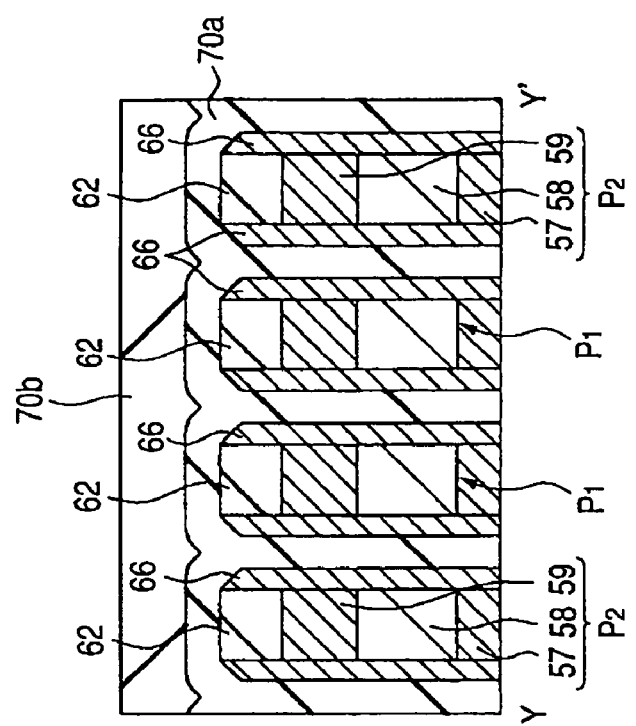
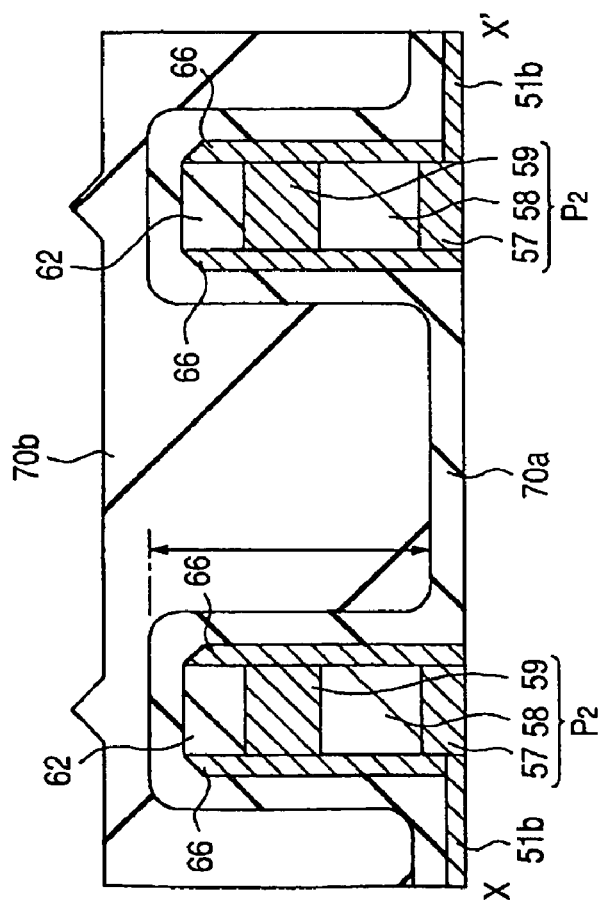
FIG. 23

FIG. 24
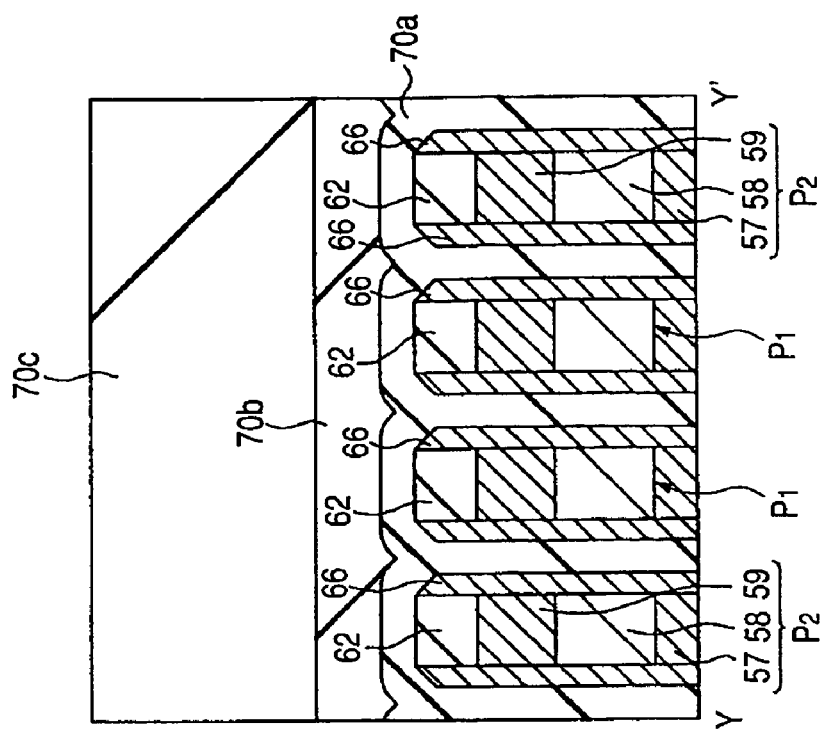
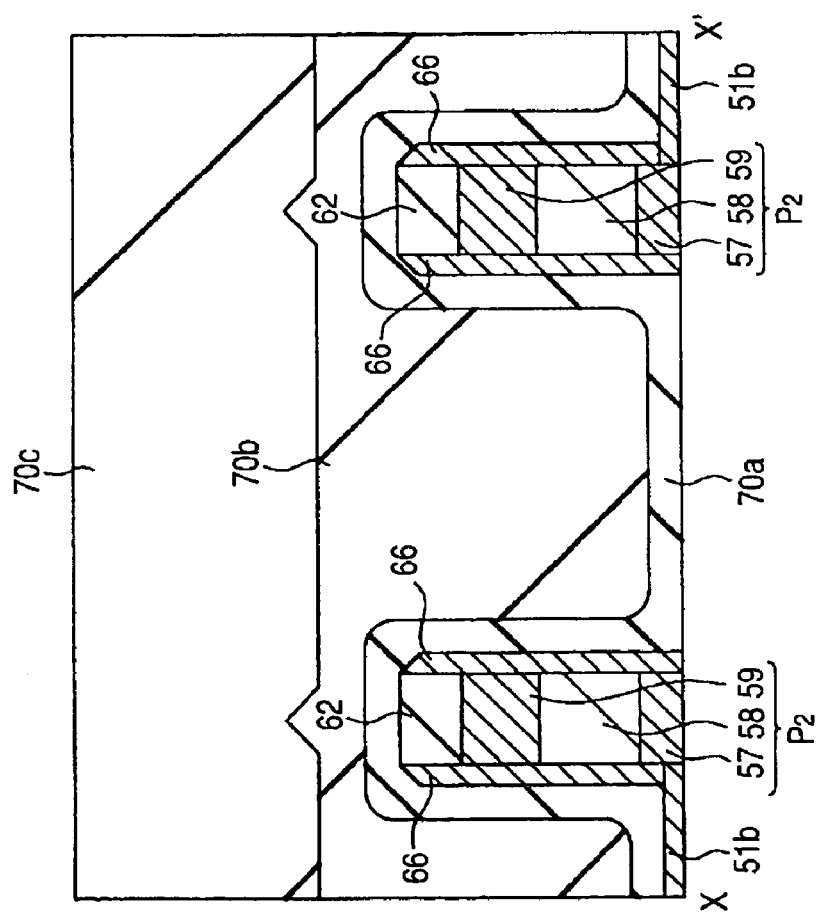

$I_{OFF}(n) < I_{OFF}(p)$

METHOD OF MANUFACTURE OF A SEMICONDUCTOR INTEGRATED CIRCUIT DEVICE INCLUDING A PLURALITY OF COLUMNAR LAMINATES HAVING DIFFERENT SPACING IN DIFFERENT DIRECTIONS

This application is a divisional application of U.S. application. Ser. No. 10/756,419, filed Jan. 14, 2004, and which application also claims priority from Japanese Patent Application 2003-005825, filed Jan. 14, 2003, the entire contents of both applications are incorporated herein by reference.

TECHNICAL FIELD

The present invention relates to a semiconductor integrated circuit device and to a technique for use in the manufacture thereof; and, more particularly, the invention relates to a technique that is effective when applied to a semiconductor integrated circuit device having a vertical MISFET.

BACKGROUND OF THE INVENTION

Semiconductor integrated circuit devices have many layer-stack structures, each having a conductive film and an insulating film. The insulating film tends to be formed in order to insulate between conductive films. For example, plural interconnect layers are separated by an insulating film. An element formation region of a semiconductor substrate is also separated by an insulating film that has been filled in a groove.

The space between interconnects or a groove space, however, tends to be narrower with a recent tendency toward high integration and miniaturization of the device. In some parts, the ratio of the width to the height of a space (aspect ratio=height/width) becomes large.

Various improvements have been made to fill such a space accurately. For example, the below-listed Patent Document 1 discloses a technique which involves filling a first insulating film (46) in a region having a fine line width and a high height/width ratio, for example, a space between conductive lines (42), carrying out dry etch back (50) to remove voids (48), and then forming a second insulating film (52) over the first insulating film.

Patent Document 1: Japanese Patent Laid-Open No. Hei 11(1999)-176936

SUMMARY OF THE INVENTION

The present inventors have been engaged in research and development of semiconductor integrated circuit devices. They have carried out an investigation particularly directed to the structure or manufacturing method of an SRAM (Static Random Access Memory), which is a kind of semiconductor memory device.

With regards to the SRAM investigated by the present inventors, its memory cell is formed of, for example, four n-channel type MISFETs (Metal-Insulator-Semiconductor-Field-Effect-Transistor) and two p channel type MISFETS.

Since a reduction in the memory size cannot be attained easily when these six MISFETs constituting the memory cell of the SRAM are disposed on the same plane, the formation of two vertical p channel type MISFETs over the four horizontal type MISFETs, which will be described later, has been under investigation. It has been revealed that when vertical type MISFETs are employed, it becomes difficult to fill an insulating film between them.

More specifically, a vertical type MISFET is made of a columnar semiconductor having source and drain regions thereover and therebelow, respectively. The ratio (aspect ratio) of the height of this columnar semiconductor to the space between two adjacent columnar semiconductors is much greater than the aspect ratio of the space between interconnects or that of an element isolation groove which has been studied conventionally. It is therefore necessary to develop a technique that is capable of filling a space between columnar semiconductors with good accuracy.

In particular, when the distance between two columnar semiconductors in the X direction is different from that in the Y direction in consideration of the layout of underlying horizontal MISFETs and vertical MISFETs, it is necessary to fill the space with good accuracy, whether it is narrow or wide.

An object of the present invention is to provide a technique that is capable of improving the filling properties in a space between vertical MISFETs constituting a semiconductor integrated circuit device.

Another object of the present invention is to improve the properties of a semiconductor integrated circuit device having vertical MISFETs, and also to attain miniaturization of the device.

The above-described and the other objects and novel features of the present invention will be more apparent from the description provided herein and from the accompanying drawings.

An outline of typical aspects of the invention disclosed in the present application will be described below.

In one aspect of the present invention, there is provided a semiconductor integrated circuit device comprising a plurality of vertical MISFETs having (a1) a columnar laminate having, at the upper portion and lower portion thereof, first and second semiconductor regions, respectively, and (a2) a conductive film formed over side walls of the columnar laminate via a first insulating film, wherein the plurality of vertical MISFETs having the columnar laminate and the conductive film are (b1) spaced by a first distance in a first direction, and (b2) spaced by a second distance greater than the first distance in a second direction; and, up to at least a predetermined height of the columnar laminate of each of the plurality of vertical MISFETs, (c1) a second insulating film is formed in the space of the columnar laminates in the first direction, and (c2) the second insulating film and a third insulating film thereover are formed in the space of the columnar laminates in the second direction.

In a second aspect of the present invention, there is provided a method of manufacture of a semiconductor integrated circuit device, comprising the steps of (a) forming a plurality of columnar laminates having, at the upper portion and lower portion thereof, first and second semiconductor regions, respectively, while spacing the columnar laminates in a first direction and in a second direction with a space in the second direction being wider than that in the first direction; (b) forming a conductive film over the side walls of each of the columnar laminates via a first insulating film and setting a distance, in the first direction, between the conductive films over the side walls of the columnar laminates as a first distance, and a distance in the second direction as a second distance greater than the first distance; (c) forming a second insulating film to be thick enough to fill the first distance, but not the second distance; and (d) forming a third insulating film over the second insulating film, while filling the second distance.

In a third aspect of the present invention, there is provided a method of manufacture of a semiconductor integrated circuit device, which comprises the steps of (a) forming a semiconductor film having, at the upper portion and lower portion thereof, first and second semiconductor regions, respectively; (b) etching the semiconductor film with a mask which is H-shaped in a first direction, thereby forming an approximately elliptical columnar laminate having a longer diameter in a second direction that is perpendicular to the first direction; and (c) forming a conductive film over the side walls of the columnar laminate via an insulating film.

In a fourth aspect of the present invention, there is provided a semiconductor integrated circuit device comprising (a) a columnar laminate having, at the upper and lower portions thereof, first and second semiconductor regions, respectively, and having a substantially elliptical columnar plane pattern; and (b) a conductive film formed over the side walls of the columnar laminate via an insulating film.

BRIEF DESCRIPTION OF THE DRAWINGS

FIG. 13 is a table illustrating the relationship between the transfer pattern and an etched shape (plane pattern of laminate);

FIG. 23 is fragmentary cross-sectional view of a substrate illustrating the manufacturing method of the semiconductor integrated circuit device (SRAM) according to the one embodiment of the present invention;

FIG. 24 is fragmentary cross-sectional view of a substrate illustrating the manufacturing method of the semiconductor integrated circuit device (SRAM) according to the one embodiment of the present invention;

DETAILED DESCRIPTION OF THE PREFERRED EMBODIMENTS

Figure 1:
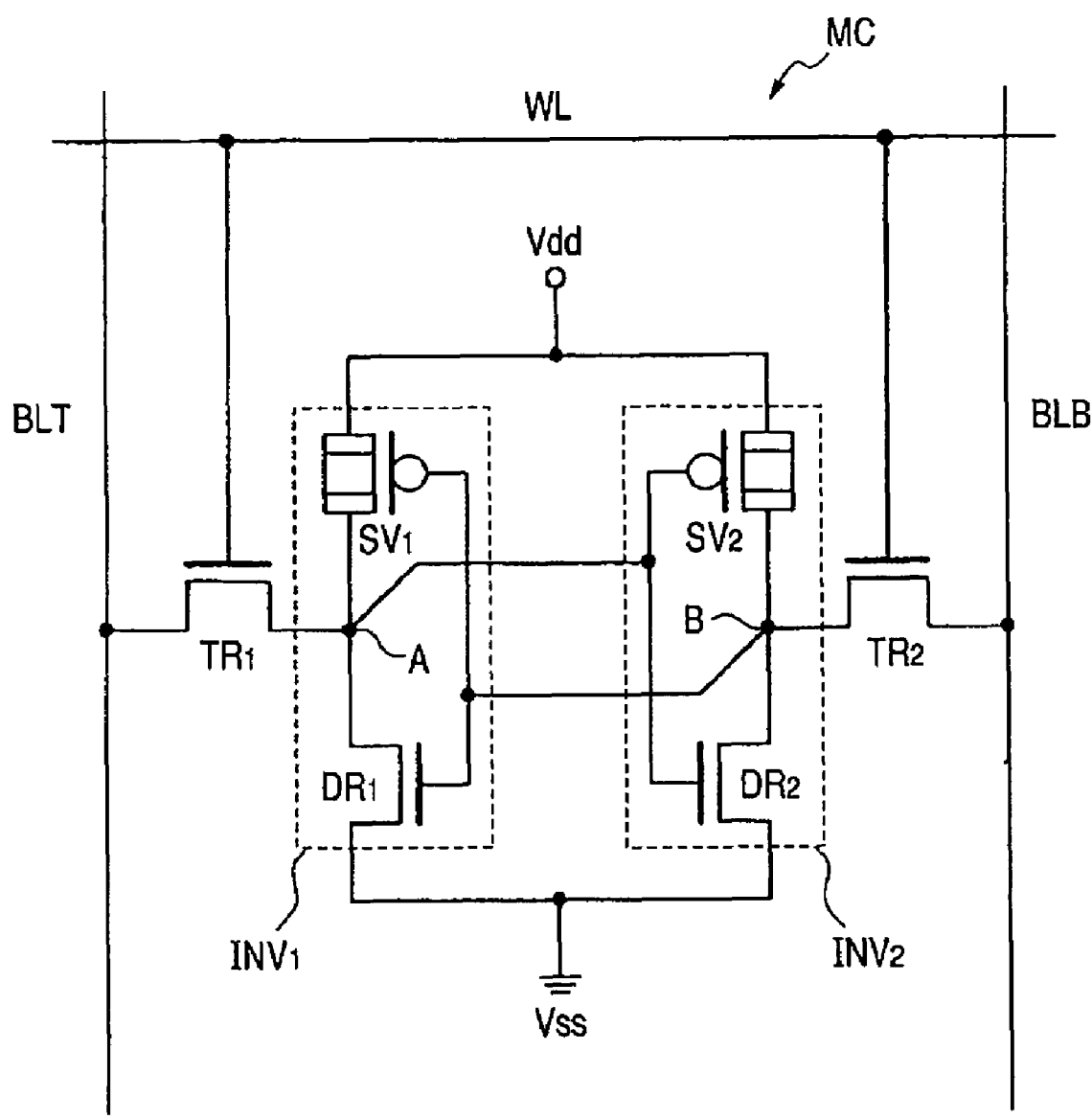
FIG. 1 is an equivalent circuit diagram of a SRAM memory cell according to one embodiment of the present invention.

The embodiments of the present invention will hereinafter be described specifically with reference to the accompanying drawings. In all of the drawings, members having a like function will be identified by like reference numerals and overlapping descriptions thereof will be omitted. To facilitate an understanding of the description, some parts (for example, an insulating film) will be described with reference to an ordinal number "first", "second" or the like, but this does not always correspond to the terms "first", "second" or the like as used in the appended claims.

FIG. 1 is an equivalent circuit diagram of a memory cell of a SRAM according to an embodiment of the present invention. As illustrated in FIG. 1, memory cells (MC) of the SRAM are each constituted of two horizontal transfer MISFETs (TR1 and TR2, each of which will hereinafter simply be called a "transfer MISFET"), two horizontal drive MISFETs (DR1 and DR2, each of which will hereinafter simply be called a "drive MISFET"), and two vertical load MISFETs (SV1 and SV2, each of which will hereinafter simply be called a "vertical MISFET"), each disposed at the intersection of a pair of complementary data lines (BLT and BLB) and a word line (WL).

Of the six MISFETs constituting the memory cell (MC), two transfer MISFETs (TR1 and TR2) and two drive MISFETs (DR1 and DR2) are each formed as an n channel type MISFET. The two vertical MISFETs (SV1 and SV2) are each formed as a p channel type MISFET.

As will be described later, the vertical MISFETs (SV1 and SV2) are disposed over formation regions of the drive MISFETs (DR1 and DR2) and transfer MISFETs (TR1 and TR2).

As illustrated in FIG. 1, the drive MISFET (DR1) and the vertical MISFET (SV1) of the memory cell (MC) constitute a first inverter $INV_1$, while the drive MISFET (DR2) and the vertical MISFET (SV2) constitute a second inverter $INV_2$. The input and output portions for the pair of inverters $INV_1$ and $INV_2$ are crosslinked within the memory cell (MC) and constitute a flip flop circuit, which serves as an information storing unit for storing information of 1 bit.

More specifically, two pairs of MISFETs constituting the inverter are connected in series between a reference voltage (Vss) and a supply voltage (Vdd, for example, 3V) and the connecting nodes (output portion, A and B) are cross-connected to the connecting portions (input portions) of these gate electrodes.

In other words, the drain (one end) of the drive MISFET (DR1), the drain of the vertical MISFET (SV1), the gate of the drive MISFET (DR2) and the gate of the vertical MISFET (SV2) are electrically connected each other. Each portion of these MISFETs is connected to one storage node (A) of the memory cell. The drain of the drive MISFET (DR2), the drain of the vertical MISFET (SV2), the gate of the drive MISFET (DR1) and the gate of the vertical MISFET (SV1) are electrically connected each other. Each portion of these MISFETs is connected to one storage node (B) of the memory cell.

Between the storage nodes (A and B) and the complementary data lines (BLT and BLB), the transfer MISFETs (TR1 and TR2) are electrically connected, respectively. The gate electrodes of the transfer MISFETS (TR1 and TR2) are electrically connected to the word line (WL).

The above-described memory cell (MC) stores data by setting the potential of one of the paired storage nodes (A and B) high (High) and that of the other one low (Low).

Upon reading of the data of the memory cell (MC), the supply voltage (Vdd) is applied to a selected word line (WL) to turn the transfer MISFETS (TR1 and TR2) ON and a potential difference between the paired storage nodes (A and B) is read via the complementary data lines (paired data lines BLT and BLB).

Upon writing, the supply voltage (Vdd) is applied to a selected word line (WL) to turn the transfer MISFETS (TR1 and TR2) ON, and, at the same time, one of the complementary data lines (BLT and BLB) is connected to the supply voltage (Vdd), while the other is connected to the reference voltage (Vss), whereby the ON and OFF sates of the drive MISFETs (DR1 and DR2) are inverted.

FIGS. 2 to 34 (except FIGS. 12 and 13) are a fragmentary cross-sectional view, fragmentary plan view or fragmentary perspective view of a substrate illustrating a method of manufacture of the semiconductor integrated circuit device (SRAM) according to this embodiment. In each cross-sectional view, a diagram on the left side is a view taken along a line A-A' of the plan view, a diagram at the center is a view taken along a line B-B' of the plan view and a view on the right side is a view taken along a line C-C' of the plan view.

The characteristic structure of the semiconductor integrated circuit device (SRAM) according to this embodiment will be described next. Its detailed structure will be described in accordance with the successive manufacturing steps used in the fabrication thereof.

Figure 33:
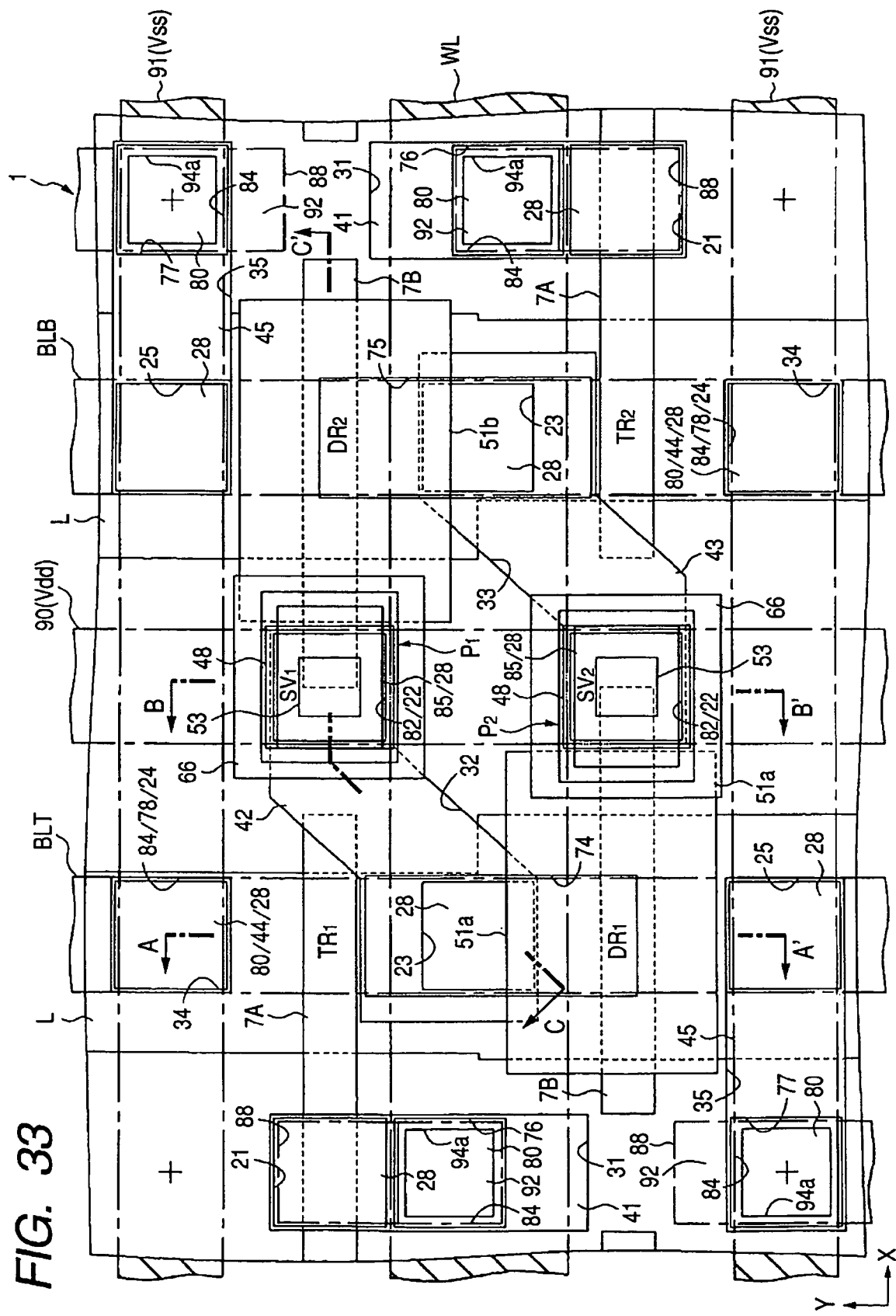
FIG. 33 is fragmentary plan view of a substrate illustrating the manufacturing method of the semiconductor integrated circuit device (SRAM) according to the one embodiment of the present invention.
Figure 34:
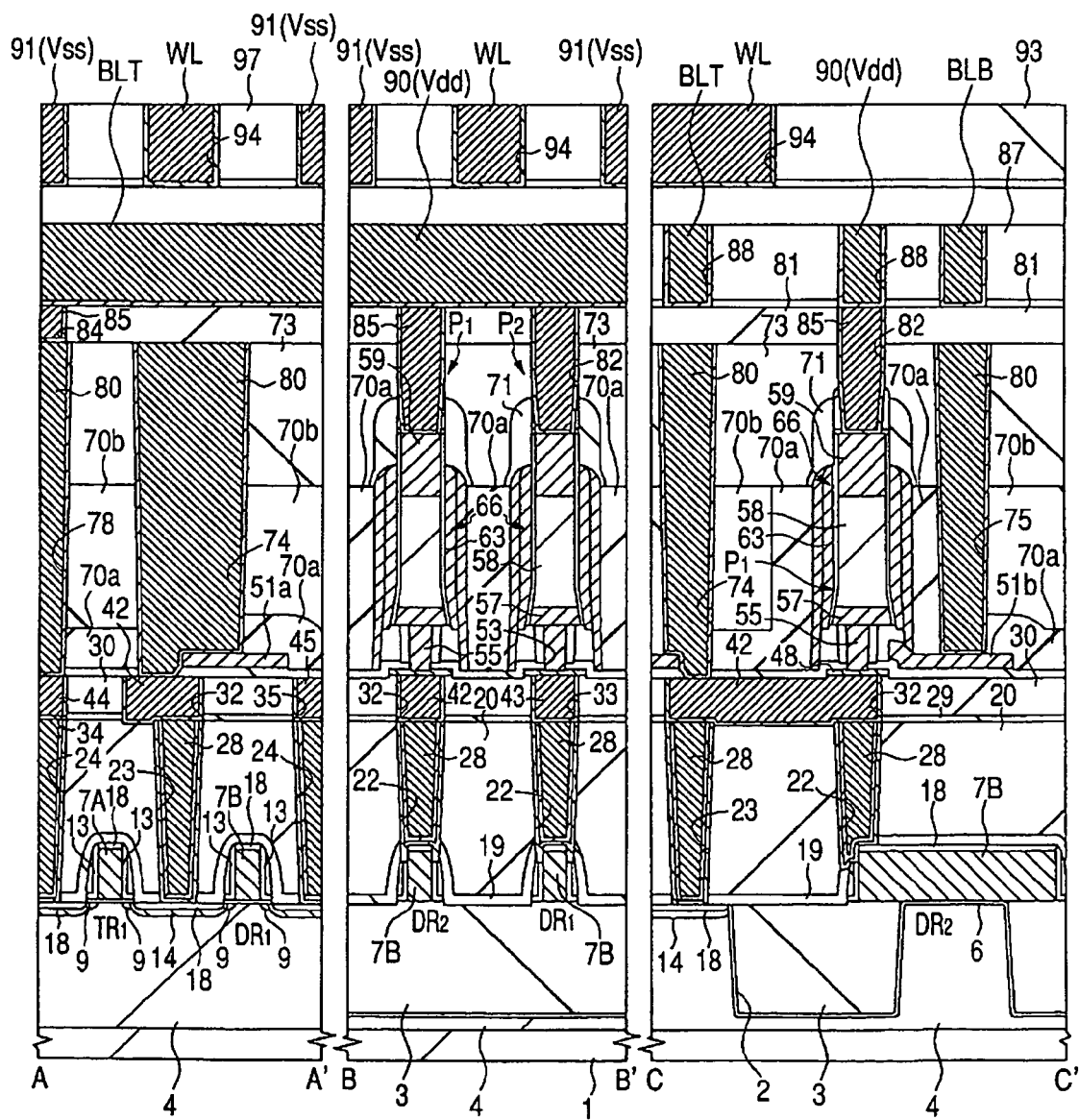
FIG. 34 is fragmentary cross-sectional view of a substrate illustrating the manufacturing method of the semiconductor integrated circuit device (SRAM) according to the one embodiment of the present invention.

As illustrated in FIGS. 33 and 34, which are views of the final step, the SRAM memory cell is formed in a substantially rectangular cell region surrounded by the mark (+) in the diagram; the drive MISFETs (DR1 and DR2) and transfer MISFETs, which are horizontal transistors, are formed in a relatively lower-layer region; and the vertical MISFETs (SV1 and SV2) are formed in a region above the above-described four regions.

What is characteristic in the SRAM of this embodiment is that a space between SV1 and SV2 of the vertical MISFET in the Y direction (a direction of B-B') is, as illustrated in the center diagram of FIG. 34, filled with a single layer of a first insulating film ($O_3$-TEOS film) 70a up to the vicinity of the upper portion of its gate electrode 66, while a space in the X direction has a stacked structure of a first insulating film ($O_3$-TEOS film) 70a and a second insulating film (HDP oxide film) 70b.

Figure 35:
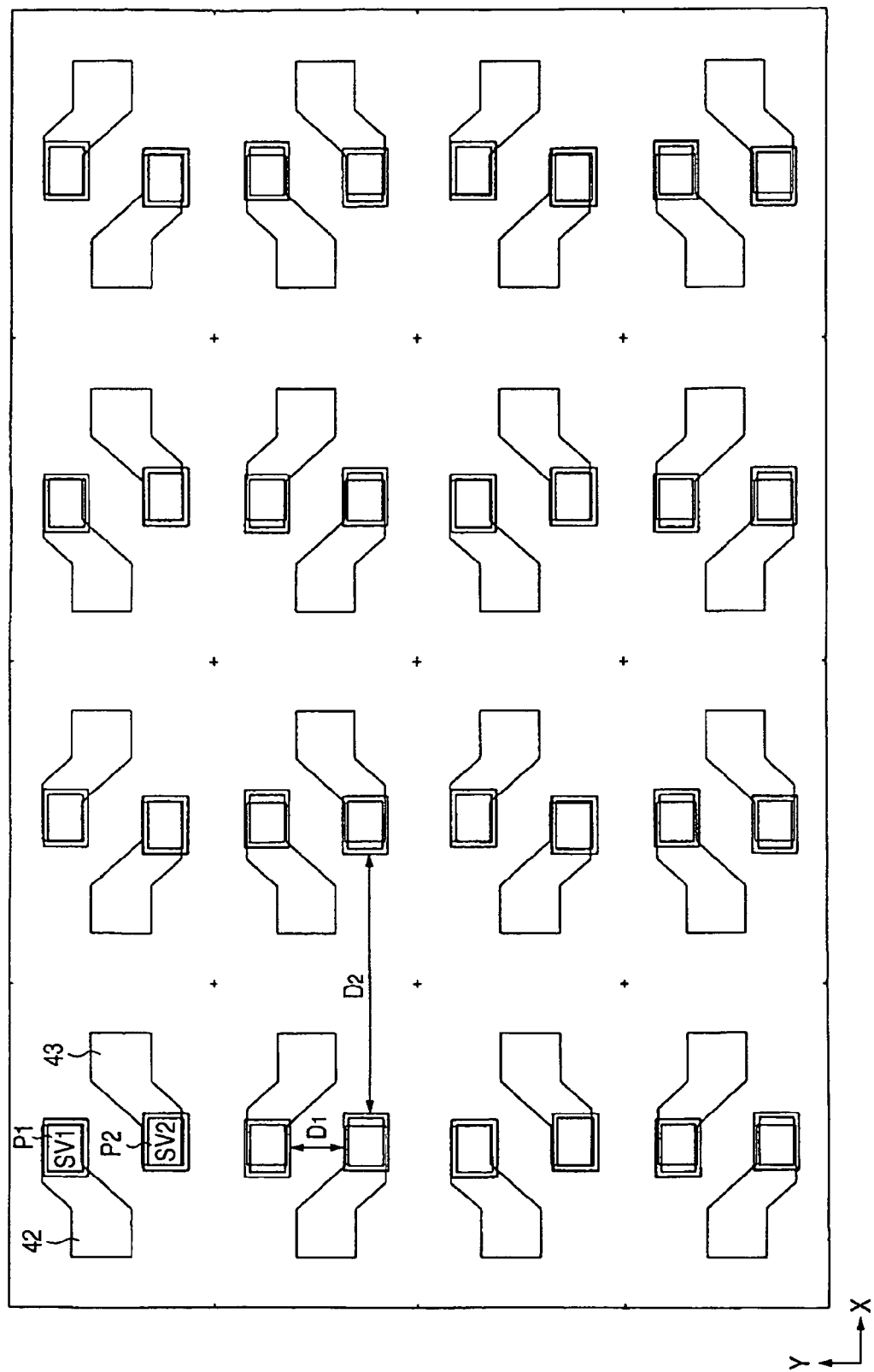
FIG. 35 is a fragmentary plan view of a substrate of the semiconductor integrated circuit device (SRAM) according to the one embodiment of the present invention.

As illustrated in FIG. 35, cell regions are disposed in an array in X and Y directions, and each cell region is disposed axisymmetric to a short side of the cell region running in the Y direction and axisymmetric to a long side of the cell region running in the X direction. Each pattern in the cell region is disposed point-symmetric to the central point of the cell region.

The vertical MISFETs (SV1 and SV2) are therefore disposed in an array in the X and Y directions. They are spaced by a distance D1 in the Y direction and with a distance D2 (D2>D1) in the X direction. In FIG. 35, some of the patterns (SV1, SV2, 42, 43 and the like) shown in FIG. 33 are also shown.

Figure 26:
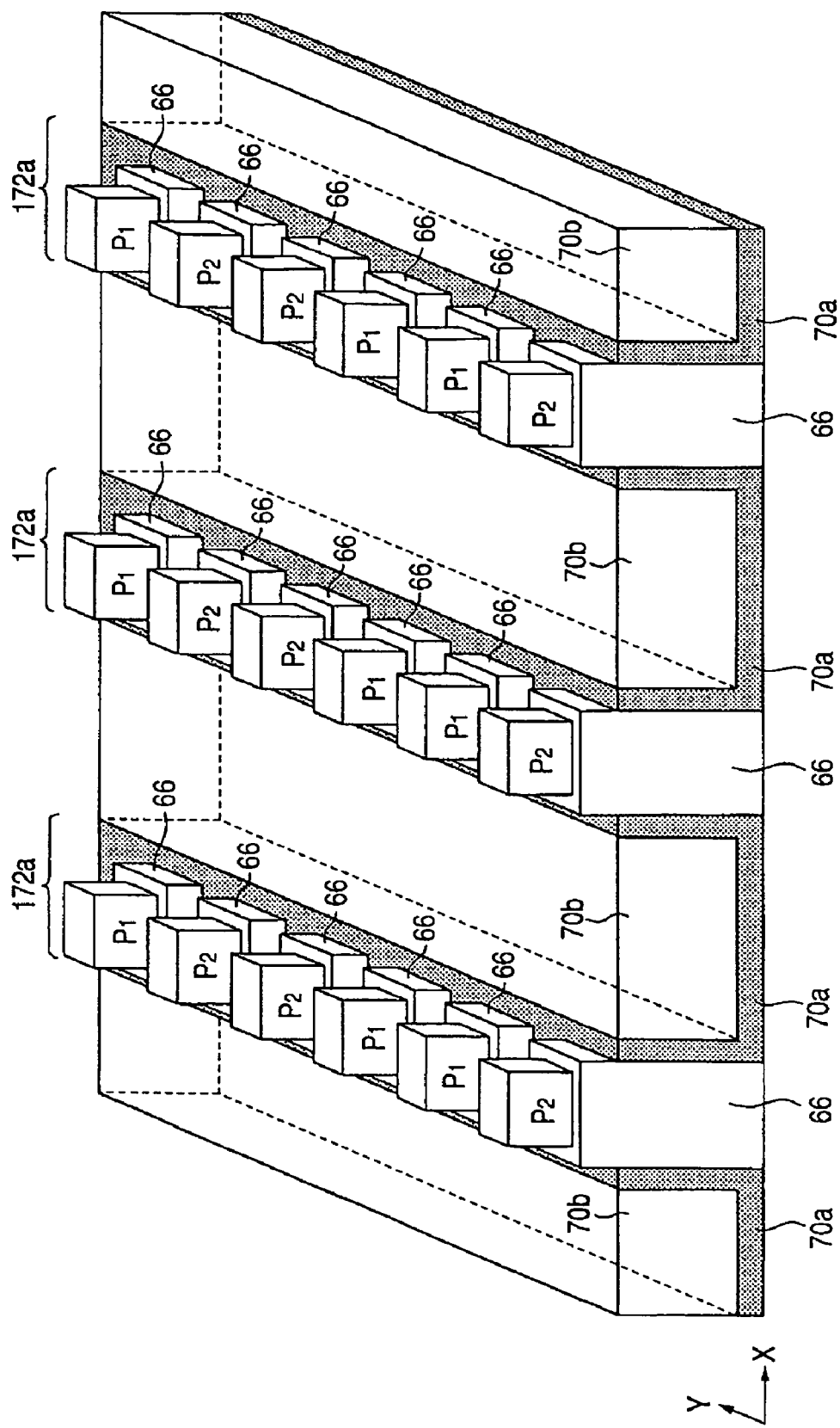
FIG. 26 is a fragmentary perspective view of a substrate illustrating the manufacturing method of the semiconductor integrated circuit device (SRAM) according to the one embodiment of the present invention.

With regard to the positional relationship between the vertical MISFETs (columnar laminates (P1 and P2) and gate electrode 66) disposed in the array form and the first insulating film 70a, the columnar laminates (P1 and P2) and the gate electrodes 66 that are arranged in the Y direction seem to be embedded in a projecting portion 172a extending in the Y direction of the first insulating film ($O_3$-TEOS film) 70a (refer to FIG. 26).

Between the projecting portions extending in the direction Y of the first insulating film ($O_3$-TEOS film) 70a, a second insulating film (HDP oxide film) 70b is filled (refer to FIG. 26). The columnar laminates (P1 and P2) that protrude from the first insulating film ($O_3$-TEOS film) 70a are covered with a fourth insulating film (P-TEOS film) 73 (refer to FIG. 34).

Figure 17:
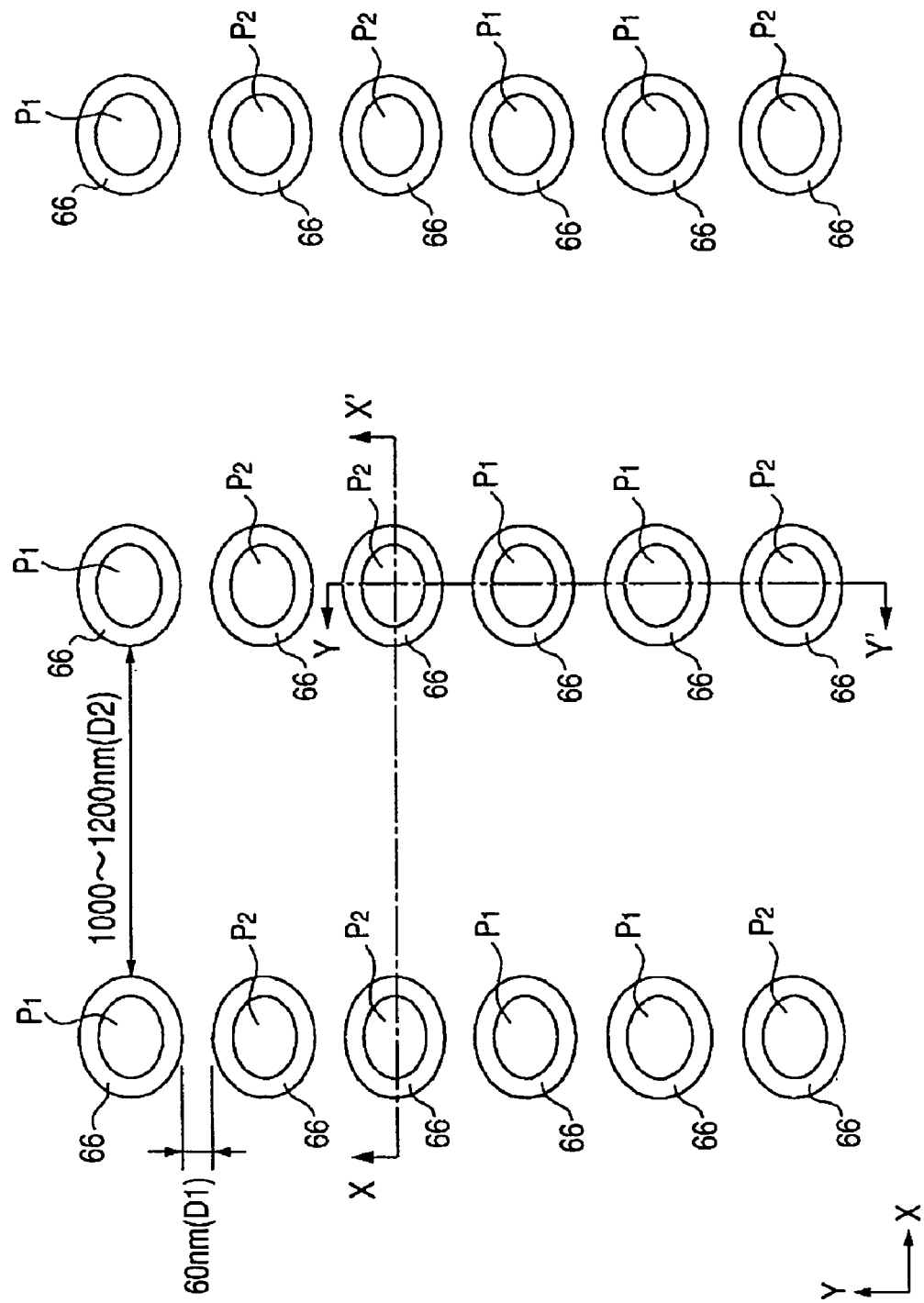
FIG. 17 is a fragmentary plan view of a substrate illustrating the manufacturing method of the semiconductor integrated circuit device (SRAM) according to the one embodiment of the present invention.

The plane pattern of each of the columnar laminates (P1 and P2) which are disposed in an array can be formed, as illustrated in FIG. 17, to be approximately elliptic. The longer diameter of this approximately elliptic pattern is located in a long-side direction (X direction) of the cell region.

By forming the approximately elliptical pattern of the columnar laminates (P1 and P2) to be longer in the direction in which they are spaced widely (with a wide pitch), the channel region can be widened and the channel current can be increased. In addition, a size reduction in the cell region can be attained.

A specific example of the structure of the semiconductor integrated circuit device (SRAM) according to this embodiment will be described in detail in the order of the manufacturing steps.

Figure 2:
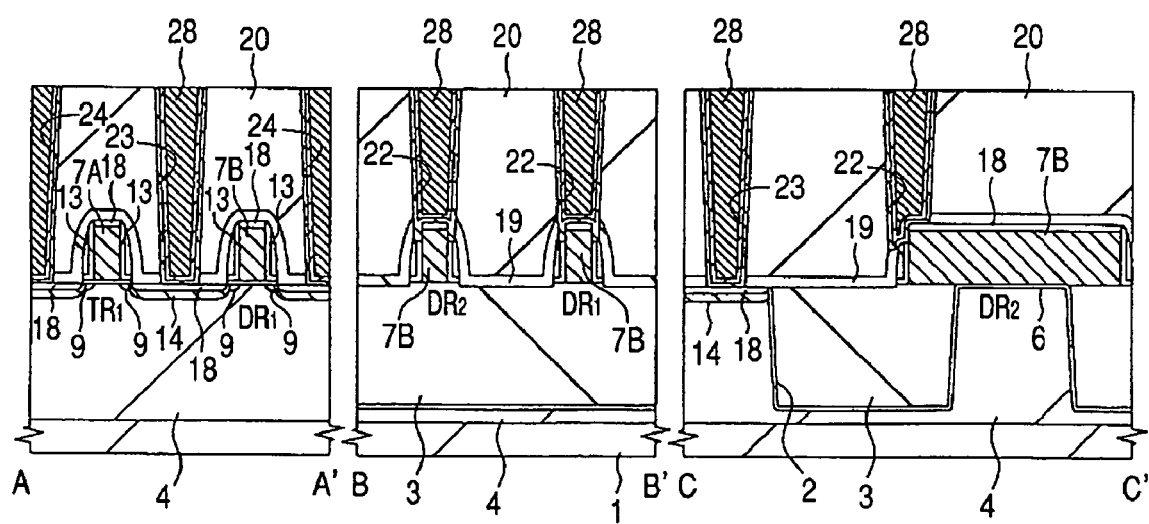
FIG. 2 is a fragmentary cross-sectional view of a substrate illustrating a manufacturing method of the semiconductor integrated circuit device (SRAM) according to the one embodiment of the present invention.
Figure 3:
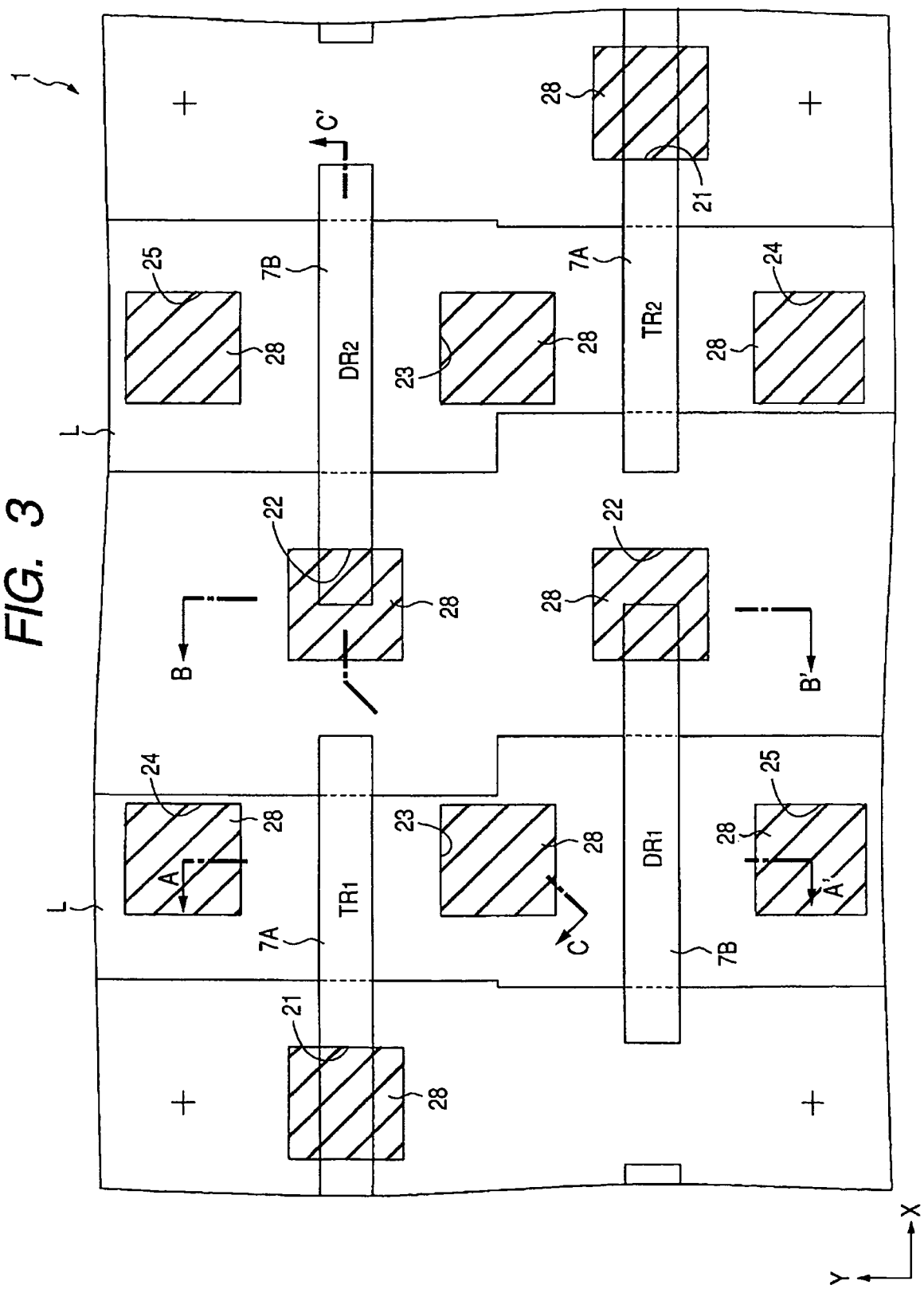
FIG. 3 is a fragmentary plan view of a substrate illustrating the manufacturing method of the semiconductor integrated circuit device (SRAM) according to the one embodiment of the present invention.

As illustrated in FIGS. 2 and 3, an element isolation is formed in a substrate 1 made of, for example, p type single crystal silicon. This element isolation is formed by, for example, making a groove 2 in the substrate 1, thermally oxidizing the resulting substrate, and then filling a silicon oxide film 3 in the groove as an insulating film. An exposed region of the substrate 1 surrounded by this element isolation will be an element formation region (active region) L.

Into a part of the substrate 1, a p type impurity (for example, boron (B) is ion-implanted and thermally diffused, whereby a p type well 4 is formed over the main surface of the substrate 1.

Figure 36:
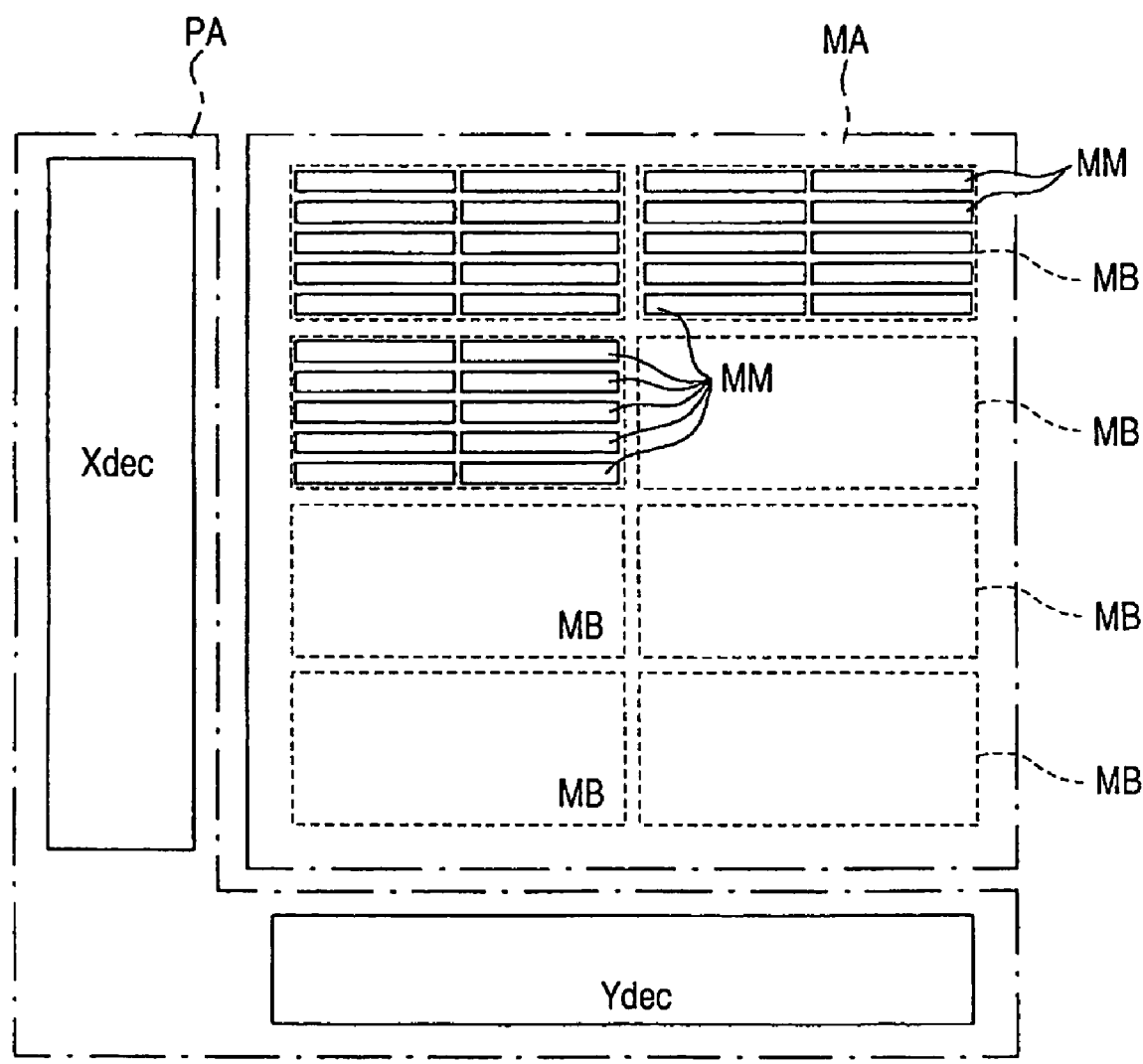
FIG. 36 is a fragmentary layout diagram of a substrate of the semiconductor integrated circuit device (SRAM) according to the one embodiment of the present invention.

The region shown in FIGS. 2 and 3 is a memory region around which a peripheral circuit region exists, though this is not illustrated. In addition to the p type well, an n type well is formed in this peripheral circuit region by diffusion of an n type impurity. Over the main surface of the p type well, an n channel type MISFETQn is formed using similar steps to those employed for the formation of a horizontal MISFET, which will be described later, and a p channel type MISFETQp is formed by a step using an impurity having an opposite conductivity type (refer to FIG. 39). These MISFETs constitute various circuits for driving a memory, for example, an X decoder (Xdec) or a Y decoder (Ydec), as illustrated in FIG. 36. In FIG. 36, PA represents a peripheral circuit region, while MA represents a memory region.

Over the surface of the p type well 4, a gate insulating film 6 having a thickness of about from 3 nm to 4 nm is formed. This gate insulating film 6 is made of, for example, a silicon oxide film, and it is formed by thermal oxidation of the substrate 1.

Over the gate insulating film 6, a polycrystalline silicon film having, for example, an n type impurity doped therein is deposited as a conductive film, followed by deposition thereover of a silicon oxide film as a cap insulating film by, for example, chemical vapor deposition (CVD).

The above-described silicon oxide film is then patterned, and using this patterned silicon oxide film as a mask, the n type polycrystalline silicon film is dry etched to form gate electrodes 7A,7B over the p type well 4. Compared with a photoresist film, silicon oxide has a greater etching selectivity to polycrystalline silicon so that by using silicon oxide as a mask, patterning of a minute gate electrode can be attained with good accuracy. The gate electrode 7A constitutes a gate electrode of the transfer MISFETs (TR1 and TR2), while the gate electrode 7B constitutes the gate electrode of the drive MISFETs (DR1 and DR2). As illustrated in FIG. 3, the gate electrodes 7A,7B have a rectangular plane pattern extending in the direction X, and their width in the direction Y, that is, the gate length, is, for example, from 0.13 to 0.14 µm.

By ion implantation of an n type impurity (for example, phosphorous or arsenic) into the p type wells 4 on both sides of the gate electrodes 7A,7B, an $n^-$ type semiconductor region 9 having a relatively low concentration is formed.

After successive deposition over the substrate 1 of a silicon oxide film and a silicon nitride film, serving as insulating films, by CVD, these films are anisotropically etched to form side wall spacers 13 on the side walls of the gate electrodes 7A,7B. By this anisotropic etching, the silicon oxide film over the gate electrodes and the gate insulating film (silicon oxide film) 6 over the surface of the substrate 1 are removed.

By ion implantation of an n type impurity (for example, phosphorous or arsenic) into the p type wells 4 on both sides of the gate electrodes 7A,7B, $n_+$ type semiconductor regions 14 having a relatively high concentration are formed.

By the steps so far mentioned, the transfer MISFETs (TR1 and TR2) and drive MISFETs (DR1 and DR2) having source and drain regions of an LDD structure are formed. Of these four MISFETs, TR1 and DR1 have one of the source and drain regions in common, and TR2 and DR2 have one of the source and drain regions in common.

Over the substrate 1, a cobalt (Co) film is then deposited as a high melting point metal film by, for example, sputtering, followed by heat treatment, whereby a silicide reaction is caused on the interface between the Co film and the gate electrodes 7A,7B and the Co film and the substrate 1 ($n_+$ type semiconductor region 14), and a silicide layer 18 is formed. Then, an unreacted portion of the Co film is removed by etching.

Over the MISFETs (TR1, TR2, DR1 and DR2), a silicon nitride film 19 and a silicon oxide film 20 are deposited as an insulating film by, for example, CVD, and then, the surface of the silicon oxide film 20 is planarized by chemical mechanical polishing (CMP).

Using a photoresist film as a mask, the silicon oxide film 20 and silicon nitride film 19 are dry etched to form a contact hole 21 over the gate electrode 7A of the transfer MISFETs (TR1 and TR2) and a contact hole 22 over the gate electrode 7B of the drive MISFETs (DR1 and DR2). In addition, contact holes 23,24,25 are formed over the source and drain ($n_+$ type semiconductor regions 14) of each of the transfer MISFETs (TR1, TR2) and drive MISFETs (DR1, DR2). Of these, the contact hole 23 is formed over the source and drain regions which are common to TR1 and DR1, and TR2 and DR2.

Over the silicon oxide film 20, including the insides of the contact holes 21 to 25, a laminate of a titanium (Ti) film and a titanium nitride (TiN) film are deposited as a barrier film by, for example, sputtering. After deposition of a tungsten (W) film serving as a conductive film by, for example, CVD, the W film outside the contact holes 21 to 25 is removed by CMP, whereby a plug 28 is formed inside of the contact holes 21 to 25.

Figure 4:
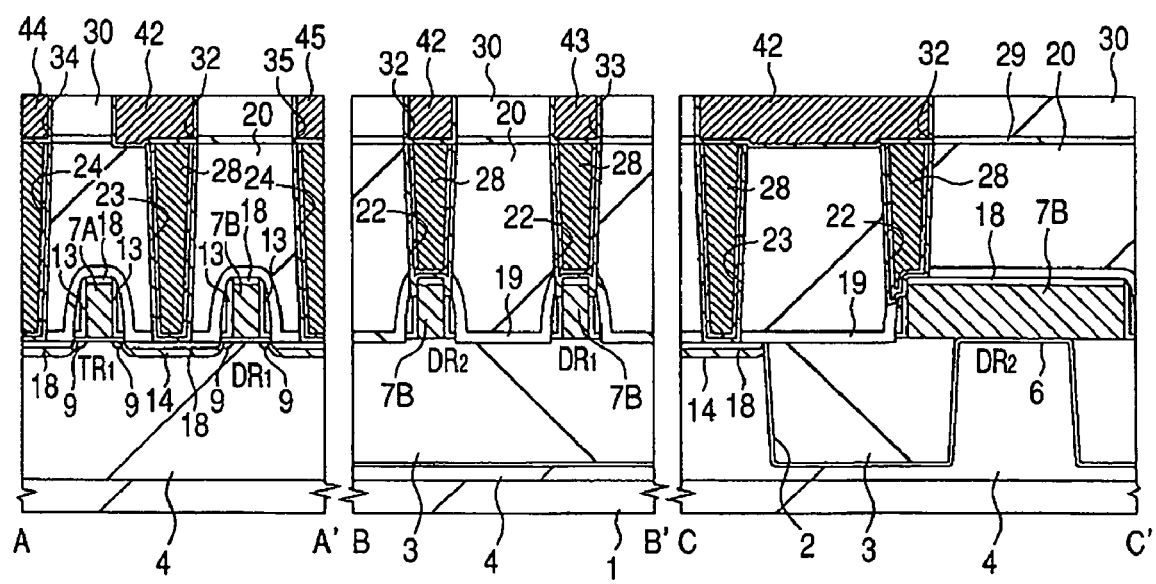
FIG. 4 is a fragmentary cross-sectional view of a substrate illustrating the manufacturing method of the semiconductor integrated circuit device (SRAM) according to the one embodiment of the present invention.
Figure 5:
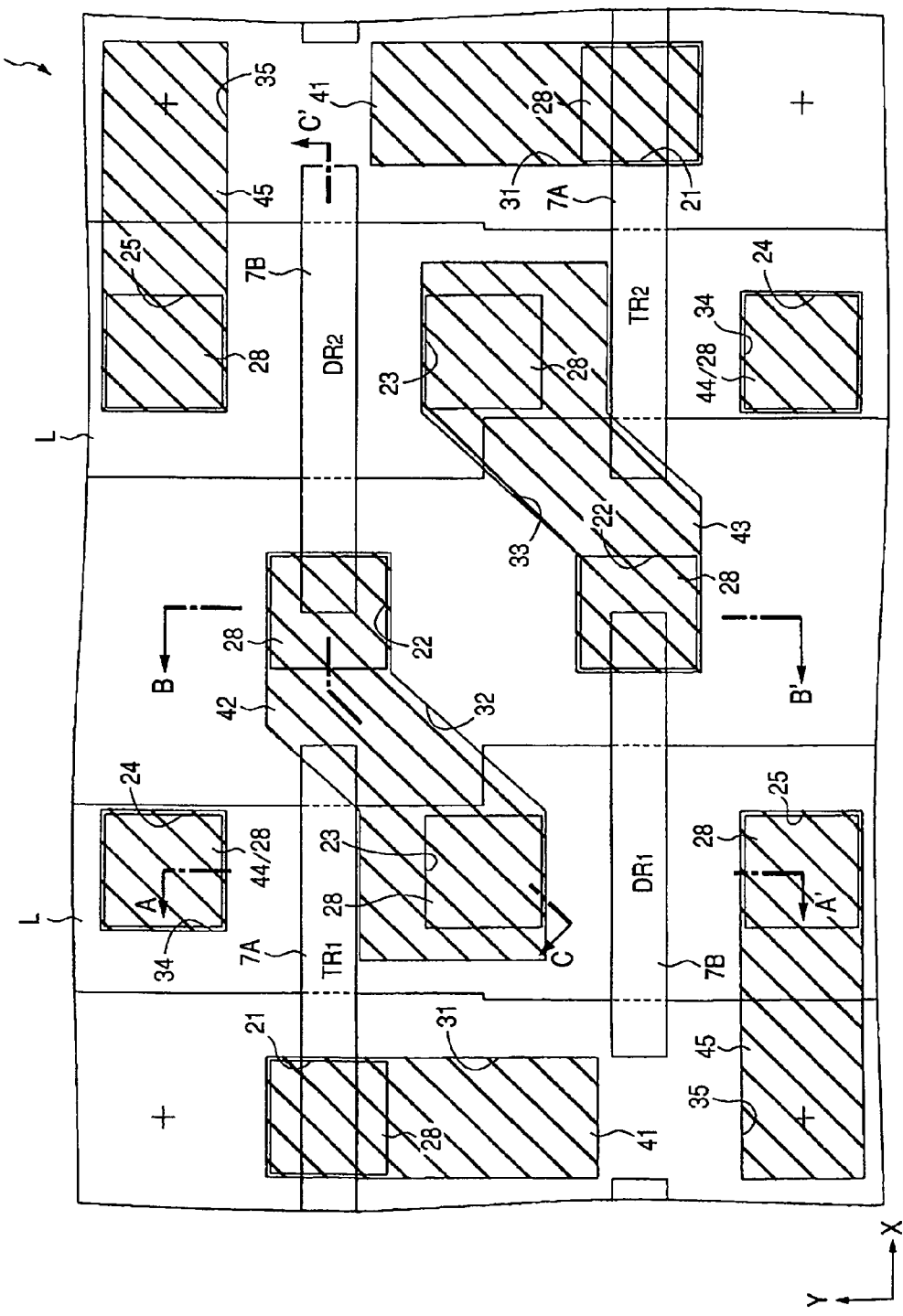
FIG. 5 is fragmentary plan view of a substrate illustrating the manufacturing method of the semiconductor integrated circuit device (SRAM) according to the one embodiment of the present invention.

As illustrated in FIGS. 4 and 5, a silicon nitride film 29 and a silicon oxide film 30 are successively deposited as an insulating film over the substrate 1 by, for example, CVD, followed by dry etching of these films, whereby grooves 31 to 35 are formed over the contact holes 21 to 25, respectively. Of these, the grooves 32 and 33 each extends from the upper part of the contact hole 22 toward the upper part of the contact hole 23. The silicon nitride film 29 serves as a stopper film upon etching of the silicon oxide film 30.

Figure 6:
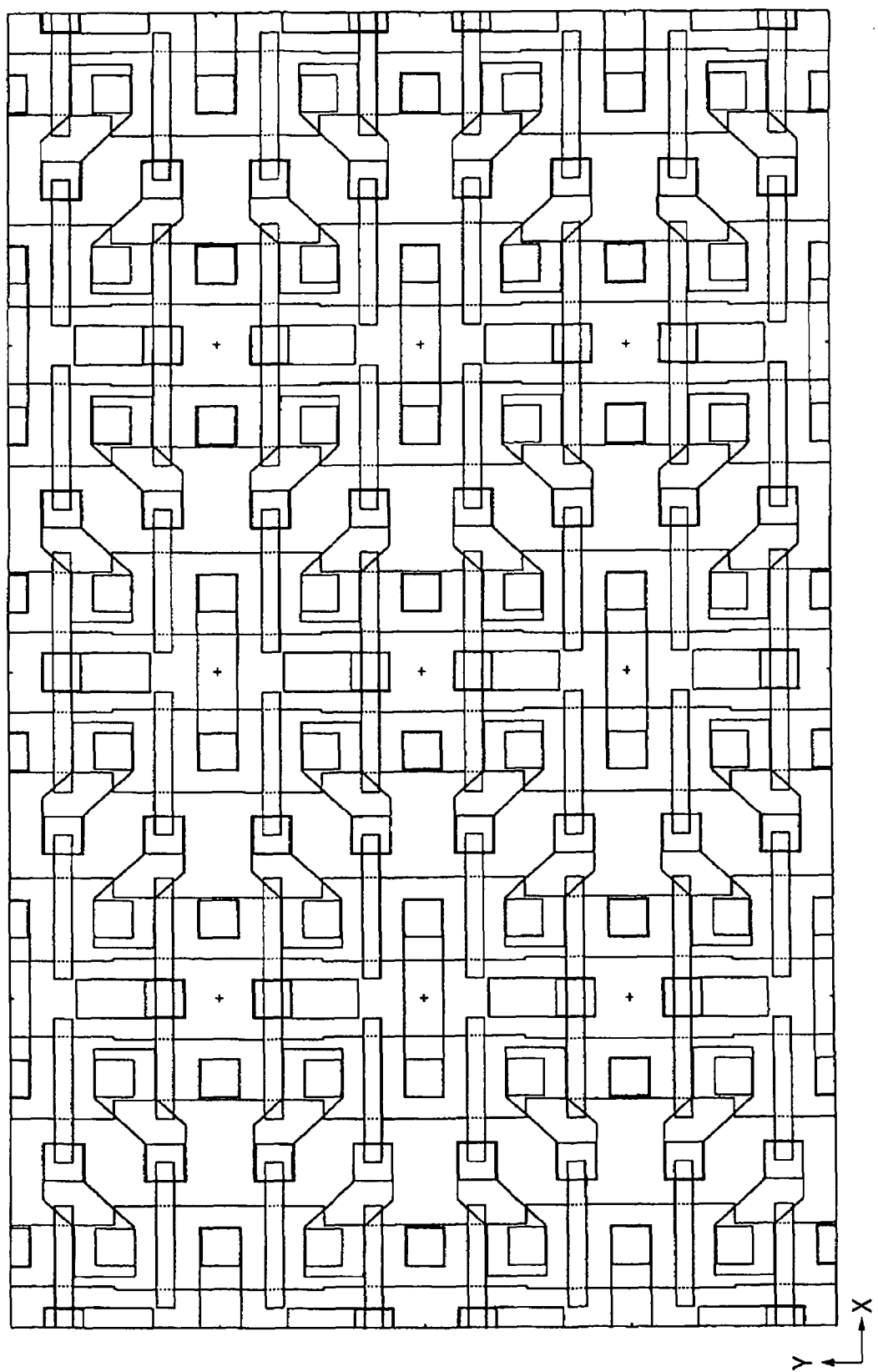
FIG. 6 is a fragmentary plan view of a substrate illustrating the manufacturing method of the semiconductor integrated circuit device (SRAM) according to the one embodiment of the present invention.

Over the silicon oxide film 30 including the insides of the grooves 31 to 35, a TiN film is deposited to serve as a barrier film by, for example, sputtering, followed by deposition of a W film serving as a conductive film by, for example, CVD. The W film outside the grooves 31 to 35 is then removed by CMP to form intermediate conductive layers 41 to 45. FIG. 6 illustrates a fragmentary plan view of a memory cell array after the formation of the intermediate conductive layer. As described above, cell regions are disposed in an array in the X and Y directions, and each cell region is disposed axisymmetric to a short side of the cell region running in the Y direction and axisymmetric to a long side of the cell region running in the X direction. Each pattern in the cell region is disposed point-symmetric to the central point of the cell region.

Of the intermediate conductive layers 41 to 45 shown in FIG. 5, the pair of intermediate conductive layers 42,43 formed at almost the center of the memory cell region correspond to the storage nodes A,B of FIG. 1.

More specifically, the intermediate conductive layer 42(A) is electrically connected to the source and drain regions (n+type semiconductor regions 14) common to TR1 and DR1 and the gate electrode 7B of DR2, while the intermediate conductive layer 43(B) is electrically connected to the source and drain regions ($n_+$ type semiconductor regions 14) common to TR2 and DR2 and the gate electrode 7B of DR1.

Over the intermediate conductive layers 42(A) and 43(B), vertical MISFETs (SV1) and (SV2) are then formed, respectively. The gate electrode of SV1 is connected to the intermediate conductive layer 43(B) and the gate electrode of SV2 is connected to the intermediate conductive layer 42(A).

In addition, a word line (WL) is formed over the intermediate conductive layer 41, bit lines (BLT, BLB) are formed over the intermediate conductive layer 44, and a reference voltage (Vss) line is formed over the intermediate conductive layer 45. Over the vertical MISFET, a supply voltage line (Vdd) is formed.

The steps employed in the manufacture of the vertical MISFET and various interconnects will be described next.

In the fragmentary plan views of FIGS. 7 to 32, in order to facilitate an understanding of the drawings, patterns of layers below the intermediate conductive layer are omitted.

Figure 7:
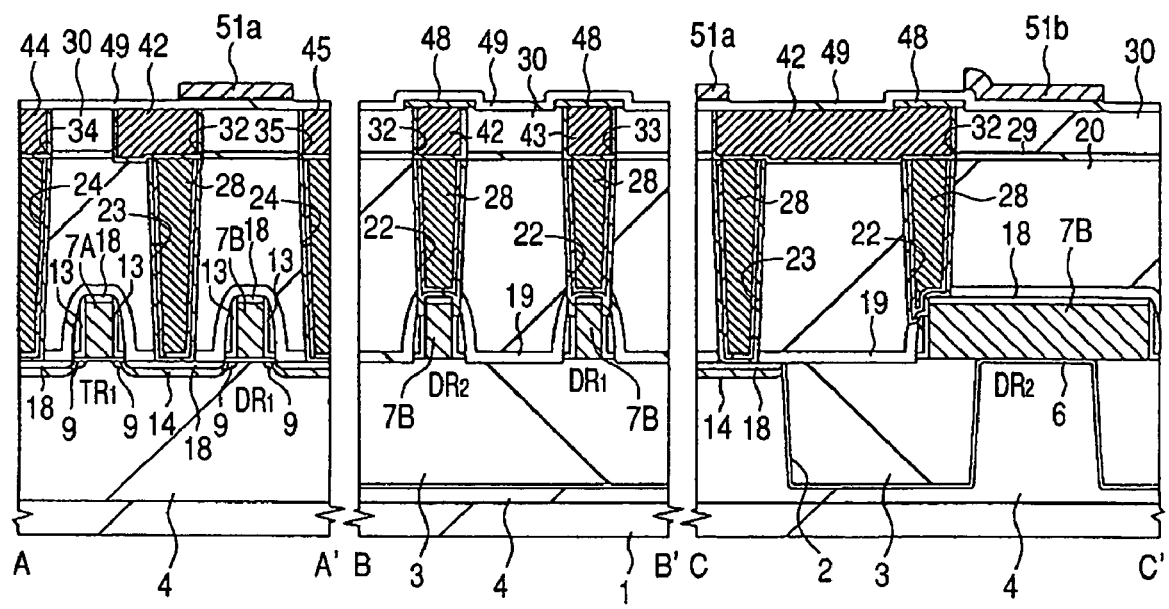
FIG. 7 is a fragmentary cross-sectional view of a substrate illustrating the manufacturing method of the semiconductor integrated circuit device (SRAM) according to the one embodiment of the present invention.
Figure 8:
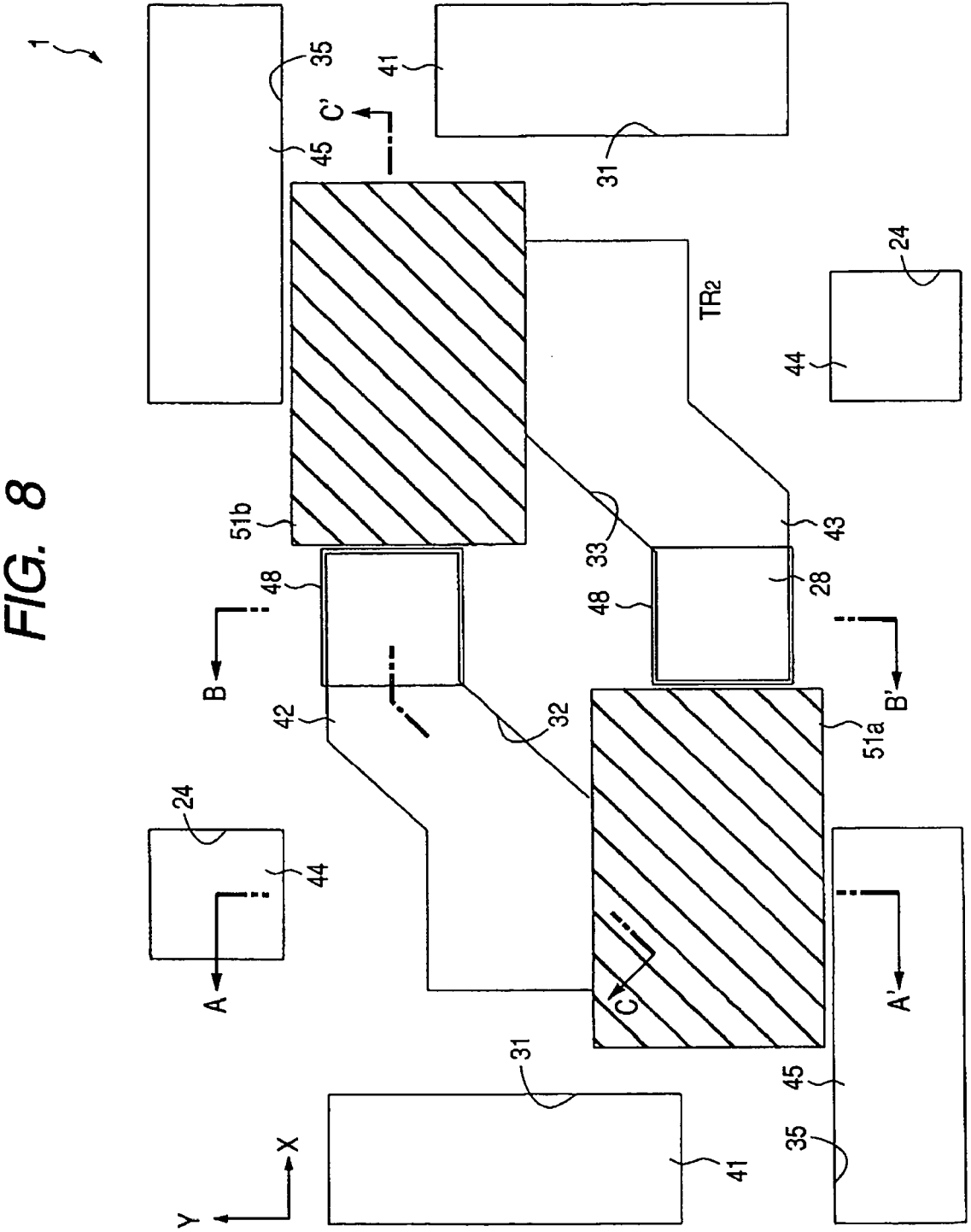
FIG. 8 is a fragmentary plan view of a substrate illustrating the manufacturing method of the semiconductor integrated circuit device (SRAM) according to the one embodiment of the present invention.

As illustrated in FIGS. 7 and 8, for example, a WN film is deposited over the surfaces of the intermediate conductive layers 42,43 by sputtering, followed by patterning, whereby a barrier layer 48 is formed. This barrier layer 48 is formed to prevent the occurrence of undesired silicide reaction on the interface between a silicon film constituting a plug 55 and the intermediate conductive layers 42,43. Therefore, it may be formed only over the formation region of the plug 55.

After deposition of a silicon nitride film 49 as an insulating film over the substrate 1 by, for example, CVD, a polycrystalline silicon film (or amorphous silicon film) having a p type impurity doped therein is deposited as a conductive film by, for example, CVD over the silicon nitride film.

By patterning the polycrystalline silicon film, a pair of gate extraction electrodes 51 (51a,51b) are formed. The gate extraction electrodes 51 are disposed in a region adjacent to the plane patterns of the vertical MISFETs (SV1,SV2), which will be formed later, and they are connected to the gate electrode (66) of the vertical MISFETs (SV1,SV2). The gate extraction electrodes 51a,51b are disposed in the vicinity of the intermediate conductive layers 42,43, respectively.

Formation of the plug 55 to be connected to the vertical MISFET and the gate extraction electrodes 51a,51b at the above-described positions in almost the same layer makes it possible to connect the gate extraction electrode to the gate electrode in self alignment and, moreover, to reduce the vertical difference between the gate extraction electrode and the intermediate conductive layers 42,43, making it possible to connect them via a tungsten (W) plug 80, which will be described later.

Figure 9:
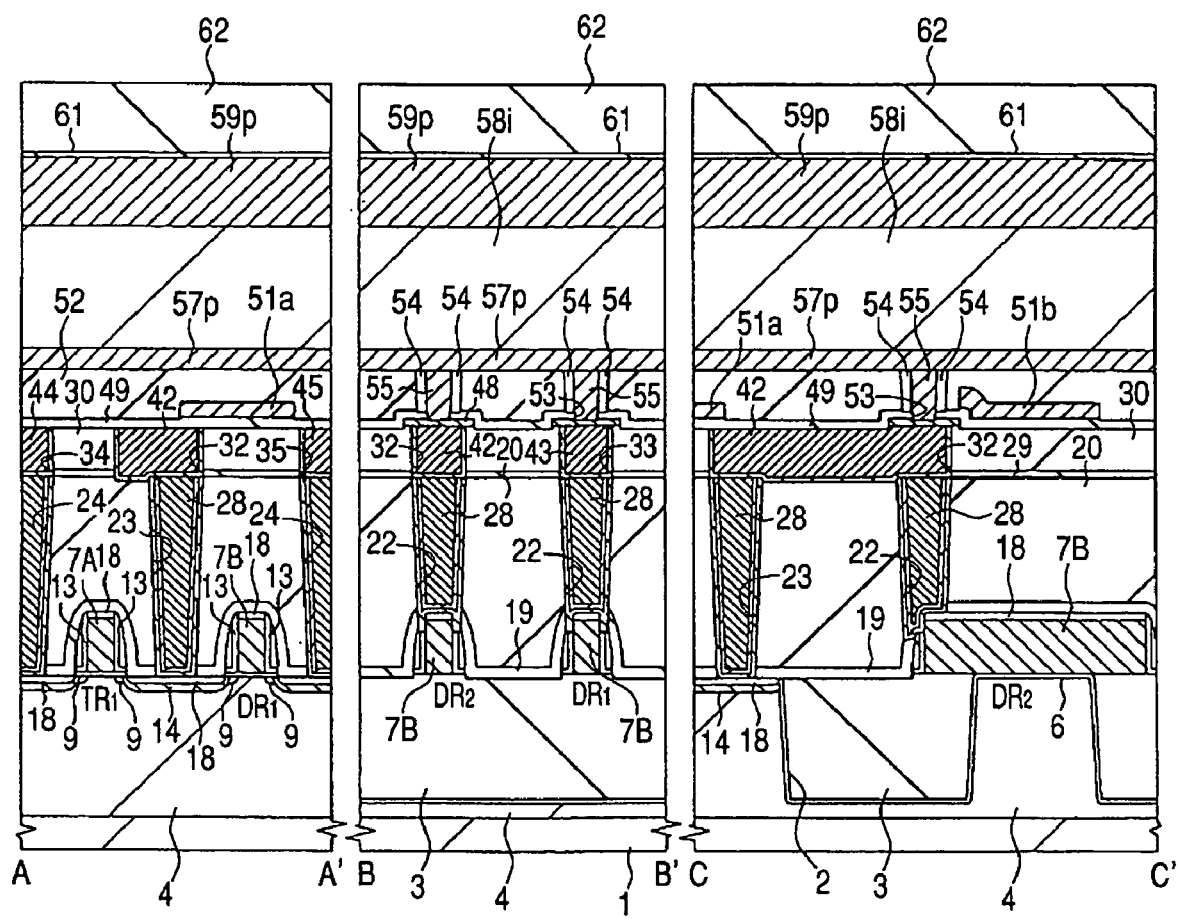
FIG. 9 is a fragmentary cross-sectional view of a substrate illustrating the manufacturing method of the semiconductor integrated circuit device (SRAM) according to the one embodiment of the present invention.

As illustrated in FIG. 9, a silicon oxide film 52 is deposited as an insulating film over the silicon nitride film 49 by, for example, CVD to cover the gate extraction electrode 51. The silicon oxide film 52 over the barrier layer 48 is then dry etched to form a through-hole 53. The silicon nitride film 49 functions as a stopper film during etching of the silicon oxide film 52.

A silicon oxide film is deposited by CVD over the silicon oxide film 52, including the inside of the through-hole 53, followed by anisotropic etching of the silicon oxide film to form, over the side walls of the through-hole 53, side wall spacers 54 made of an insulating film. By this anisotropic etching, the silicon nitride film 49 at the bottom of the through-hole 53 is also etched.

After deposition, over the silicon oxide film 52 including the inside of the through-hole 53, of a polycrystalline silicon film (or amorphous silicon film) having a p type impurity doped therein, by, for example, CVD, the polycrystalline silicon film outside the through-hole 53 is removed by CMP (or etch back) to form the plug 55 inside of the through-hole 53.

Over the silicon oxide film 52 including the upper part of the plug 55, a p type silicon film 57p, a silicon film 58i and a p type silicon film 59p are formed. These three layers of silicon films (57p, 58i, 59p) are formed, for example, in the following manner. After successive deposition of an amorphous silicon film having boron doped therein and a non-doped amorphous silicon film by CVD, these amorphous silicon films are heat treated to crystallize the same. After ion implantation into the silicon film 58i of an n type or p type impurity for the channel formation, an amorphous silicon film having boron doped therein is deposited over the silicon film 58i by CVD, followed by crystallization of the resulting amorphous silicon film by heat treatment. Over the p type silicon film 59p, a thin silicon oxide film 61 and a silicon nitride film 62 are deposited over the p type silicon film 59p successively as a cap insulating film by, for example, CVD.

Figure 10:
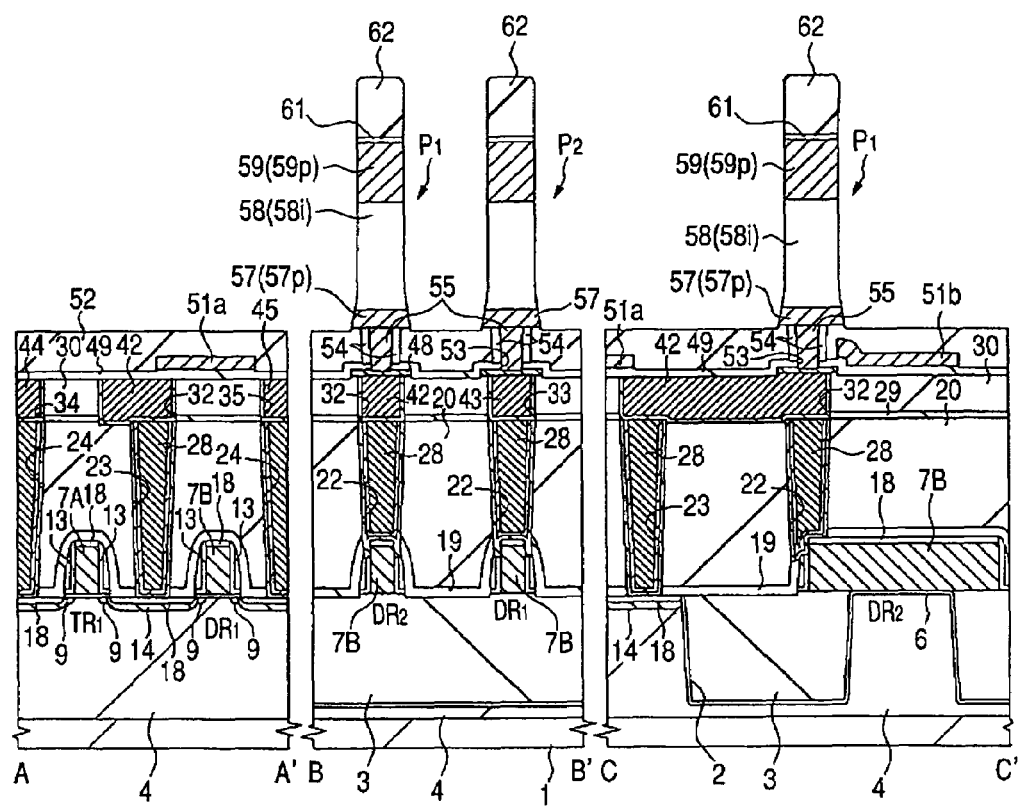
FIG. 10 is a fragmentary cross-sectional view of a substrate illustrating the manufacturing method of the semiconductor integrated circuit device (SRAM) according to the one embodiment of the present invention.
Figure 11:
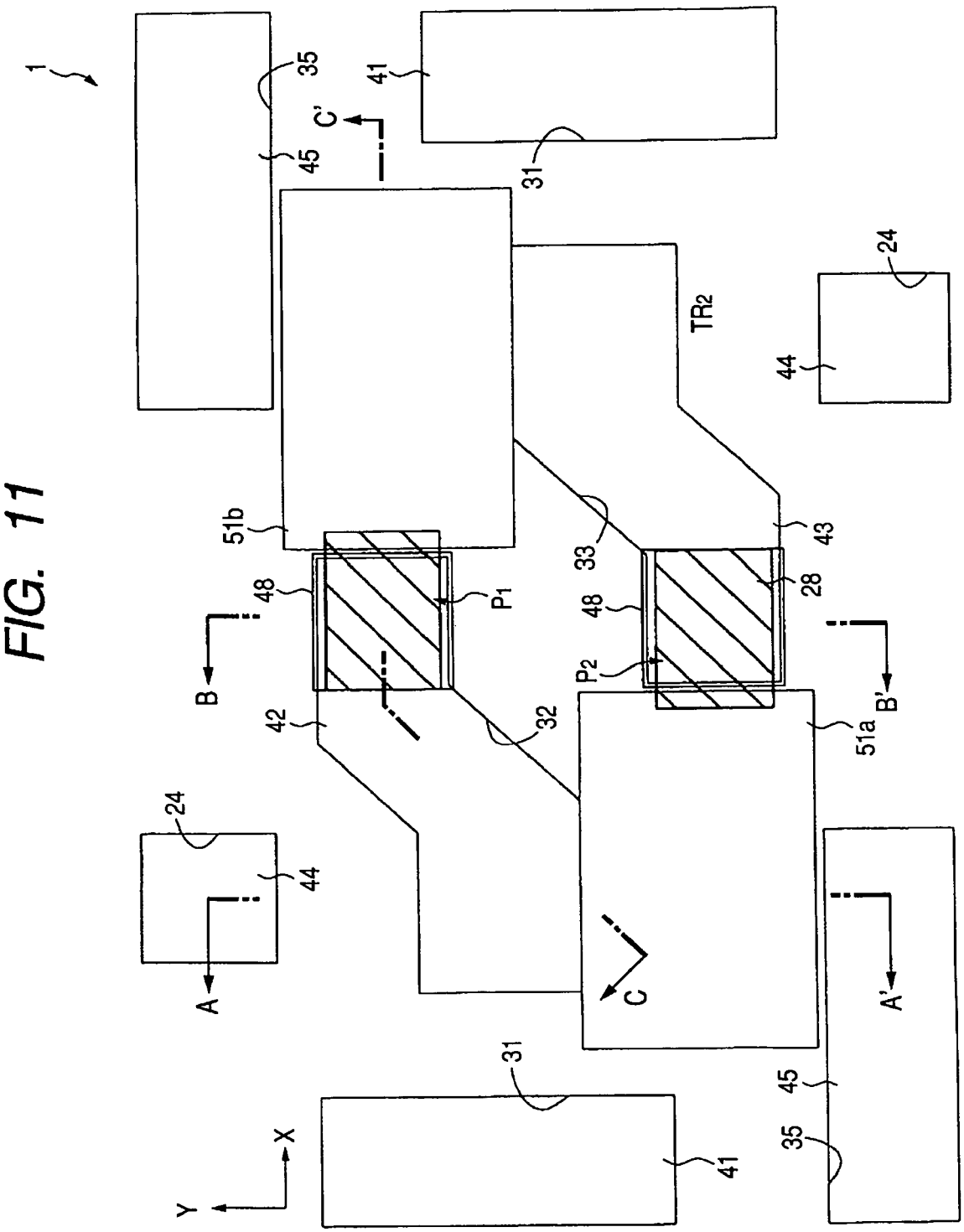
FIG. 11 is a fragmentary plan view of a substrate illustrating the manufacturing method of the semiconductor integrated circuit device (SRAM) according to the one embodiment of the present invention.

As illustrated in FIGS. 10 and 11, using an unillustrated photoresist film as a mask, the silicon nitride film 62 is dry etched to leave the silicon nitride film 62 over a region in which the vertical MISFETs (SV1, SV2) are to be formed. Using the silicon nitride film 62 as a mask, the three silicon films (57p, 58i, 59p) are dry etched, whereby columnar laminates (P1, P2) having a lower semiconductor layer (semiconductor region) 57 made of the p type silicon film 57p, an intermediate semiconductor layer 58 made of the silicon film 58i and an upper semiconductor layer 59 made of the p type silicon film 59p are formed. At this time, the silicon nitride film 62 still remains over the upper semiconductor layer 59.

The lower semiconductor layer 57 of the laminate (P1) constitutes the drain of the vertical MISFET (SV1), while the upper semiconductor layer 59 constitutes the source of it. The intermediate semiconductor layer 58 existing between the lower semiconductor layer 57 and the upper semiconductor layer 59 substantially constitutes the substrate of the vertical MISFET (SV1) and its side walls constitute the channel regions. The lower semiconductor layer 57 of the laminate (P2) constitutes the drain of the vertical MISFET (SV2) and the upper semiconductor layer 59 constitutes the source of it. The intermediate semiconductor layer 58 substantially constitutes the substrate of the vertical MISFET (SV2) and its side walls constitute the channel regions.

Figure 12:
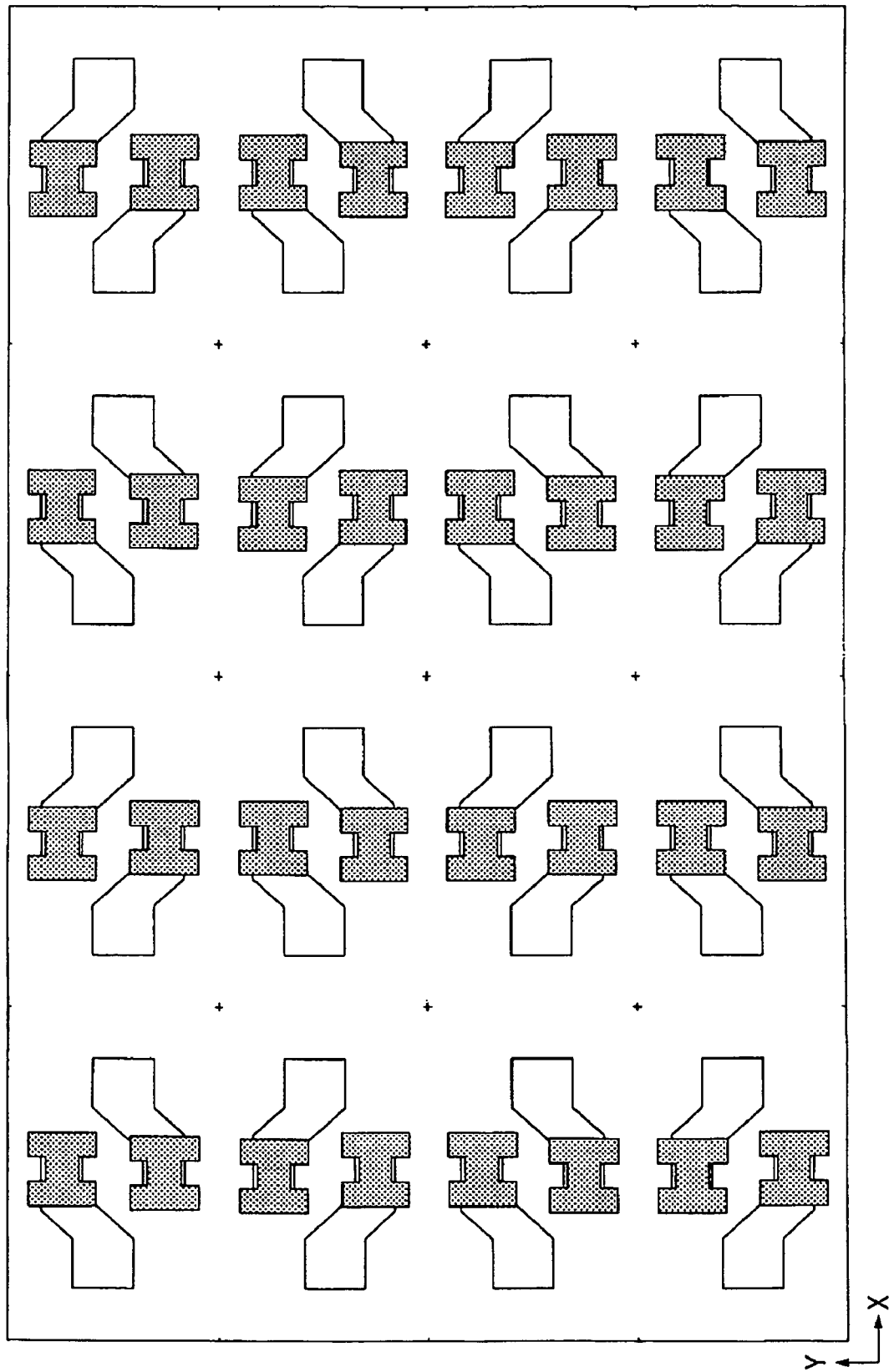
FIG. 12 is a plan view illustrating a transfer pattern (reticle pattern) to be used for a manufacturing step of the semiconductor integrated circuit device (SRAM) according to the one embodiment of the present invention.

In this Embodiment, a transfer pattern (reticle pattern), upon patterning of a photoresist film used for etching of the silicon nitride film 62, is formed to have a shape as illustrated in FIG. 12. As illustrated in FIG. 12, this transfer pattern (which may be called a "transfer mask") is H-shaped when viewed from the Y direction. As described later based on FIGS. 13(a) and 13(b), this transfer pattern (transfer mask) is H-shaped, more specifically, it does not have a uniform width in the Y direction and is narrower at the center thereof than a both ends. In FIG. 12, the patterns of the intermediate conductive layers 42,43 are also shown in order to facilitate an understanding of the positional relationship between the pattern of an actual device and the transfer pattern.

According to this embodiment, use of a transfer mask which has been H-shaped in the Y direction enables etching of the photoresist film into an approximately elliptical etching pattern having a longer diameter in the X direction. By etching the silicon nitride film 62 through this approximately elliptical etching pattern and then, etching the columnar laminates (P1, P2) through the resulting silicon nitride film 62 thus etched into an approximate ellipse, it is possible to make the plane pattern of the columnar laminates (P1, P2) into an approximately elliptical shape that is longer in the X direction (refer to FIG. 17). Since the transfer mask which has been H-shaped in the Y direction is used, an approximately elliptical etching pattern having a longer diameter in the X direction can be formed, and the columnar laminates (P1,P2) can be formed to have an approximately elliptical shape that is longer in the X direction.

As a result, the distance between any two adjacent columnar laminates in the Y direction can be narrowed, making it possible to increase the channel region (channel current) of the vertical MISFET while attaining miniaturization of a cell region.

Examples (a) and (b) in FIG. 13 show the relationship between the transfer pattern and the etched shape (plane pattern of the laminate). As illustrated by Example (b), the transfer pattern is H-shaped in the Y direction. In other words, a rectangle having a short side (300 nm) and a long side (320 nm) lacks, at both ends at the center of the two long sides (direction X), a rectangular pattern having a predetermined width (120 nm) in the X direction and a predetermined depth (70 nm) in the Y direction. In short, the transfer pattern is H-shaped with its width in the Y direction being narrower, at the center of the X direction, than both ends of the pattern.

When the transfer pattern having the above-described size is used, the plane pattern of the laminate is elliptical with a longer diameter of about 270 nm and a shorter diameter of about 230 nm.

When a square transfer pattern 240 nm on a side as illustrated by Example (a) is used, on the other hand, the plane pattern of the laminate does not become a complete circle but is approximately circular (longer diameter: 236 nm, shorter diameter: 224 nm).

In the plain views and perspective views other than FIG. 17, a plane pattern of each of the silicon nitride film 62 and columnar laminates (P1, P2) is illustrated as a rectangular one for convenience sake.

Upon dry etching of the above-described silicon films (57p, 58i, 59p), a taper may be formed on the bottom of the side walls of the laminates (P1, P2), as illustrated in FIG. 10. An increase in the contact resistance between the lower semiconductor layer 57 and the plug 55 due to misalignment can be suppressed by the formation of a taper.

Upon forming the laminates (P1, P2), a thin (several nm or less) tunnel insulating film composed of a silicon nitride film or the like may be disposed in the vicinity of the interface between the upper semiconductor layer 59 and the intermediate semiconductor layer 58, in the vicinity of the interface between the lower semiconductor layer 57 and the intermediate semiconductor layer 58, or at the center of the intermediate semiconductor layer 58. Provision of this tunnel insulating film makes it possible to prevent diffusion of an impurity in the lower semiconductor layer 57 or in the upper semiconductor layer 59 to the inside of the intermediate semiconductor layer 58.

Figure 14:
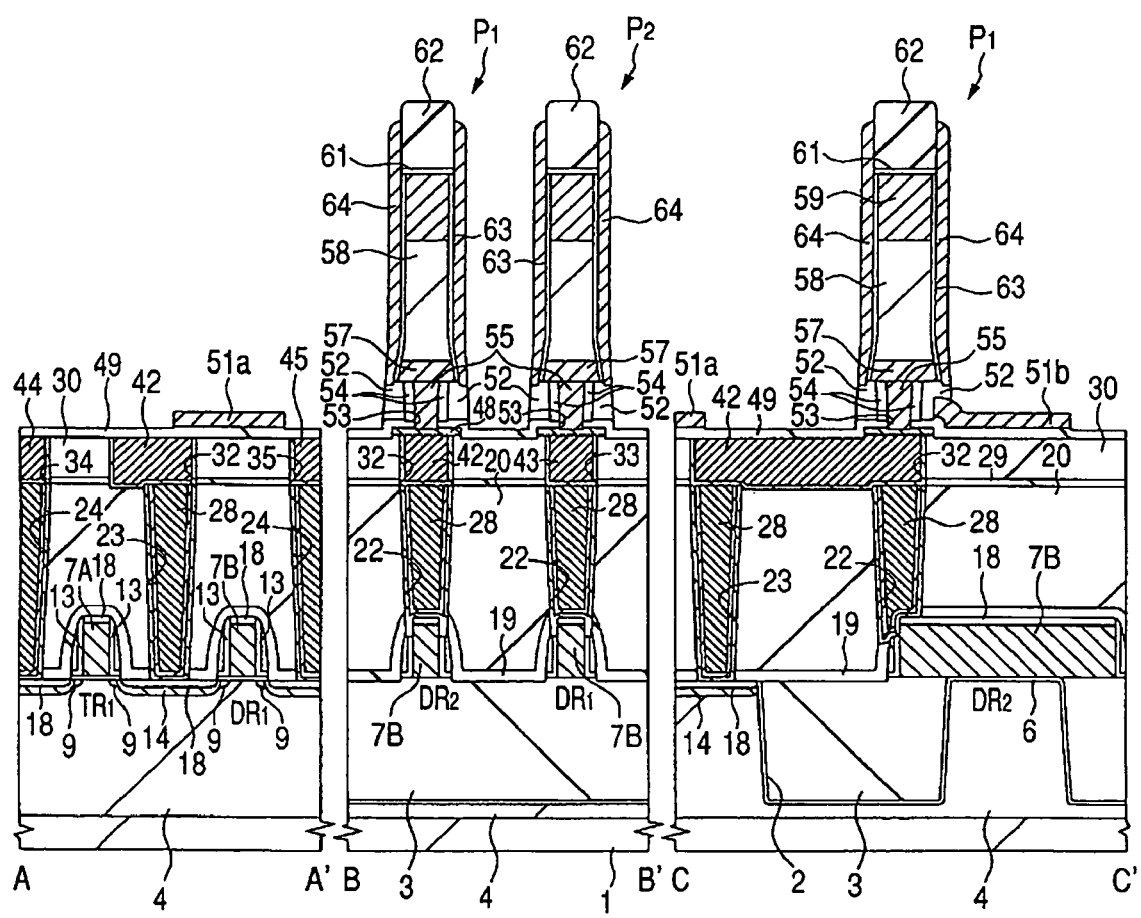
FIG. 14 is a fragmentary cross-sectional view of a substrate illustrating the manufacturing method of the semiconductor integrated circuit device (SRAM) according to the one embodiment of the present invention.
Figure 15:
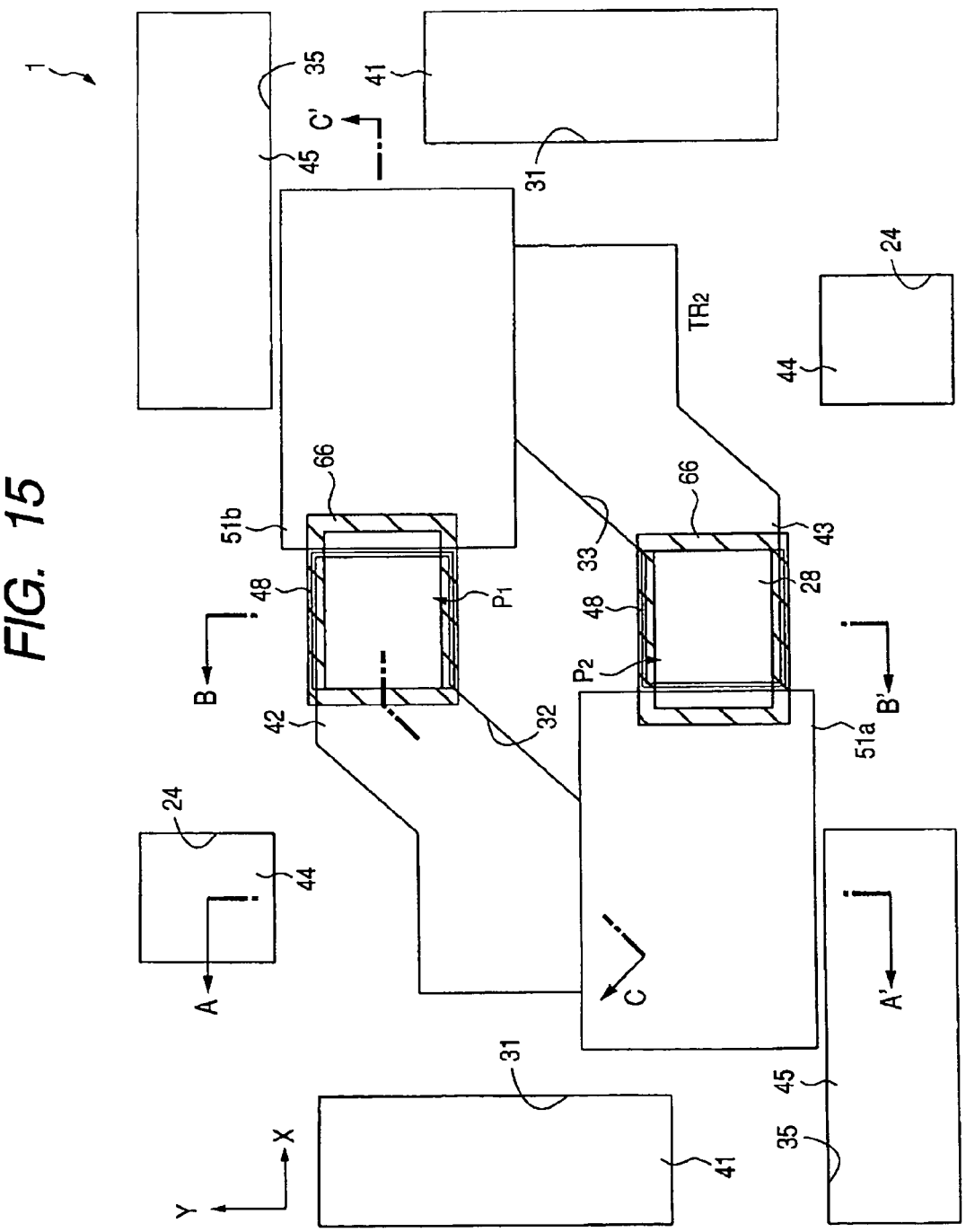
FIG. 15 is a fragmentary plan view of a substrate illustrating the manufacturing method of the semiconductor integrated circuit device (SRAM) according to the one embodiment of the present invention.

As illustrated in FIGS. 14 and 15, a gate insulating film 63 is formed over the surface of the side walls of the lower semiconductor layer 57, intermediate semiconductor layer 58 and upper semiconductor layer 59, which layers constitute each of the laminates (P1, P2). This gate insulating film 63 is made of, for example, a silicon oxide film and is formed by subjecting the substrate 1 to low-temperature thermal oxidation (for example, wet oxidation) at 800° C. or less. Since the silicon oxide film 61 has been formed between the laminates (P1, P2) and the silicon nitride film 62 thereover, contact between the gate insulating film 63 formed on the surface of the upper semiconductor layer 59 with the silicon nitride film 62 can be prevented, and, therefore, lowering in the withstand pressure of the gate insulating film 63 in the vicinity of the upper end portion of the laminates (P1, P2) can be prevented. The gate insulating film may be formed of a deposited film.

After a first polycrystalline silicon film 64, having a p type impurity doped therein, is deposited as a conductive film over the silicon oxide film 52 and columnar laminates (P1, P2) by using, for example, CVD, this polycrystalline silicon film is anisotropically etched to leave the first polycrystalline silicon film so as to surround therewith the side walls of the columnar laminates (P1, P2) and silicon nitride film 62. By forming the first polycrystalline silicon film 64, which partially constitutes the gate electrode (66), as described above in self alignment, the memory size can be reduced.

Upon etching of this polycrystalline silicon film 64, the silicon oxide film 52 lying therebelow is etched successively.

Figure 16:
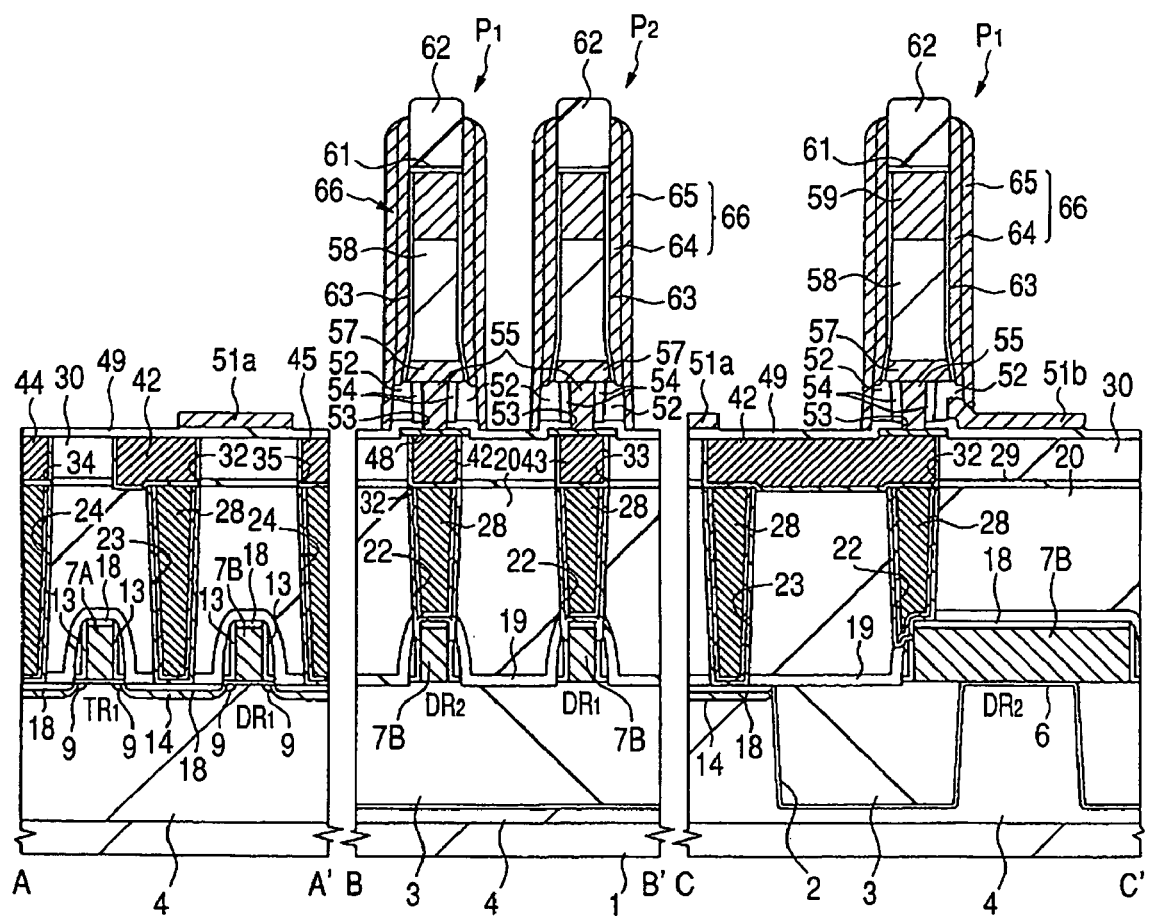
FIG. 16 is a fragmentary cross-sectional view of a substrate illustrating the manufacturing method of the semiconductor integrated circuit device (SRAM) according to the one embodiment of the present invention.

As illustrated in FIGS. 15 and 16, a second polycrystalline silicon film 65 having a p type impurity doped therein is formed, as a conductive film, over the surfaces of the silicon nitride film 49 and first polycrystalline silicon film 64 by, for example, CVD. By anisotropic etching of this polycrystalline silicon film, the second polycrystalline silicon film 65 is left so as to surround therewith the surface of the first polycrystalline silicon film 64.

The second polycrystalline silicon film 65 is also formed over the surfaces of the gate extraction electrodes 51 (51a, 51b) and it is electrically connected to the gate extraction electrodes 51. The second polycrystalline silicon film 65 is also formed in self alignment so that the memory size can be reduced.

By the steps so far mentioned, the gate electrode 66 of the vertical MISFETs (SV1, SV2), that is made of a laminate of the first polycrystalline silicon film 64 and the second polycrystalline silicon film 65, is formed so as to cover the columnar laminates (P1, P2) and the silicon nitride film 62.

Figure 18:
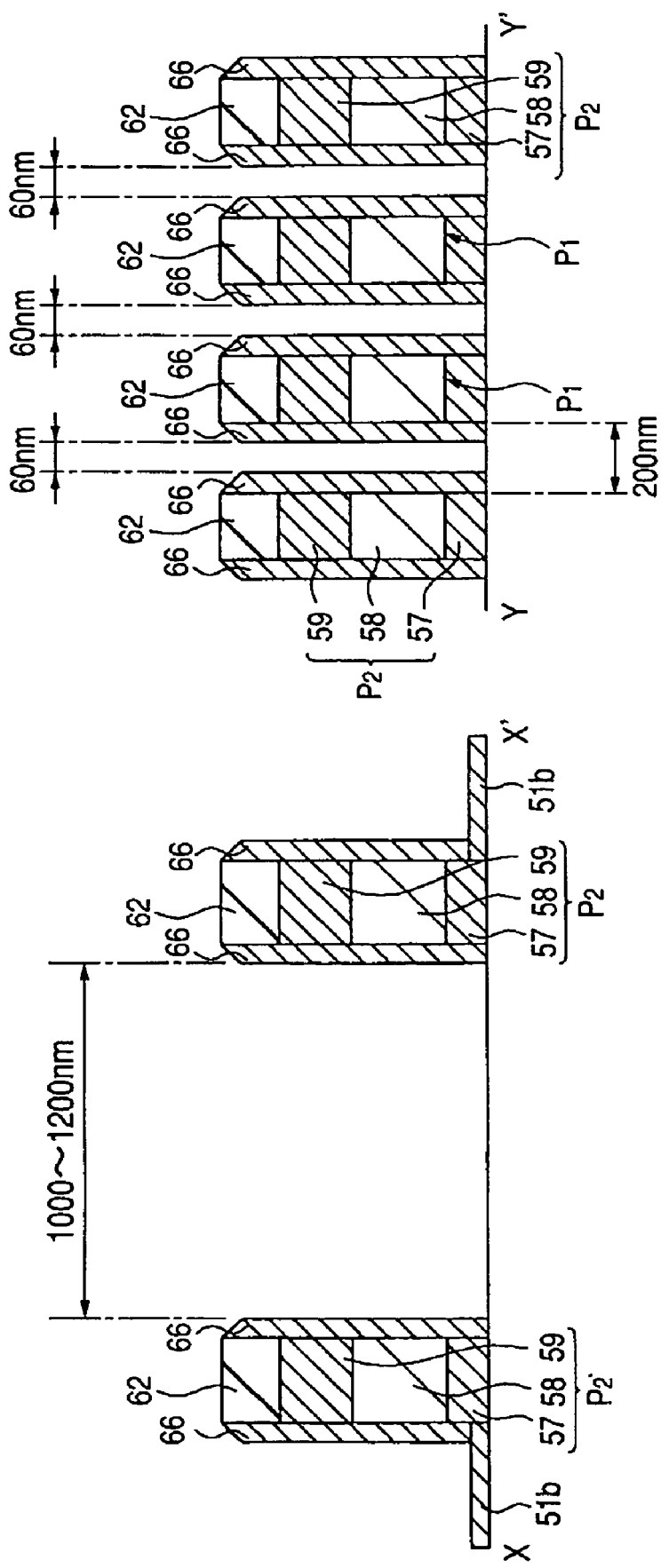
FIG. 18 is a fragmentary cross-sectional view of a substrate illustrating the manufacturing method of the semiconductor integrated circuit device (SRAM) according to the one embodiment of the present invention.
Figure 19:
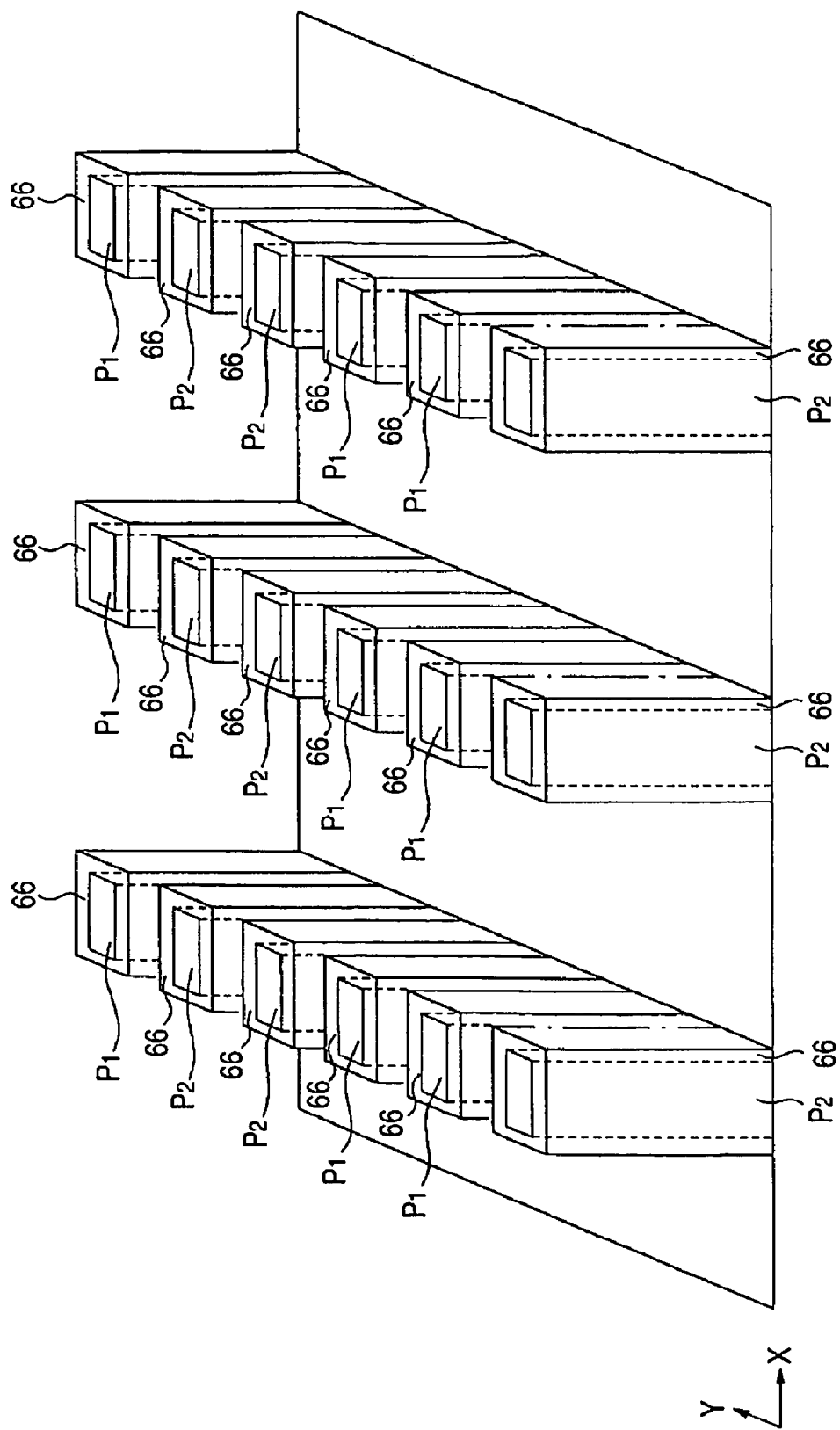
FIG. 19 is a fragmentary perspective view of a substrate illustrating the manufacturing method of the semiconductor integrated circuit device (SRAM) according to the one embodiment of the present invention.

FIG. 17 is a fragmentary plan view illustrating the relationship between the columnar laminate and gate electrode in the memory cell array (plural cell regions). FIG. 18 is a schematic fragmentary cross-sectional view of the vertical MISFET after formation of the gate electrode 66, in which the left diagram is a view taken along a line X-X' of FIG. 17, while the right diagram is a view taken along a line Y-Y' of FIG. 17. In cross-sectional views of FIGS. 18 to 27, layers below the plug 55 are omitted. Some films, such as gate insulating film 63, are also omitted. The gate extraction electrodes 51 (51a, 51b) are formed at a position lower than the lower semiconductor layer 57, but in these diagrams, they are illustrated adjacent to the lower semiconductor layer 57. FIG. 19 is a fragmentary perspective view illustrating the state of the gate electrode 66 covering the side walls of the columnar laminate in the memory cell array (in the perspective view, the gate extraction electrode is omitted. This will equally apply to FIGS. 22 and 26).

As illustrated in FIG. 17, patterns each made of the columnar laminate (P1 or P2) and gate electrode 66 are disposed in the array form in the X and Y directions. They are spaced by, for example, 1000 to 1200 nm (for example, about 1040 nm) in the X direction, while the spacing (pitch) in the Y direction is 60 nm. With regard to the arrangement of the columnar laminate and gate electrode, there exist, for example, narrow pitch portions (D1) of 150 nm or less and wide pitch portions (D2) of 500 nm or greater.

Supposing that the lower semiconductor layer 57, intermediate semiconductor layer 58, upper semiconductor layer 59 and silicon nitride layer 62 constituting the columnar laminate are 300 nm, 300 nm, 300 nm and 300 nm thick, respectively, the height of the columnar laminate becomes about 1200 nm. The aspect ratio of the narrow pitch portion is about 20. When the aspect ratio of the narrow pitch portion exceeds 3, it becomes difficult to fill an insulating film between the adjacent two columnar patterns (P1, 66) with good accuracy. When the aspect ratio exceeds 6, an insulating film cannot be filled with good accuracy even if a conventional technique for filling in a spacing between interconnects or an isolation groove is employed. The aspect ratio of the wide pitch portion, on the other hand, becomes about 1.

At this point, a step of filling an insulating film between a plurality of columnar patterns (P1, 66) having both a narrow pitch portion and a wide pitch portion will be described.

Figure 20:
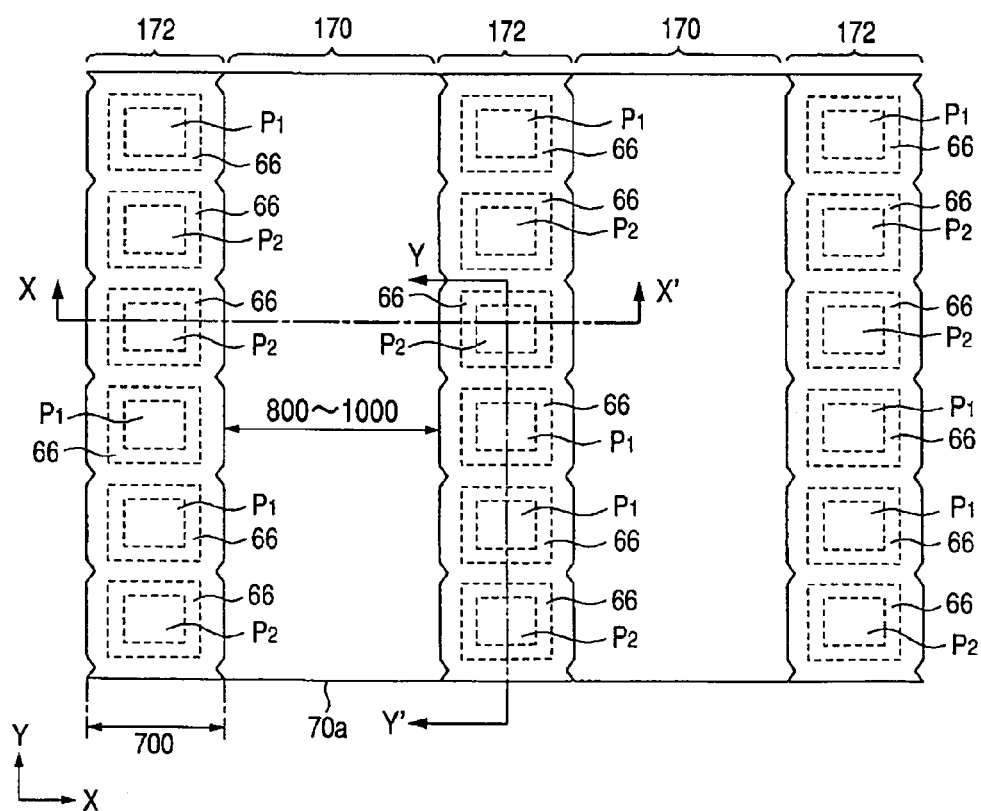
FIG. 20 is a fragmentary plan view of a substrate illustrating the manufacturing method of the semiconductor integrated circuit device (SRAM) according to the one embodiment of the present invention.
Figure 21:
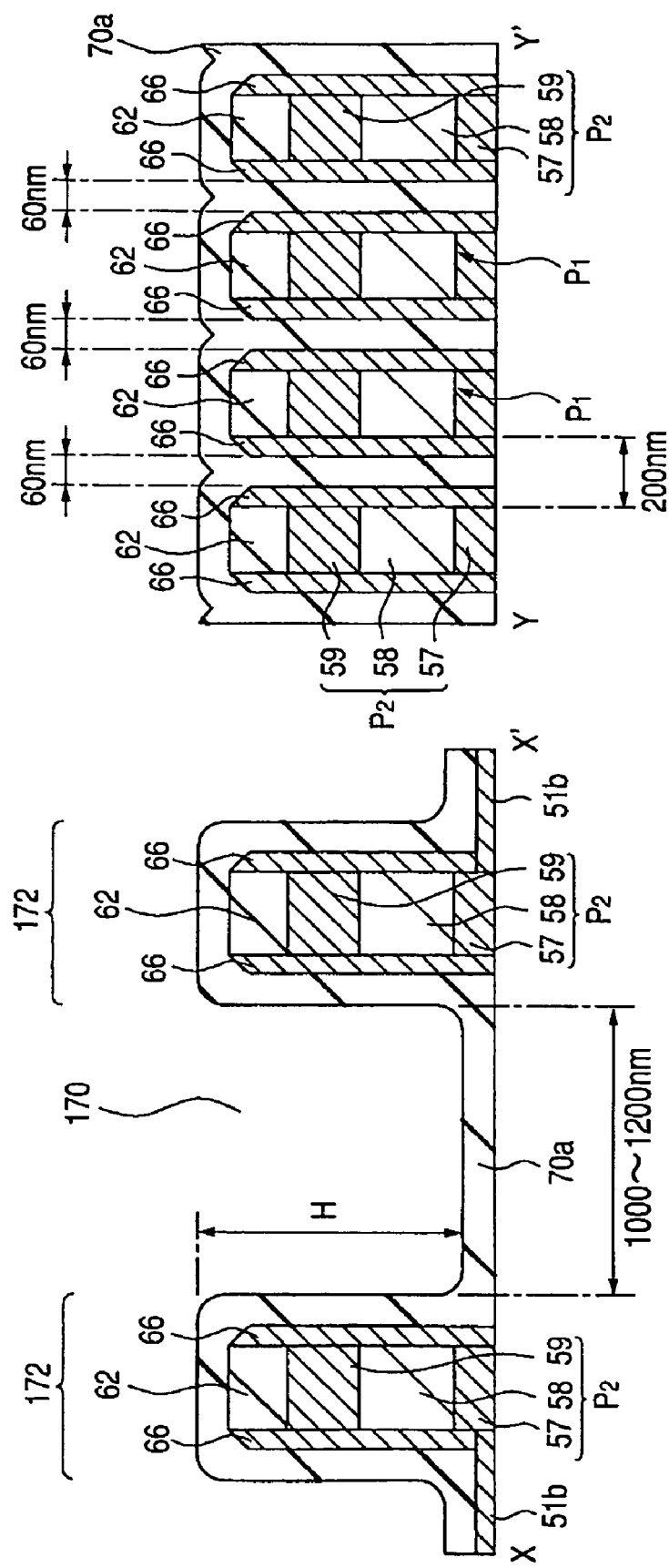
FIG. 21 is fragmentary cross-sectional view of a substrate illustrating the manufacturing method of the semiconductor integrated circuit device (SRAM) according to the one embodiment of the present invention.
Figure 22:
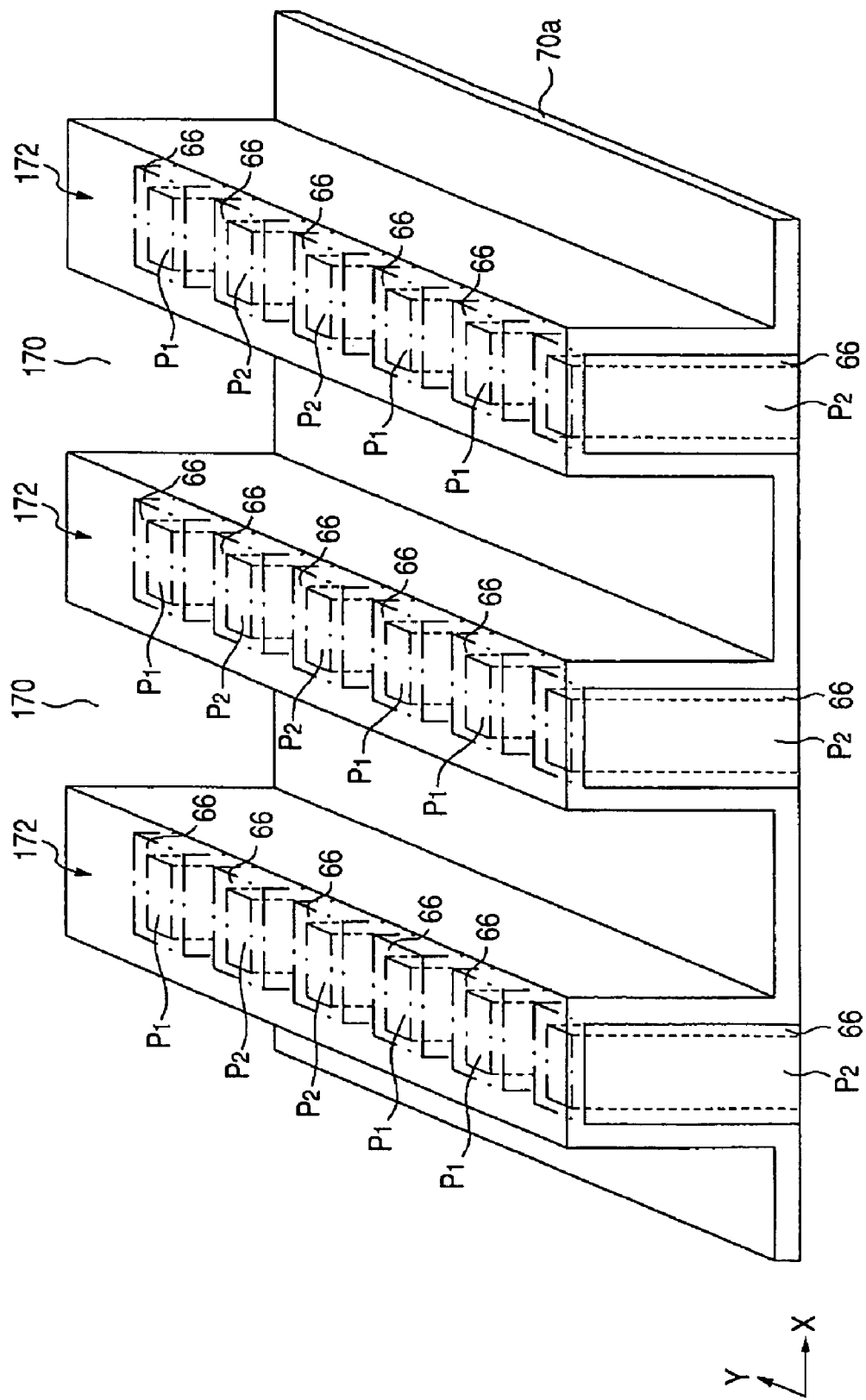
FIG. 22 is a fragmentary perspective view of a substrate illustrating the manufacturing method of the semiconductor integrated circuit device (SRAM) according to the one embodiment of the present invention.

As illustrated in FIGS. 20 to 22, a first insulating film 70a having good coverage is deposited. A so-called TEOS film can be given as an example of a film having good coverage. This TEOS film is a film formed by CVD using tetraethoxysilane ($Si(OC_2H_5)_4$) as a raw material. Examples include an $O_3$-TEOs film obtained by using an active oxidizing species such as ozone ($O_3$) as another raw material to heighten the reactivity of the film, and a P-TEOS film whose reaction is carried out under a plasma atmosphere.

The $O_3$-TEOS film has better coverage than the p-TEOS film so that it is suited as the first insulating film 70a.

Examples of another film having good coverage include thermal CVD films obtained by monosilane or disilane as a raw material and which can be made reactive by heat. In this case, however, heat treatment at 700° C. or greater (preferably 800° C.) for about 10 hours is necessary, and so deterioration in device properties due to thermal stress is inevitable. In the manufacture of a miniaturized and highly-integrated device, such as the SRAM of the present invention, there exists a thermal stress standard of limiting application of a thermal stress to a predetermined time in terms of a standard temperature throughout the manufacturing steps. It is difficult to satisfy this thermal load standard when the thermal CVD film is employed.

The $O_3$-TEOS film, on the other hand, can be formed at 700° C. or less so that a film with good coverage is available while reducing the thermal stress in the manufacturing steps.

The following is one example of the film forming conditions of an $O_3$-TEOS film. It is formed under conditions of a TEOS flow rate of from 800 to 2000 mgm (milligram per minute), an $O_3$ flow rate of from 5000 to 10000 sccm, a nitrogen ($N_2$) flow rate of from 8000 to 20000 sccm, a temperature from 450 to 600° C., and a subnormal pressure of 600 Torr (1 Torr=1.33322×$10^2$ Pa) while using tetraethoxysilane (TEOS) and $O_3$ as raw materials. Spacing from a susceptor for loading a wafer thereon and a shower head portion which is a raw material gas feeding part is, for example, from 200 to 400 mils. The pressure may fall within a range of from 20 to 760 Torr.

The P-TEOS film is formed under the conditions, for example, of 300° C. and an atmosphere of about 5 to 10 Torr, while using tetraethoxisilane and oxygen as raw materials.

After formation of the first insulating film ($O_3$-TEOS film) 70a, it may be heat treated at, for example, 700° C. for 1 minute in order to densify the film.

As illustrated in FIG. 21, the first insulating film 70a is thick enough to fill therewith narrow pitch portions completely, but not enough to fill wide pitch portions. More specifically, after formation of the first insulating film 70a, a concave portion 170 is formed over a wide-pitch space. The thickness of the first insulating film 70a is adjusted to the narrow-pitch space (D1=60 nm) or greater in consideration of variations in the size between the pitches or the margin of the film thickness. The upper space between the two adjacent columnar patterns (P1, 66) is wider than the bottom space (refer to FIG. 16). In order to reduce the generation of voids in such a portion and maintain a thickness to some extent over the columnar pattern, the film thickness is preferably adjusted to at least a thickness of the narrow pitch portion (in this case, about 200 nm) between the two adjacent patterns, each made of the lower semiconductor layer 57, intermediate semiconductor layer 58 and upper semiconductor layer 59. The thickness of this first insulating film is, for example, based on a film existing over the wide pitch portion. It is also possible to form the first insulating film in portions and finally make it totally thick enough to fill the narrow pitch portion.

As another example, as illustrated in FIG. 22, a row of the columnar laminates (P1, P2) and gate electrode 66 in the Y direction is covered with the first insulating film 70a as if patterns 172 having a width of about 700 nm and thickness of about 1200 nm are spaced by about 800 to 1000 nm (FIG. 20). The film thickness of the gate electrode 66 is about 40 to 90 nm, while the thickness of the first insulating film over the wide-pitch portion is about 200 to 300 nm.

As illustrated in FIG. 23, a second insulating film 70b is deposited over the first insulating film 70a. Since the underlying layer of this second insulating film 70b has a line pattern with a relatively large width and space, flatness is an important factor for it. When the second insulating film shows a conformal growth, irregularities of the underlying layer (first insulating film 70a) appear as irregularities of the second insulating film as is, which will cause a problem in the subsequent steps, such as during CMP.

As the second insulating film 70b, use of an insulating film formed by high-density plasma CVD (which will hereinafter be called "HDP film") is recommended.

The high density plasma CVD is a method of forming a film by reacting a raw material gas under the atmosphere of high density ($10_{11}$/$cm^2$ or greater) plasma. Upon reaction, an RF bias is applied to the substrate. In this high density plasma CVD, reaction is accelerated by the plasma, while sputter etching due to collision of the plasma with a deposited film occurs. This etching phenomenon occurs preferentially at the protruded portion of the film. When an HDP film is employed as the second insulating film 70b, its surface is not easily influenced by the irregularities of the underlying layer so that flatness can be secured (FIG. 23).

Here, an HDP silicon oxide film is employed. It is formed, for example, under conditions of an $SiH_4$ flow rate of from 70 to 90 sccm, an $O_2$ flow rate of from 130 to 170 sccm, an argon (Ar) flow rate of from 350 to 450 sccm, and a temperature of from 280 to 400° C. while using silane ($SiH_4$) and oxygen ($O_2$) as raw materials. LF is from 3000 to 4000 W, while HF is from 2000 to 3000W. This generates a high density Ar/$O_2$/$SiH_4$ plasma.

Also, upon formation of this HDP film, the temperature is adjusted to 700° C. or less in order to reduce the thermal stress.

In order to fill the second insulating film 70b to a certain depth of the concave portion 170 over the wide pitch portion, it is deposited to a film thickness corresponding to 70% or greater of a vertical difference (H) between the bottom portion of the first insulating film 70a in the wide pitch portion and the top0 portion existing over the columnar laminates (P1, P2). Here, the thickness of the second insulating film is adjusted to about 600 to 1400 nm. This second insulating film may be formed in portions.

The vertical difference (H) is almost the height of the columnar laminate (lower semiconductor layer 57, intermediate semiconductor layer 58, upper semiconductor layer 59 and silicon nitride film 62) in FIG. 23. When the plug 55 is formed below the lower semiconductor layer 57, the height of the plug 55 is also included in the vertical difference (refer to FIG. 16).

Examples of the high-density plasma CVD include electron cyclotron resonance plasma (ECR) CVD, capacitively coupled plasma (IPC) CVD and helicon plasma CVD. For the formation of an HDP film, a manufacturing apparatus for a semiconductor device having, as a plasma source, microwaves, helicon waves, ICP, ECR or the like is used.

Phosphorous or boron may be doped into the first insulating film ($O_3$-TEOS film) 70a to make it a BPSG or PSG film. Fluorine or phosphorous may be doped into the second insulating film (HDP film) 70b. Thus, gettering effects are available by doping an impurity in an insulating film.

According to this Embodiment, it is possible to fill the space between columnar patterns with good accuracy, because after the first insulating film having good coverage is deposited with a thickness sufficient to completely fill the narrow pitch portions, the second insulating film is deposited thereover.

Figure 40:
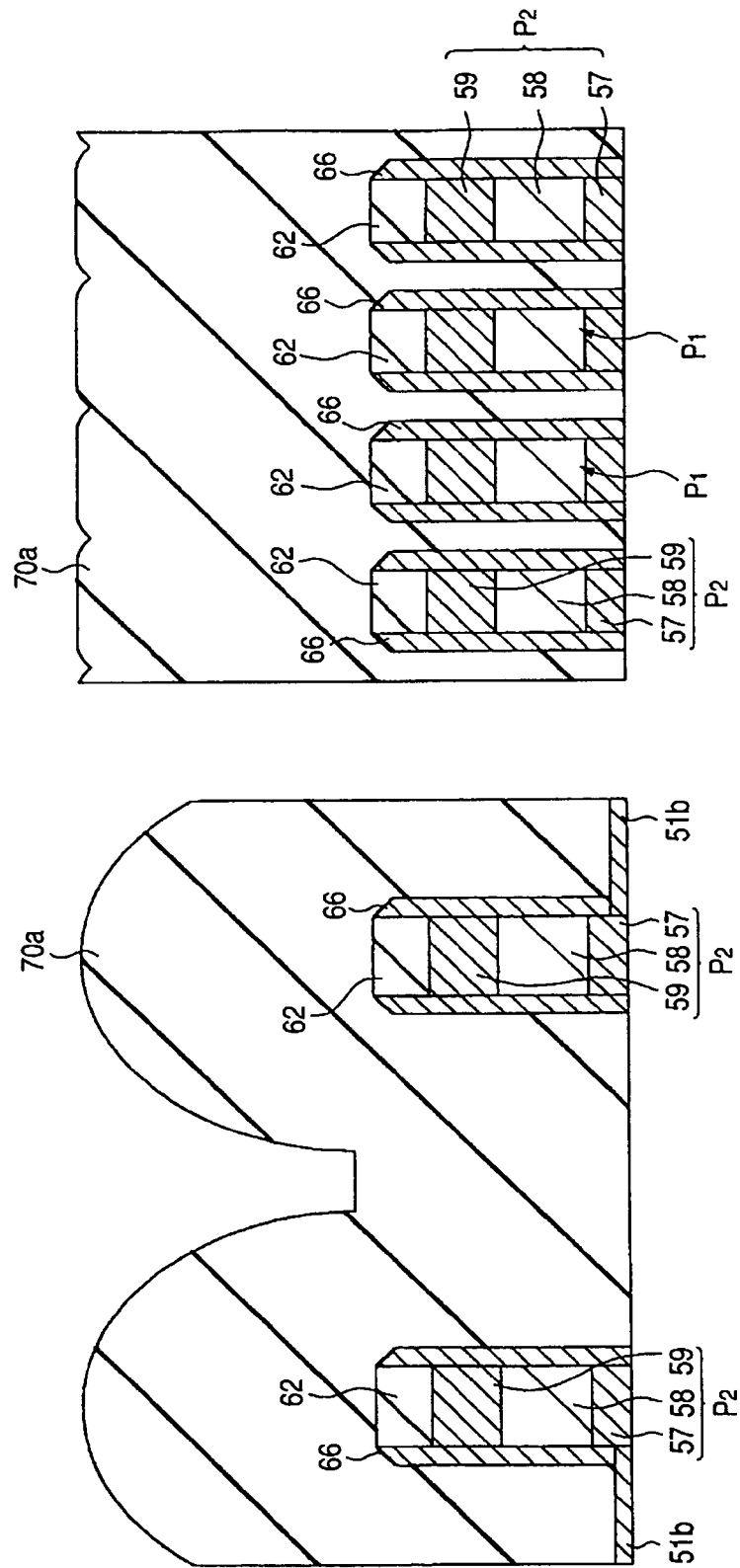
FIG. 40 is fragmentary cross-sectional view of a substrate illustrating the manufacturing method of the semiconductor integrated circuit device (SRAM) for describing the advantages of the one embodiment of the present invention.

As illustrated in FIG. 40, when a single layer of the $O_3$-TEOS film 70a is formed to a film thickness of about 1 μm in order to fill the wide pitch portions of the columnar patterns (P1, 66) to some extent, a film of about 1 μm thick is inevitably deposited over the columnar patterns owing to excessively good coverage, which cause a marked increase in the surface irregularities. As a result, the flatness over the film cannot be maintained by polishing.

When the $O_3$-TEOS film 70 is deposited to a thickness of 1 µm or greater, foreign matter generally tends to appear in a chamber (reaction chamber). The greater the amount of the foreign matter, the higher the frequency of maintenance of the film forming apparatus, leading to a lowering in the productivity. Accordingly, countermeasures against it, for example, formation of an $O_3$-TEOS film of about 500 nm thick twice is necessary, which makes the manufacturing steps cumbersome.

The film formation rate of the $O_3$-TEOS film is slow and about 12 hours is needed for the deposition of a film having a thickness of about 1 µm. Judging from this, filling of the space between the columnar patterns with a single layer of the $O_3$-TEOS film is very difficult.

An ordinarily employed HDP film, on the other hand, tends to cause voids when the spacing is 100 nm or less and the aspect ratio is 3 or greater. It is accordingly difficult to fill the space between columnar patterns with a single layer of an HDP film.

Even if the film forming conditions can be adjusted (for example, by increasing a bias power) to improve the filling properties, it brings about another problem such as a rise in the etching amount of the exposed gate electrode 66 or silicon nitride film 62 owing to an increase in the sputtering component.

In addition, the charge-up damage of the exposed gate electrode is increased, leading to a deterioration in device properties.

In this embodiment, on the other hand, an HDP film is used as the second insulating film 70b. Upon formation of this film, the gate electrode 66 has been covered with the first insulating film 70a so that an etching or charge-up problem of the gate electrode due to a sputtering component can be overcome.

Figure 41:
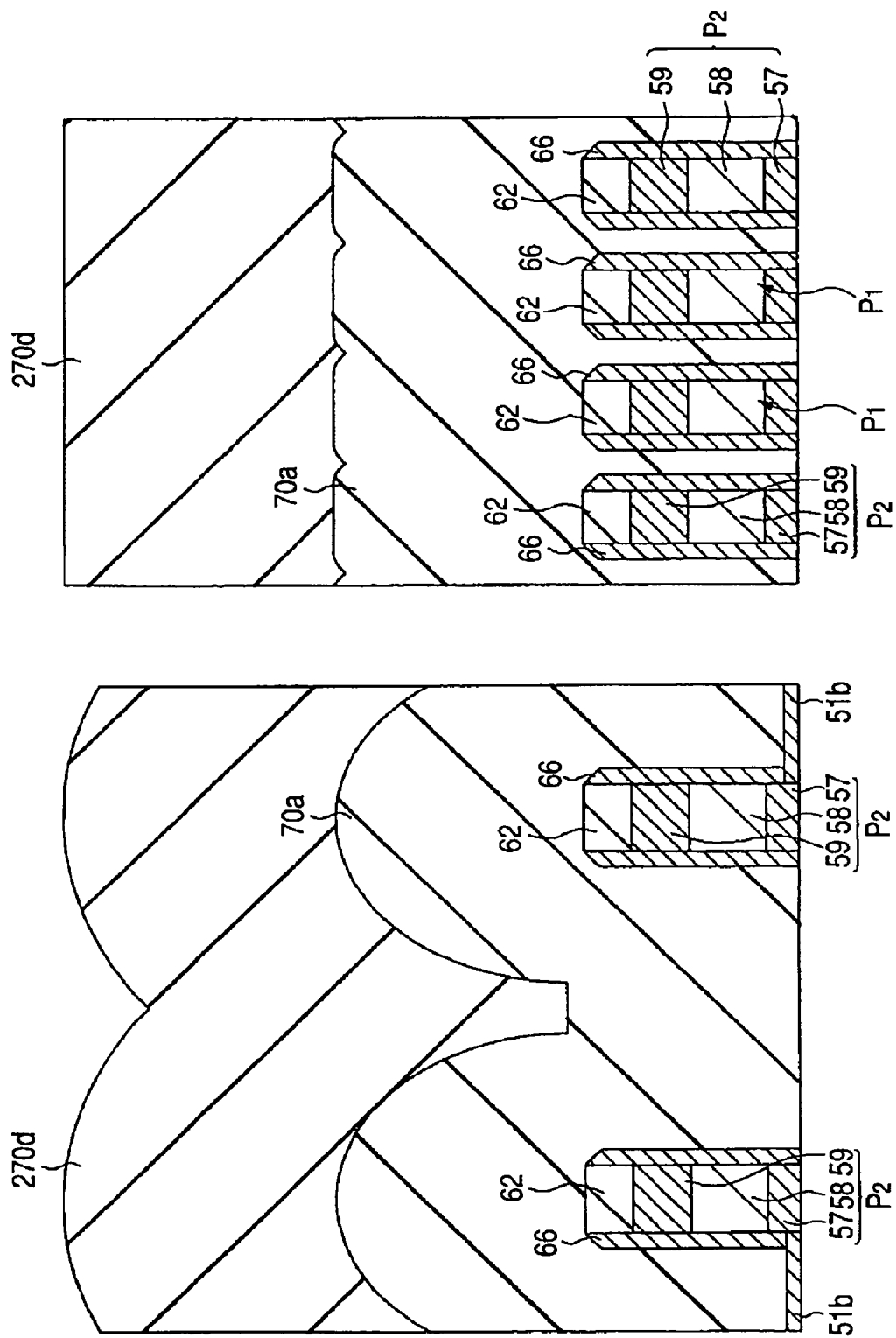
FIG. 41 is fragmentary cross-sectional view of a substrate illustrating the manufacturing method of the semiconductor integrated circuit device (SRAM) for describing the advantages of the one embodiment of the present invention.

Filling, with a P-TEOS film 270d, of the concave portion on the surface of the $O_3$-TEOS film 70a as illustrated in FIG. 40 can also be given as one countermeasure (FIG. 41). Also, in this case, the surface roughness is large, which may presumably cause an increase in the vertical difference between the memory region (memory cell array) MA and peripheral circuit region PA or a vertical difference between the memory region and a space between a plurality of memory mats MM or memory blocks MB formed in the memory cell array. In the peripheral circuit regions, elements are not formed densely, or over the space between memory mats or memory blocks, almost no pattern but only the $O_3$-TEOS film and P-TEOS film are formed. In the memory cell array, on the other hand, these films are deposited over the columnar patterns. This causes a vertical difference of about 1 µm.

Figure 39:
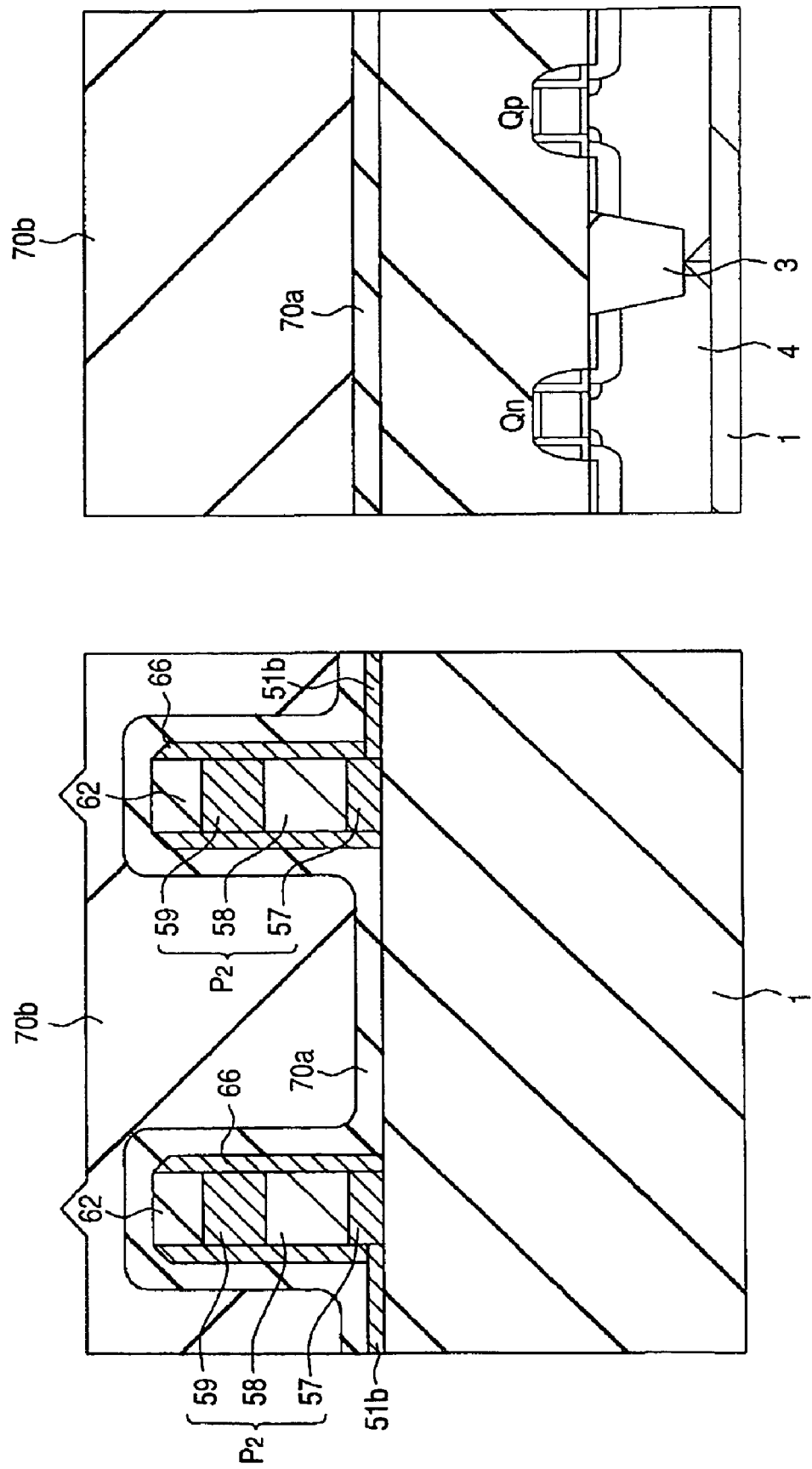
FIG. 39 is fragmentary cross-sectional view of a substrate illustrating the manufacturing method of the semiconductor integrated circuit device (SRAM) according to the one embodiment of the present invention.

On the other hand, the HDP film (70b) is employed in this embodiment. The film component over the columnar pattern is preferentially etched so that only a thin film is formed over the protruded portion. This makes it possible to reduce the vertical difference between the memory cell array and the peripheral circuit region, or a vertical difference between the memory cell array and a space between a plurality of memory mats formed in the memory array. FIG. 39 is a fragmentary cross-sectional view of the memory cell array (left side) and the peripheral circuit region (right side) after the formation of the HDP film (70b). In the left side diagram of FIG. 39, layers below the lower semiconductor layer 57 are omitted. In the right side diagram, interconnects or plugs between Qn and Qp, and the first insulating film 70a are omitted. The devices Qn and Qp are MISFETs constituting various circuits for driving the memory. The relationship among the peripheral circuit region PA, memory region MA, memory mat MM and memory block MB is shown in FIG. 36.

Figure 37:
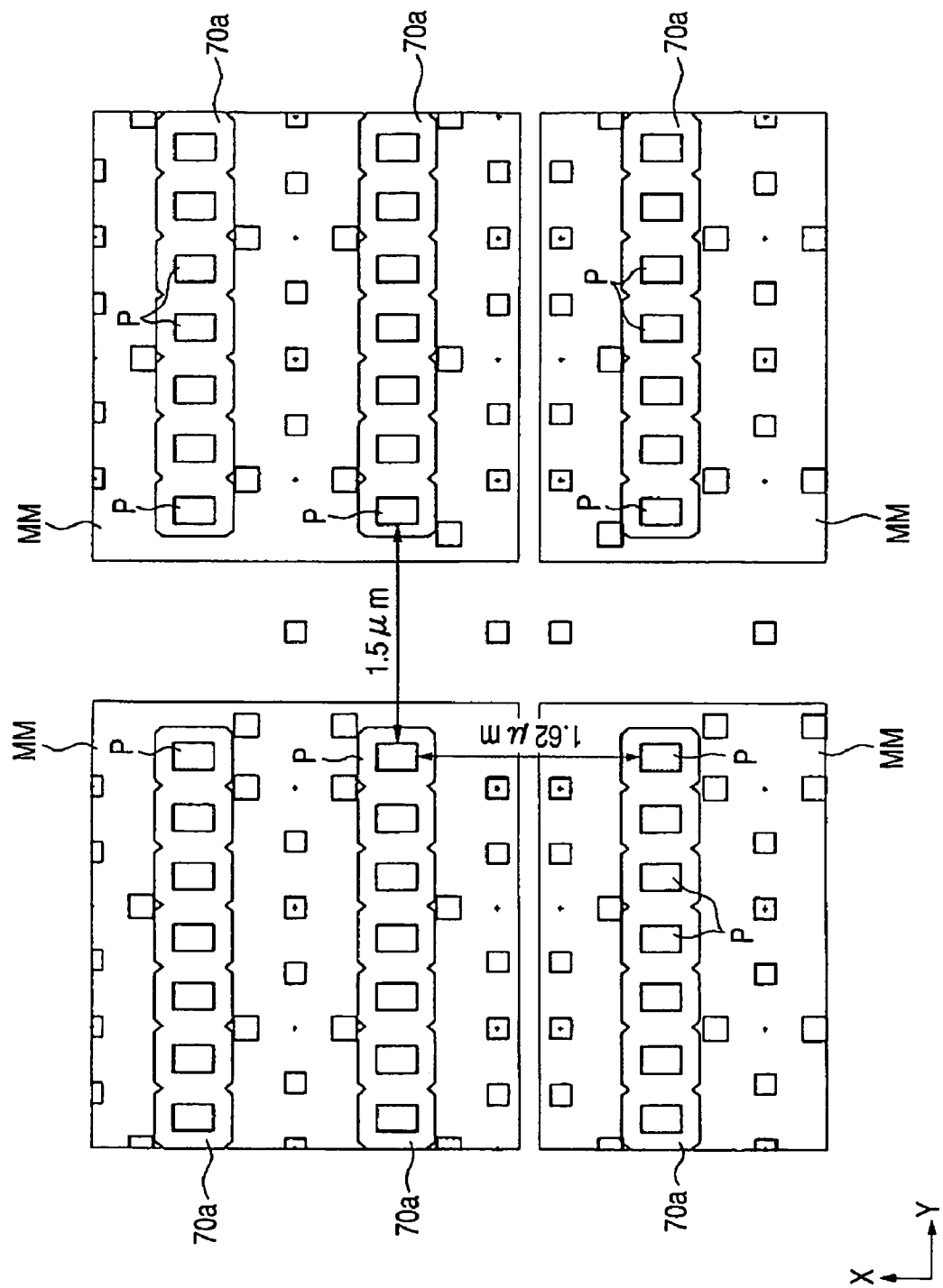
FIG. 37 is a fragmentary plan view of a substrate of the semiconductor integrated circuit device (SRAM) according to the one embodiment of the present invention.
Figure 38:
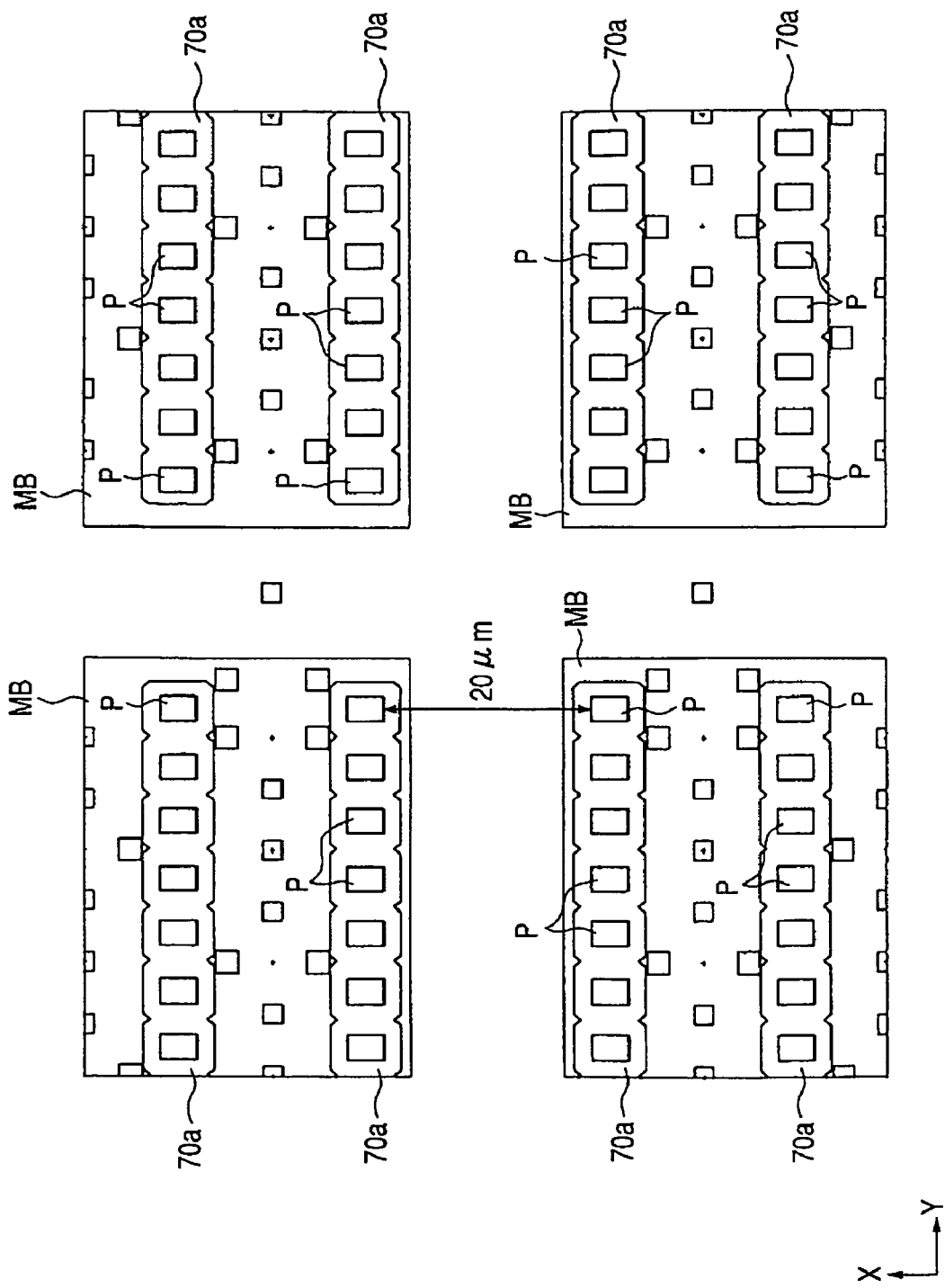
FIG. 38 is fragmentary plan view of a substrate illustrating the manufacturing method of the semiconductor integrated circuit device (SRAM) according to the one embodiment of the present invention.

FIG. 37 is a fragmentary plan view of the substrate illustrating one example of the layout of the columnar laminate (P) at the boundary of the memory mats MM; and FIG. 38 is a fragmentary plan view of the substrate illustrating one example of the layout of the columnar laminate (P) at the boundary of the memory blocks MB. In FIG. 37, the distance between the columnar laminates (P) at the boundary of MM in the X direction is about 1.62 µm, while that in the Y direction is about 1.5 µm. In FIG. 38, the distance between the columnar laminates (P) at the boundary of MB in the X direction is about 20 µm.

The approximately square patterns in these diagrams correspond to a plug 80, which will be described later. Also between MMs or MBs, approximately square patterns (plugs) for, for example, well feed are disposed. The distance between any two adjacent MMs or MBs is not limited to the above-described one, and they may be spaced more narrowly or more widely, depending on the layout.

What is important here is that use of the HDP film (70b) makes it possible to maintain the flatness of a film over the memory cell array and, at the same time, to narrow the above-described vertical difference by depositing a film of a similar thickness over the peripheral circuit region or space between memory mats.

After formation of a thin $O_3$-TEOS film, a P-TEOS film may be formed thereover. When the $O_3$-TEOS film is formed to a thickness as thin as that shown in FIG. 21, however, the concave portion 170 cannot be filled with the P-TEOS film with good accuracy, and slit voids appear in the film. The $O_3$-TEOS film must be as thick as 600 nm or greater in order to avoid generation of such voids and if so, similar problems which occur when a single layer of the $O_3$-TEOS film is used for filling.

According to this Embodiment, on the other hand, the space between columnar patterns can be filled with good accuracy as described above. An insulating film can be filled with good accuracy even if a narrow space portion has an aspect ratio of 3 or greater.

As illustrated in FIG. 24, after deposition of a P-TEOS film, as the third insulating film 70c, over the second insulating film 70b, the surface of the P-TEOS film is polished by CMP to planarize the same.

Figure 25:
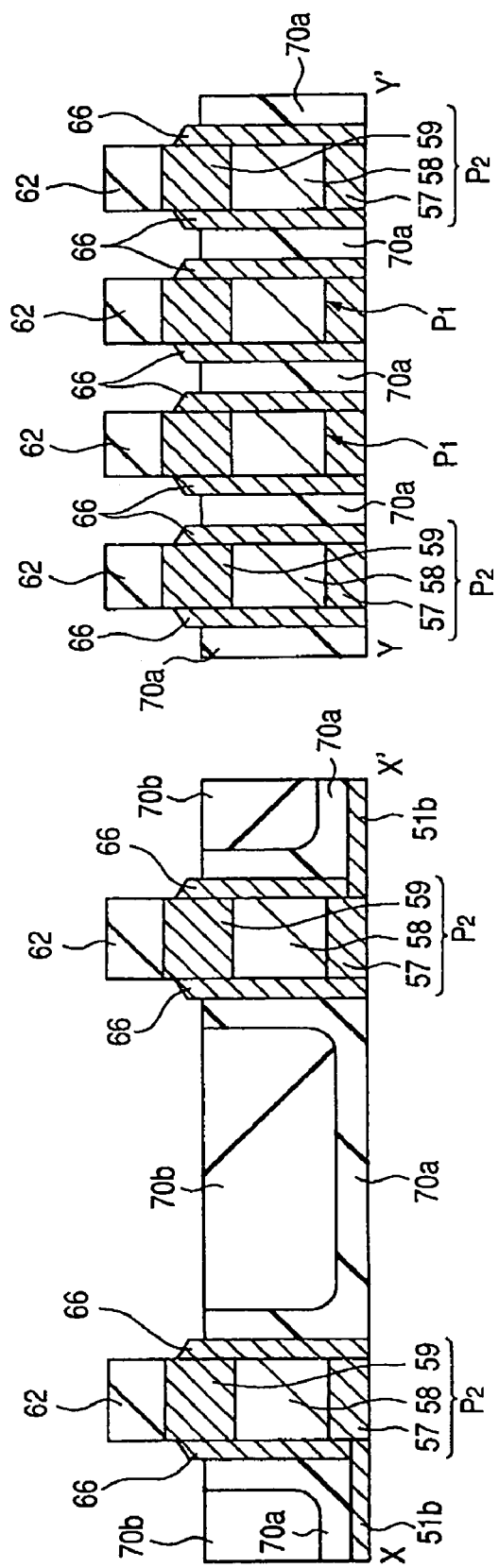
FIG. 25 is fragmentary cross-sectional view of a substrate illustrating the manufacturing method of the semiconductor integrated circuit device (SRAM) according to the one embodiment of the present invention.

As illustrated in FIGS. 25 and 26, the first to third insulating films 70a to 70c are etched to withdraw their surfaces, whereby portions of the columnar laminates (P1, P2) on and above a predetermined height are exposed. The term "predetermined height" means a height at which at least the gate electrode 66 over the side walls of the upper semiconductor layer 59 is exposed. In other words, the "predetermined height" is a position between the bottom and the top of the upper semiconductor layer 59.

Indicated at numeral 172a in FIG. 26 is a projecting portion of the first insulating film 70a after this etching, and from this projecting portion, a portion and upper portion of the columnar laminates (P1, P2), and the gate electrode 66 over the side walls thereof are protruded.

The surfaces of the second insulating film and the first insulating film may be withdrawn by etching while carrying out neither deposition of the third insulating film 70c nor CMP. This step of withdrawing the surface of these insulating films is an important step for controlling the etch back amount of the gate electrode 66, which will be described later. When etching is conducted without reducing the surface irregularities of the insulating film, the surface height tends to vary after etching. Etching after deposition of the third insulating film 70c and planarization of the surface thereof by CMP therefore facilitates control of the etching amount. In short, it can improve the controllability of etch back of the gate electrode. Or, after deposition of the third insulating film 70c and CMP are omitted and the surface of the second insulating film 70b is planarized by CMP, the planarized surface may be etched.

When the third insulating film 70c is deposited, some irregularities may appear after the deposition of the second insulating film 70b, because the third insulating film 70c relieves the irregularities and CMP planarizes the surface. When the third insulating film is employed, it happens to remain even after this etching.

An excessively large vertical difference disturbs CMP so that the second insulating film is desirably deposited to give a film thickness of 70% or greater of the vertical difference (H) of the first insulating film 70a as described above.

When the third insulating film 70c is not formed, the thickness of the second insulating film is adjusted so as to completely fill the concave portion 170 over the wide pitch portion. Adjustment of the thickness of the second insulating film 70b to at least about 1.5 times the vertical difference (H) facilitates flatness control by CMP.

In the next place, the gate electrode 66 that is exposed over the side walls of the columnar laminates (P1, P2) is etched so that the upper end portion of the gate electrode will come at the side wall portions of the upper semiconductor layer 59.

Etching of the gate electrode 66 is conducted in order to expose an upper portion of the upper semiconductor layer 59, which will be a source of the vertical MISFET. The upper end portion of the exposed gate electrode 66 is preferably located over the side wall portions of the upper semiconductor layer 59 in order to prevent a short circuit between the exposed portion (plug 85) and gate electrode 66. The etching amount is controlled so as not to locate the upper end portion of the gate electrode 66 below the upper semiconductor layer 59, in order to prevent offset between the gate electrode 66 and the upper semiconductor layer 59.

By the steps so far described, formed are p-channel type vertical MISFETs (SV1, SV2) having laminates (P1, P2) each made of the lower semiconductor layer (drain) 57, intermediate semiconductor layer (substrate) 58 and the upper semiconductor layer (source), the gate insulating film 63 formed over the side walls of the laminates (P1, P2) and gate electrode 66.

Figure 27:
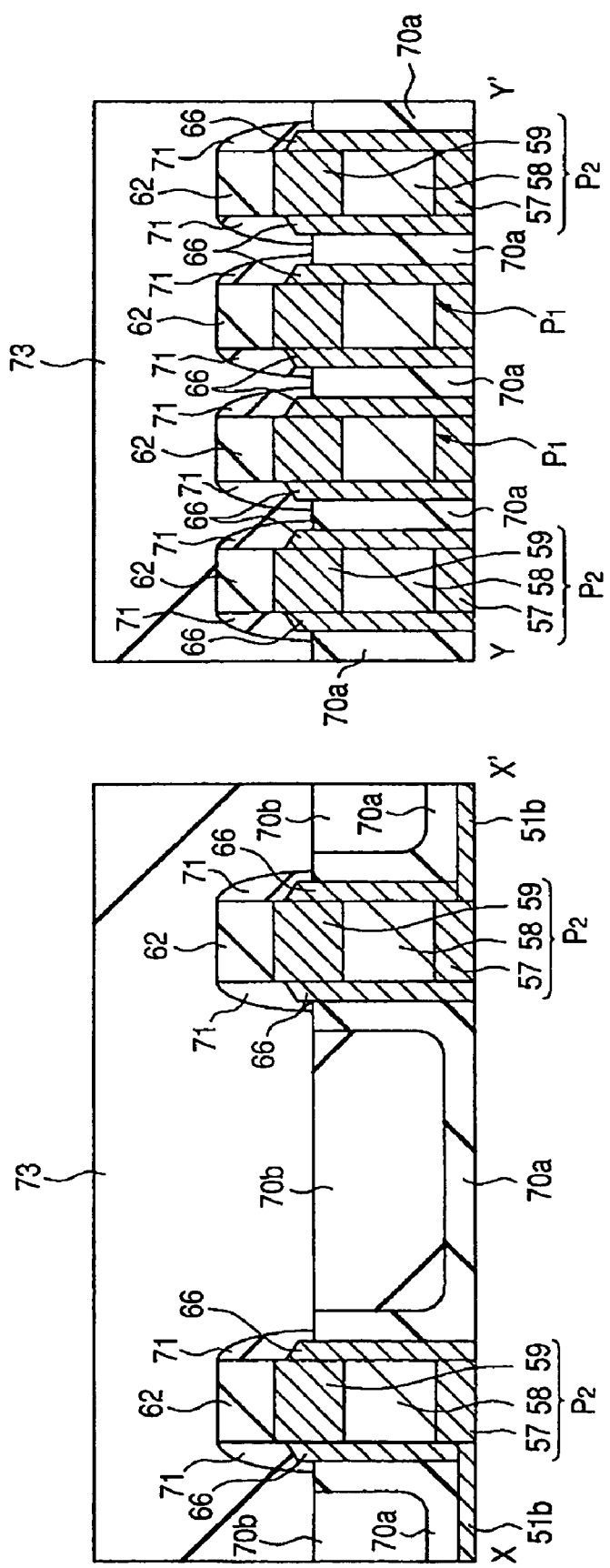
FIG. 27 is fragmentary cross-sectional view of a substrate illustrating the manufacturing method of the semiconductor integrated circuit device (SRAM) according to the one embodiment of the present invention.

As illustrated in FIG. 27, a silicon nitride film is deposited as an insulating film over the second insulating film 70b by, for example, CVD, followed by anisotropic etching, whereby side wall spacers 71 are formed over the exposed portion of the vertical MISFETs (SV1, SV2), that is, the side walls of the gate electrode 66, the upper semiconductor layer 59 and the silicon nitride film 62 thereover.

After deposition of a silicon oxide film 73 to serve as a fourth insulating film over the second insulating film 70b by, for example, CVD, the surface of the silicon oxide film 73 is planarized by CMP. As this fourth insulating film 73, a P-TEOS film, for example, is employed. The fourth insulating film 73 does not necessarily have coverage, because the aspect ratio of the narrowly spaced columnar patterns is reduced by the first and second insulating films. Use of, for example, a P-TEOS film is preferred from the viewpoint of a small thermal stress and a high film forming rate.

Figure 28:
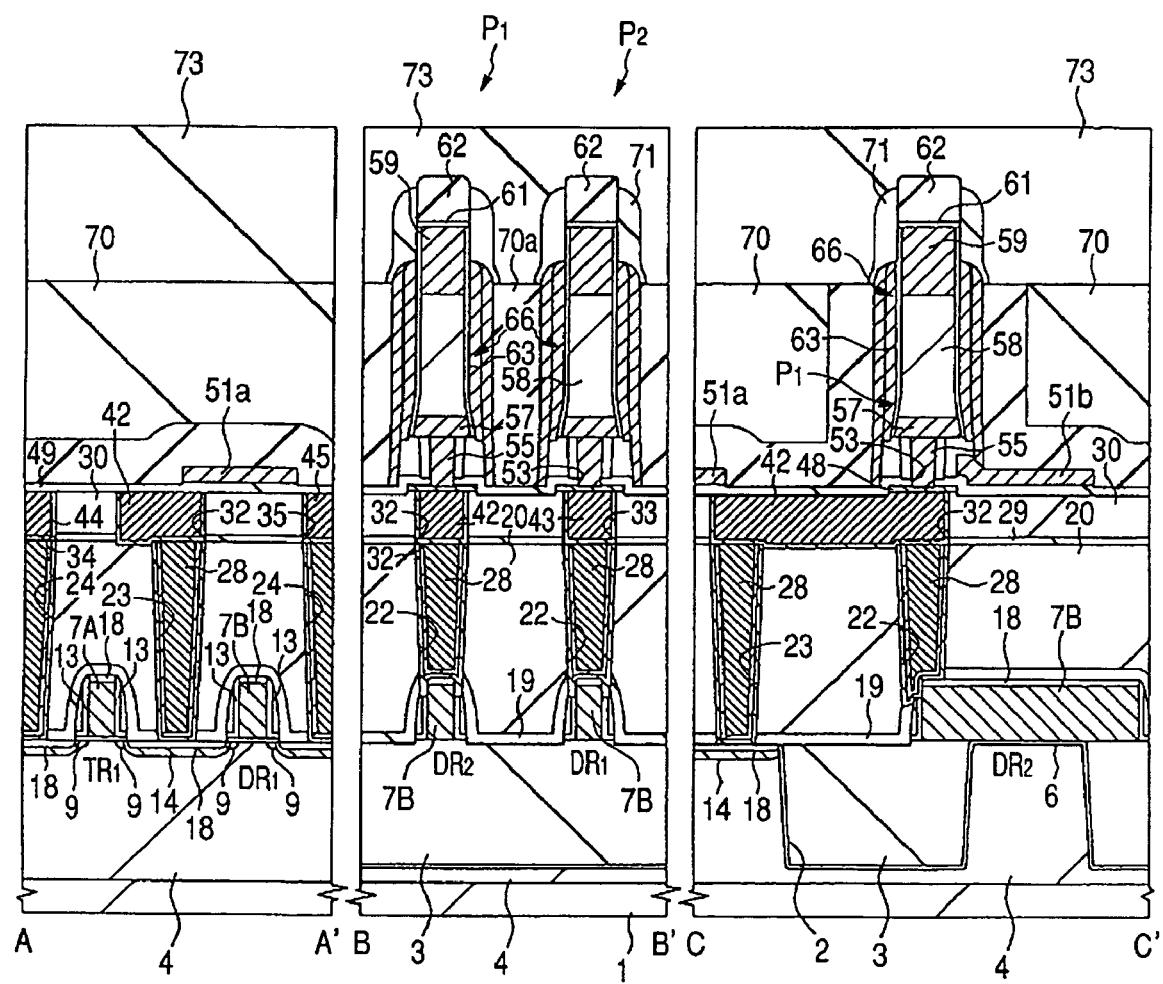
FIG. 28 is fragmentary cross-sectional view of a substrate illustrating the manufacturing method of the semiconductor integrated circuit device (SRAM) according to the one embodiment of the present invention.

FIG. 28 is a fragmentary cross-sectional view of the substrate after the formation thereover of the silicon oxide film 73. This diagram includes underlying MISFETS (DR1, DR2 and TR1). Indicated at numeral 70 is a laminate of the first insulating film 70a and the second insulating film 70b.

Figure 29:
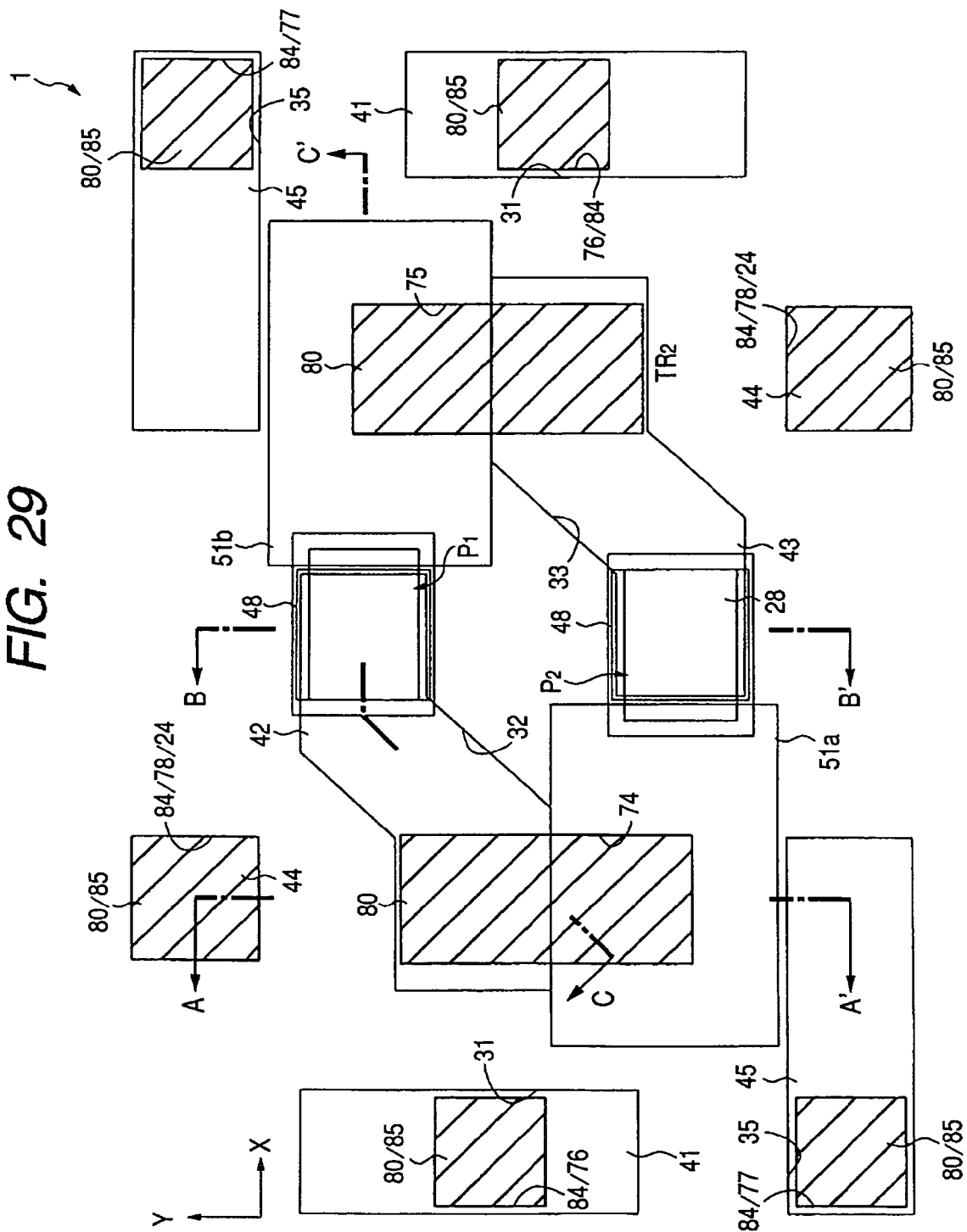
FIG. 29 is fragmentary plan view of a substrate illustrating the manufacturing method of the semiconductor integrated circuit device (SRAM) according to the one embodiment of the present invention.
Figure 30:
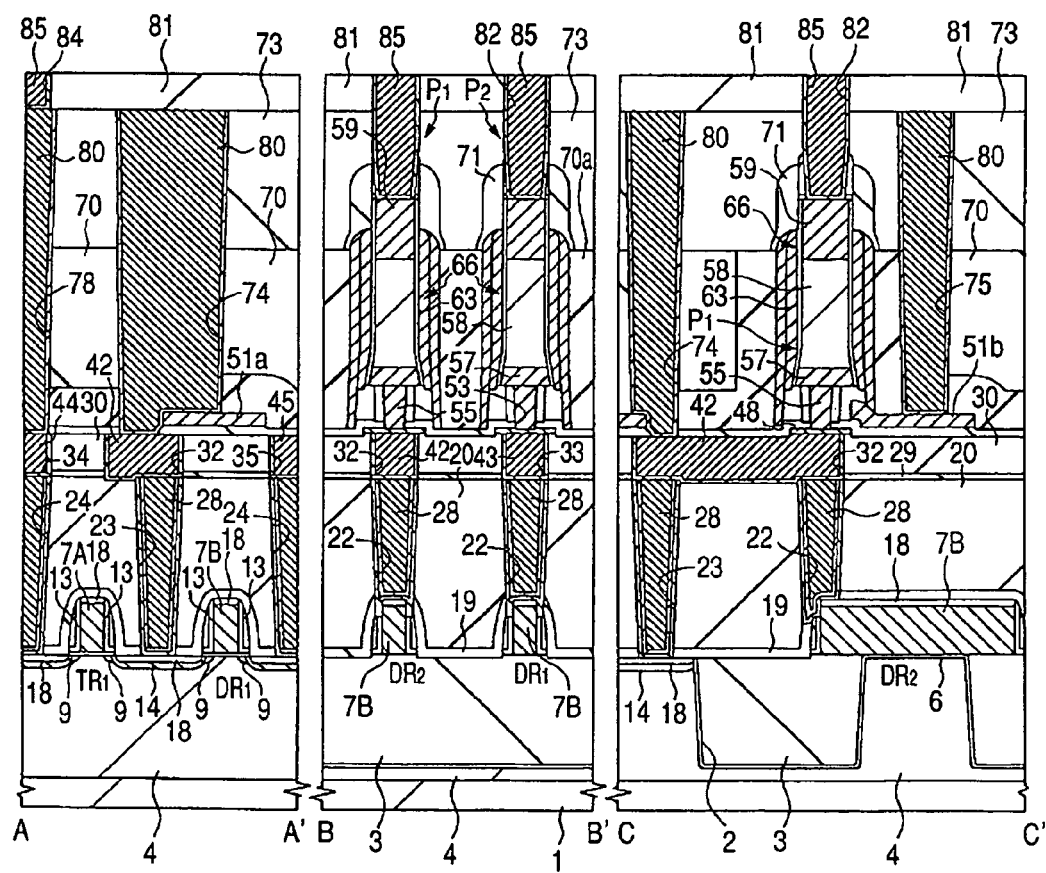
FIG. 30 is fragmentary cross-sectional view of a substrate illustrating the manufacturing method of the semiconductor integrated circuit device (SRAM) according to the one embodiment of the present invention.

As illustrated in FIGS. 29 and 30, using a photoresist film as a mask, the first, second and fourth insulating films (70a, 70b, 73) are dry etched, whereby a through-hole 74 having a bottom extending from the gate extraction electrode 51a to the intermediate conductive layer 42 and a through-hole 75 having a bottom extending from the gate extraction electrode 51b to the intermediate conductive layer 43.

At the same time, through-holes 76, 77 and 78 are formed, from which the surfaces of the intermediate semiconductor layers 41, 44 and 45 are exposed, respectively are formed.

A Ti film and a TiN film are deposited as a barrier film over the silicon oxide film 73 including the insides of the through-holes 74 to 78 by, for example, sputtering, followed by deposition of a W film as a conductive film by for example, CVD. The W film outside the through-hole is removed by CMP to form a plug 80 inside of the through-holes 74 to 78.

Via the plug 80 in each of the through-holes 74 and 75, the gate extraction electrodes 51a and 51b can be connected to the intermediate conductive layers 42 and 43 (storage nodes A, B), respectively. In other words, the gate electrodes of the two vertical MISFETs can be cross-connected to the storage nodes A and B.

By the steps so far described, a memory cell having two transfer MISFETs (TR1, TR2), two drive MISFETs (DR1 and DR2) and two vertical MISFETs (SV1, SV2) is substantially completed.

After deposition of a silicon oxide film 81 to serve as an insulating film over the silicon oxide film 73 by CVD, using a photoresist film as a mask, the silicon oxide films 81, 73 and silicon nitride film 62 over the laminates (P1, P2) are removed by dry etching to expose the upper semiconductor layer (source) 59 of the vertical MISFETs (SV1, SV2), whereby a through-hole 82 is formed.

The above-described dry etching is conducted as follows: First, when the silicon oxide films 81,73 over the laminates (P1, P2) are removed, etching is terminated temporarily. Since the side wall spacers 71 that are made of a silicon nitride film are formed over the side walls of the upper semiconductor layer 59, exposure of the gate electrode 66 can be prevented even if a misalignment of the photomask occurs. Next, the silicon nitride film 62 is etched.

Then, the silicon oxide film 81 that is covering the upper portion of the plug 80 formed in the memory array is etched to form a through-hole 84.

A TiN film, for example, is deposited as a barrier film over the silicon oxide film 81 including the insides of the through-holes 82,84 by, for example, sputtering, followed by deposition of a W film to serve as a conductive film. The W film outside the through-holes 82,84 is removed by CMP, whereby a plug 85 is formed inside of the through-holes 82,84.

Figure 31:
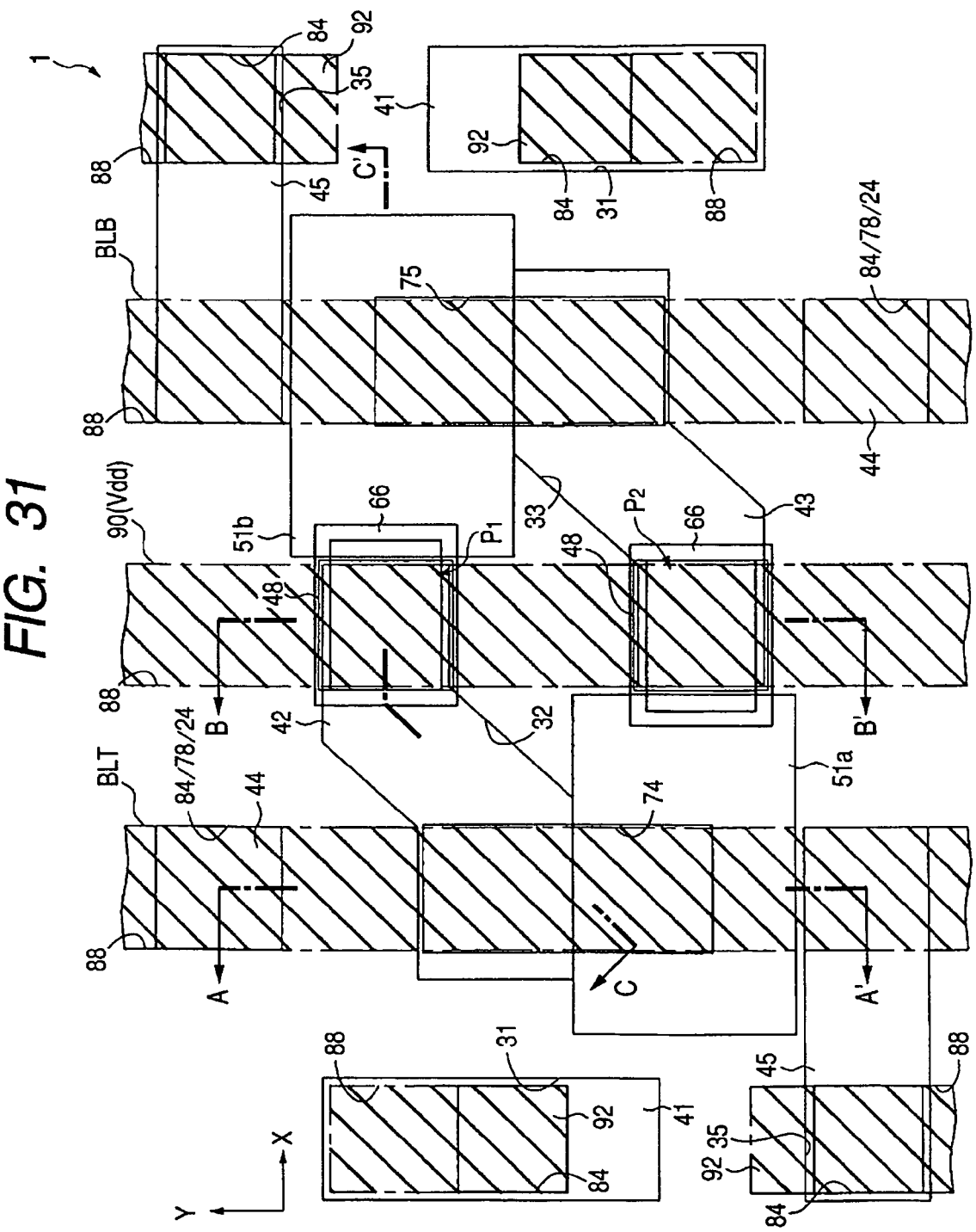
FIG. 31 is fragmentary plan view of a substrate illustrating the manufacturing method of the semiconductor integrated circuit device (SRAM) according to the one embodiment of the present invention.
Figure 32:
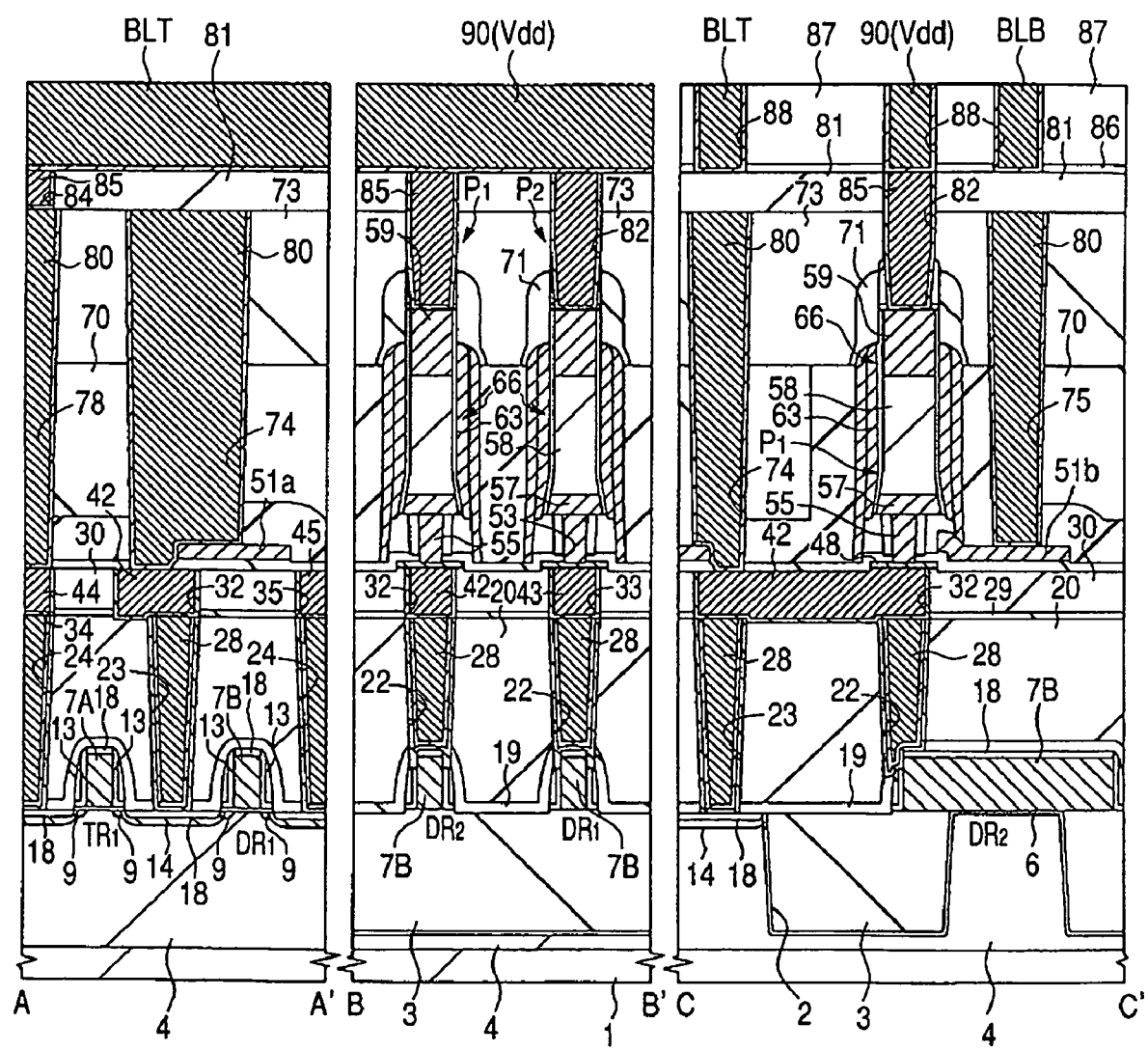
FIG. 32 is fragmentary cross-sectional view of a substrate illustrating the manufacturing method of the semiconductor integrated circuit device (SRAM) according to the one embodiment of the present invention.

As illustrated in FIGS. 31 and 32, a silicon carbide film 86 and a silicon oxide film 87 are deposited successively, to serve as an insulating film, over the silicon oxide film 81. Using a photoresist film as a mask, the silicon oxide film 87 and silicon carbide film 86 over the through-hole 84 are dry etched to form an interconnect groove 88.

Over the silicon oxide film 87, including the inside of the interconnect trench 88, a tantalum nitride (TaN) film or a tantalum (Ta) film is deposited as a barrier film by, for example, sputtering, followed by deposition of a copper (Cu) film to serve as a conductive film by sputtering or plating. Then, an unnecessary portion of the Cu film outside the interconnect groove 88 is removed by CMP. These interconnects will become a supply voltage line 90 (Vdd) and complementary data lines (BLT, BLB), and they will also become an extraction interconnect 92 existing at the end of the memory cell.

As illustrated in FIGS. 33 and 34, after a three-layer insulating film 93 is deposited over the silicon oxide film 87, an interconnect groove 94 is formed in the insulating film 93. Over the insulating film 93, including the inside of this interconnect groove 94, a Cu film and a TaN film are deposited in the above-described manner, followed by removal of an unnecessary Cu film outside the interconnect groove 94 by CMP. The insulating film 93 is made of, for example, a laminate of a silicon oxide film, a silicon carbide film and a silicon oxide film deposited by CVD. Upon formation of the interconnect groove 94 in the insulating film 93, an opening 94a is formed in the interconnect groove 94 over each of the four extraction interconnects 92 formed at the end of the memory cell, and a Cu film is formed inside of this opening. These interconnects are to serve as a reference voltage line 91 (Vss) and a word line (WL).

In the above-described SRAM memory cell, the columnar laminates constituting the vertical MISFET are formed to have an elliptical pattern, but they may be formed to have an approximately rectangular pattern.

The underlying MISFETs (DR1, DR2, TR1, TR2) in the SRAM memory cell are able to have various planar layouts.

As described below, four MISFETs may be used for constituting an SRAM memory cell.

Figure 42:
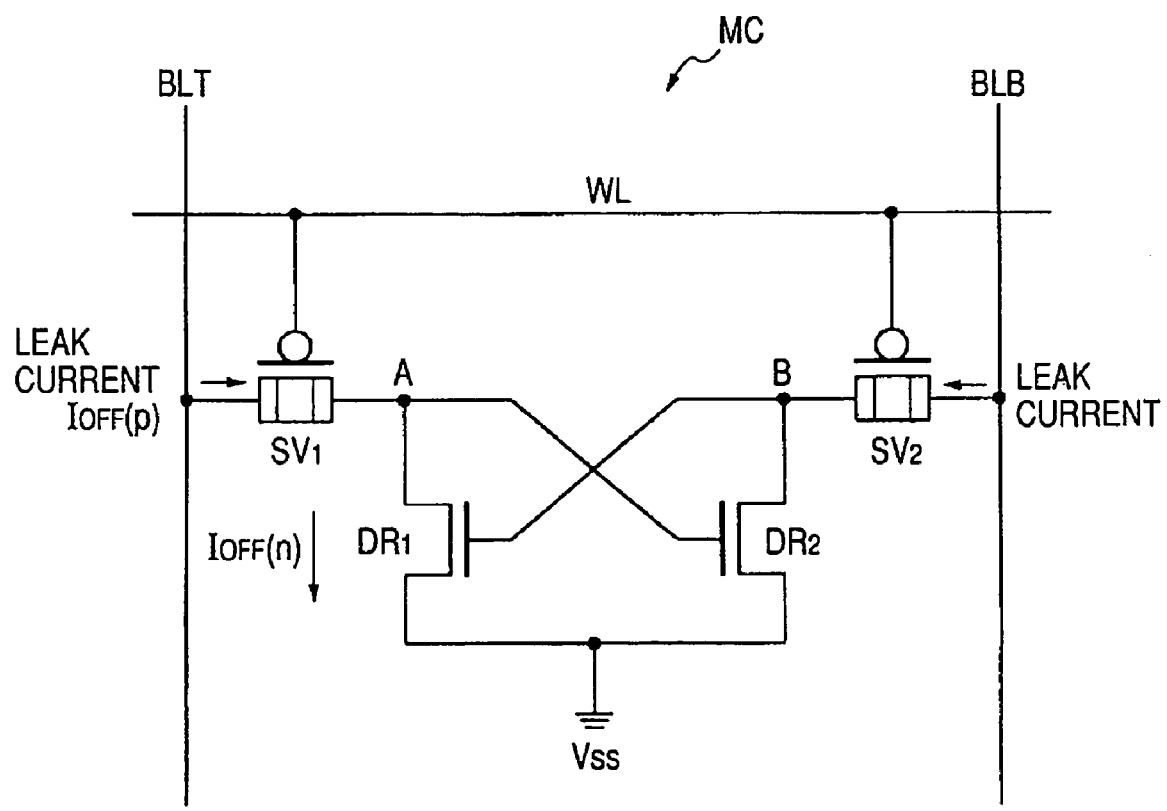
FIG. 42 is an equivalent circuit diagram of another SRAM memory cell according to the one embodiment of the present invention.
Figure 43:
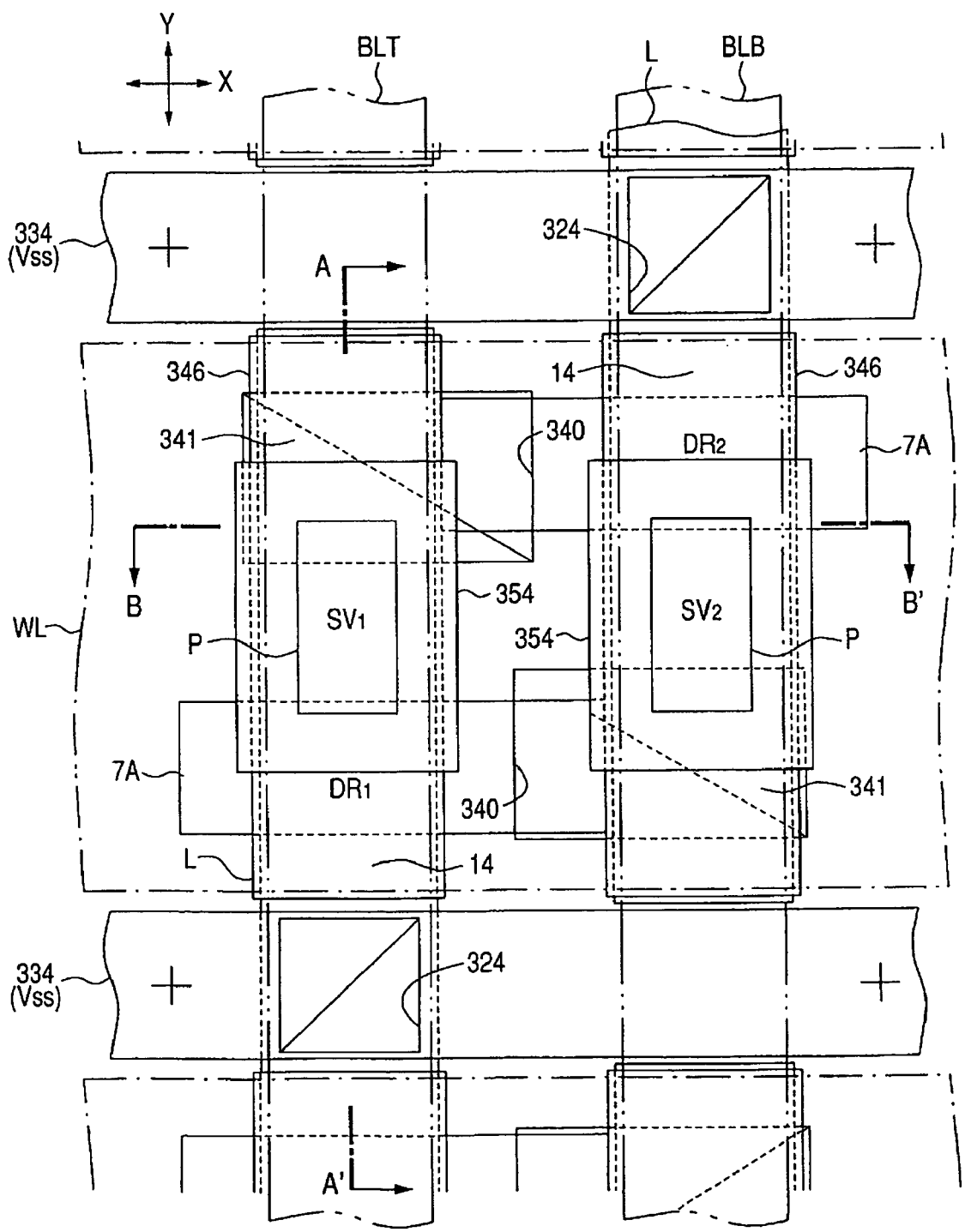
FIG. 43 is a fragmentary plan view of a substrate illustrating the other semiconductor integrated circuit device (SRAM) according to the one embodiment of the present invention.
Figure 44:
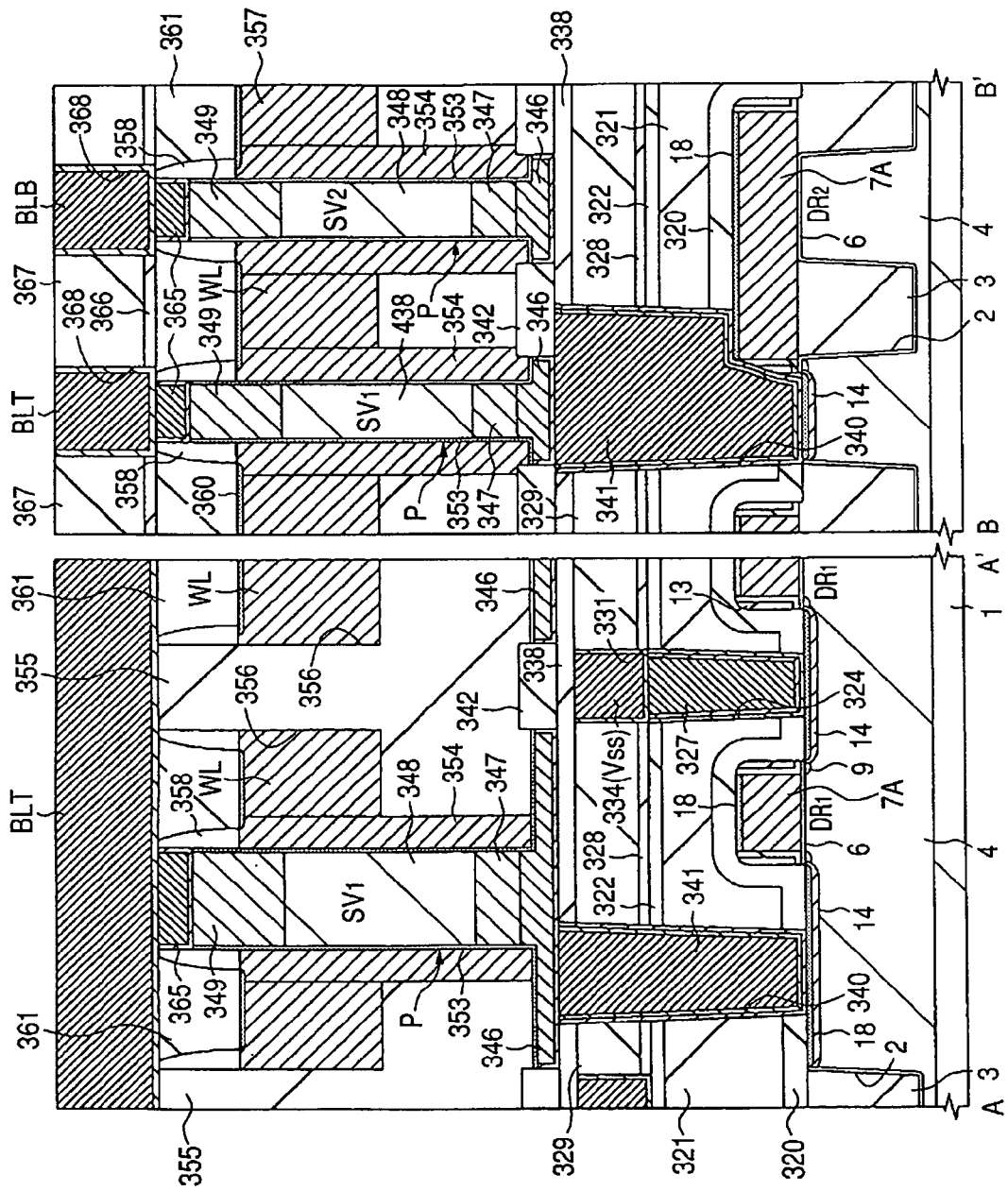
FIG. 44 is a fragmentary cross-sectional view of a substrate illustrating the other semiconductor integrated circuit device (SRAM) according to the one embodiment of the present invention.

In this case, drive MISFETS (DR1, DR2) are formed as a relatively lower layer of the memory cell; and, over the drain region, vertical MISFETs (SV, SV2) are formed. FIG. 42 is an equivalent circuit diagram of a SRAM memory cell in this case. FIG. 43 is a fragmentary plan view of this memory cell, FIG. 44 is a fragmentary cross-sectional view, in which the left diagram is taken along a line A-A' of FIG. 43, while the right diagram is taken along a line B-B' of FIG. 43.

The drive MISFETS (DR1, DR2) in these diagrams can be formed in a similar manner to that employed for the drive MISFETs illustrated in FIGS. 33 and 34.

Over the source and drain regions of these MISFETs, plugs (327, 341) are formed in contact holes (324, 340). A reference voltage line 334 is disposed over this plug 327, while vertical MISFETS (SV1, SV2) are disposed over the plug 341 via a connecting conductive layer 346.

These vertical MISFETS each have a lower semiconductor layer 347, an intermediate semiconductor layer 348, an upper semiconductor layer 349, a gate insulating film 359 formed therearound and a gate electrode 354.

Figure 45:
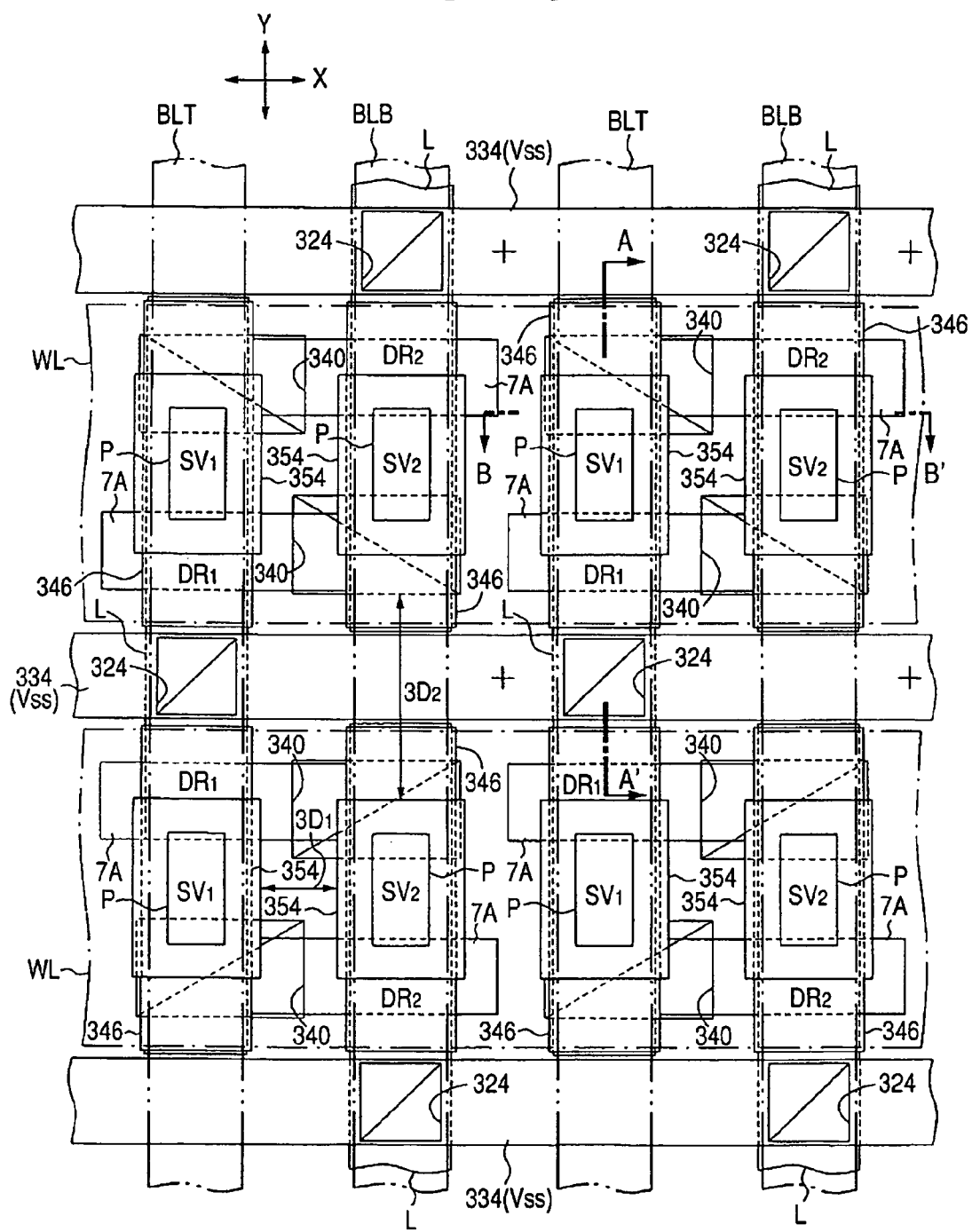
FIG. 45 is a fragmentary plan view of a substrate illustrating the other semiconductor integrated circuit device (SRAM) according to the one embodiment of the present invention.

As illustrated in FIG. 45, there is a difference between a space 3D1, in the X direction, of the vertical MISFETs (SV1, SV2) constituting the memory cell array and a space 3D2 in the Y direction. The latter space is greater. These spaces are filled with an insulating film 355 as illustrated in FIG. 44.

Figure 46:
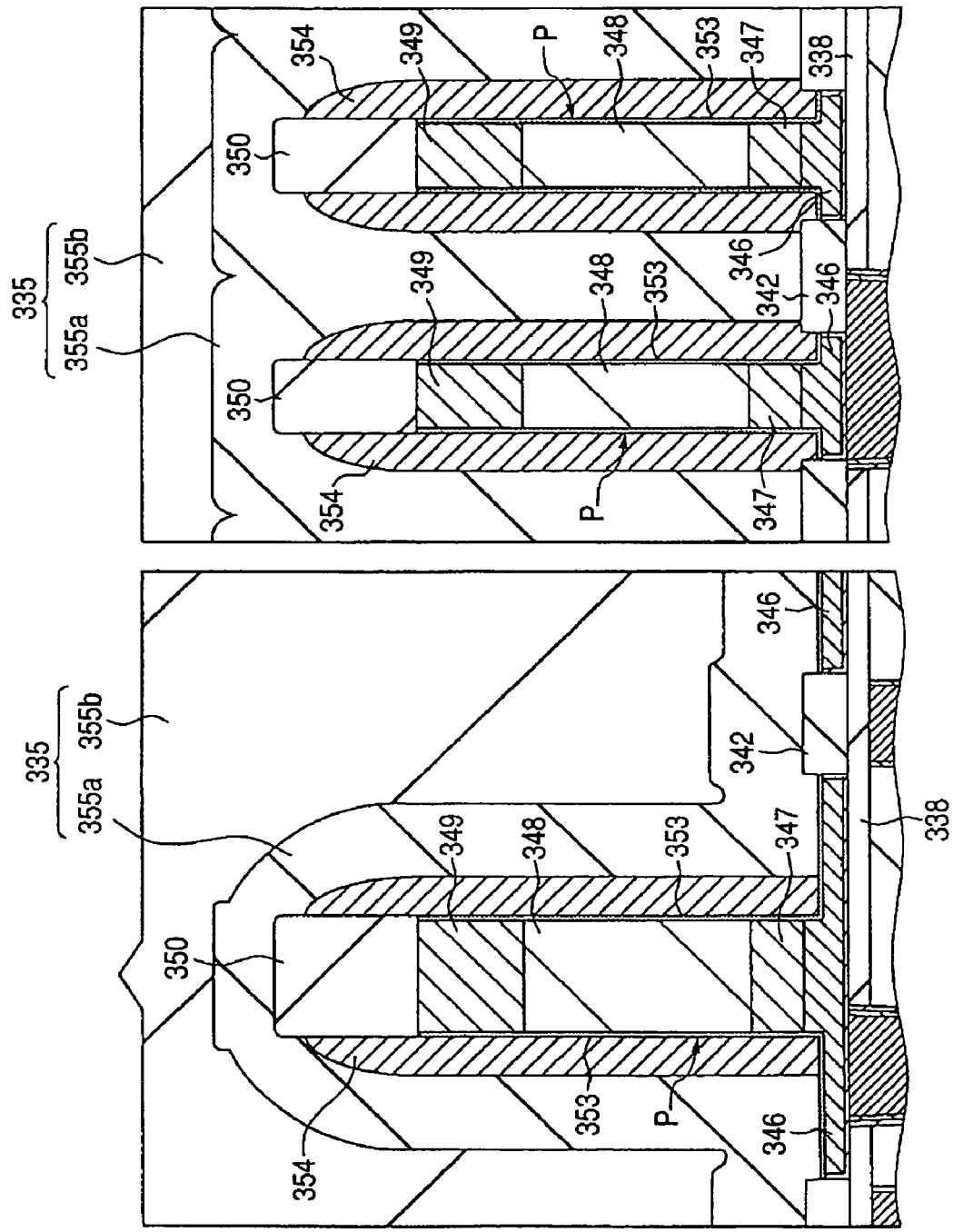
FIG. 46 is a fragmentary cross-sectional view of a substrate illustrating a further semiconductor integrated circuit device (SRAM) according to the one embodiment of the present invention.

The insulating film is made of a two-layer insulating film, and, as illustrated in FIG. 46, the space is filled in two steps by, for example, depositing a first insulating film 355a and, then, a second insulating film 355b in the space, successively. These insulating films can be formed in a similar manner to the first and second insulating films 70a,70b. Of course, a third insulating film may be deposited over the second insulating film 355b.

By filling an insulating film in two steps, it is possible to improve the filling property of the insulating film, improve the withstand pressure, prevent a short circuit and improve the properties and yield of the vertical MISFETs.

In the present memory cell, formation of the first and second insulating films is followed by etching, formation of a word line WL and etch back of the gate electrode 354. Then, a plug (365) and interconnects (BLT, BLB) are formed.

These are a silicon nitride film 320, silicon oxide films 321 and 322, a silicon nitride film 328, a silicon oxide film 329, an interconnect groove 331, a silicon nitride film 338, a silicon oxide film 342, a groove 356, a polycrystalline silicon film 357, side wall spacers 358, a Co silicide layer 360, a silicon oxide film 361, a plug 365, a silicon carbide film 366, a silicon film 367 and an interconnect groove 368. Specific manufacturing steps of the SRAM memory cell illustrated in FIG. 44 are described in Japanese Patent Application 2002-199308.

The memory cell (MC) of FIG. 42 has a structure in which a charge is retained by making use of leakage current ($I_{OFF}$ (p)) at the time of the OFF state of the vertical MISFET (SV1 or SV2) made of a p channel MISFET.

The leakage current ($I_{OFF}$ (p)) is greater than the leakage current ($I_{OFF}$ (n)) of the drive MISFET (DR1 or DR2) which is OFF.

The various aspects and features of the present invention were described specifically based on the above-described embodiments. It should however be borne in mind that the present invention is not limited to or by the above-described embodiments, but can be changed to an extent not departing from the gist of the invention.

Particularly in the above-described embodiments, the description was directed to a SRAM memory cell as an example, but the present invention can be applied widely to semiconductor integrated circuit devices having vertical MISFETs.

The SRAM memory cell is made of a plurality of MISFETs so that the layout of the vertical MISFETs is limited by the layout of the other MISFETS, which tends to cause a difference between vertical and horizontal pitches of the vertical MISFETs.

Use of the filling method of the present invention is effective when such a difference appears between the vertical and horizontal pitches of the vertical MISFETs.

Advantages offered by the typical embodiments disclosed in the present application, will next be described briefly.

In the columnar laminates of plural vertical MISFETs which are spaced by a first distance in a first direction and by a second distance, which is greater than the first distance, in a second direction, the first distance portion is filled with a first insulating film and the second distance portion is filled with the first and second insulating films, which makes it possible to improve the filling properties of the insulating films, to improve the properties of the semiconductor integrated circuit device, and to attain miniaturization of the semiconductor integrated circuit device.

Advantages available by the typical aspects of the inventions disclosed in the present application, will next be described briefly.

Filling properties of a space between the vertical MISFETs constituting the semiconductor integrated circuit device can be improved.

As another advantage, the properties of the semiconductor integrated circuit device can be improved.

As a further advantage, miniaturization of the semiconductor integrated circuit device can be attained.

What we claim is:

1. A manufacturing method of a semiconductor integrated circuit device, comprising the steps of:
   (a) forming a first columnar laminate, a second columnar laminate and a third columnar laminate over a semiconductor substrate;
   (b) forming first insulating films over side walls of the first, the second and the third columnar laminates;
   (c) forming conductive films over the side walls of the first, the second and the third columnar laminates via the first insulating films;
   (d) forming a second insulating film to cover the conductive films, the first columnar laminate, the second columnar laminate and the third columnar laminate; and
   (e) forming a third insulating film over the second insulating film;
   wherein the second columnar laminate is adjusted to the first columnar laminate in a first direction,
   wherein the third columnar laminate is adjusted to the first columnar laminate in a second direction being perpendicular to the first direction,
   wherein a second distance between the first columnar laminate and the third columnar laminate is wider than a first distance between the first columnar laminate and the second columnar laminate,
   wherein the second insulating film has a thickness enough to fill a space of the first distance and but not enough to fill a space of the second distance, and
   wherein the third insulating film has a thickness enough to fill a space of the second distance.

2. A manufacturing method of a semiconductor integrated circuit device according to claim 1, further comprising the steps of:
   (g) before the step (a), forming a MISFET on the semiconductor substrate.

3. A manufacturing method of a semiconductor integrated circuit device according to claim 1,
   wherein the second insulating film is comprised of a silicon oxide film and the step (d) is carried out by chemical vapor deposition using tetraethoxysilane as a raw material.

4. A manufacturing method of a semiconductor integrated circuit device according to claim 1,
   wherein the second insulating film is comprised of a silicon oxide film and the step (d) is carried out by chemical vapor deposition using tetraethoxysilane and ozone ($O_3$) as raw materials.

5. A manufacturing method of a semiconductor integrated circuit device according to claim 1,
   wherein the third insulating film is comprised of a silicon oxide film and the step (f) is carried out in a plasma atmosphere having a plasma density of $101/cm^2$ or greater.

6. A manufacturing method of a semiconductor integrated circuit device according to claim 1,
   wherein the first distance is 150 nm or less and the second distance is 500 nm or greater.

* * * * *